(12) United States Patent
Gupta et al.

(10) Patent No.: US 10,891,414 B2
(45) Date of Patent: Jan. 12, 2021

(54) HARDWARE-SOFTWARE DESIGN FLOW FOR HETEROGENEOUS AND PROGRAMMABLE DEVICES

(71) Applicant: Xilinx, Inc., San Jose, CA (US)

(72) Inventors: Shail Aditya Gupta, San Jose, CA (US); Srinivas Beeravolu, Los Gatos, CA (US); Dinesh K. Monga, Santa Clara, CA (US); Pradip Jha, Cupertino, CA (US); Vishal Suthar, Milpitas, CA (US); Vinod K. Kathail, Palo Alto, CA (US); Vidhumouli Hunsigida, Hyderabad (IN); Siddarth Rele, Navi Mumbai (IN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/421,443

(22) Filed: May 23, 2019

(65) Prior Publication Data
US 2020/0372123 A1 Nov. 26, 2020

(51) Int. Cl.
*G06F 30/34* (2020.01)
(52) U.S. Cl.
CPC .................................. *G06F 30/34* (2020.01)
(58) Field of Classification Search
USPC ......................................................... 716/116
See application file for complete search history.

(56) References Cited

U.S. PATENT DOCUMENTS

| | | |
|---|---|---|
| 3,776,137 A | 12/1973 | Abbott |
| 4,876,641 A | 10/1989 | Cowley |
| 5,752,035 A | 5/1998 | Trimberger |
| 5,848,264 A | 12/1998 | Baird et al. |
| 6,075,935 A | 6/2000 | Ussery |
| 6,080,204 A | 6/2000 | Mendel |
| 6,090,156 A | 7/2000 | MacLeod |
| 6,091,263 A | 7/2000 | New et al. |
| 6,150,839 A | 11/2000 | New et al. |
| 6,195,788 B1 | 2/2001 | Leaver |

(Continued)

FOREIGN PATENT DOCUMENTS

EP 0910027 A2 10/1998

OTHER PUBLICATIONS

Xilinx, "Versal Architecture and Product Data Sheet: Overview," DS950 (v1.0), Oct. 2, 2018, 23 pg., Xilinx, Inc., San Jose, California, USA.

(Continued)

*Primary Examiner* — Eric D Lee
(74) *Attorney, Agent, or Firm* — Kevin T. Cuenot

(57) ABSTRACT

For an application specifying a software portion for implementation within a data processing engine (DPE) array of a device and a hardware portion for implementation within programmable logic (PL) of the device, a logical architecture for the application and a first interface solution specifying a mapping of logical resources to hardware of an interface circuit block between the DPE array and the programmable logic are generated. A block diagram of the hardware portion is built based on the logical architecture and the first interface solution. An implementation flow is performed on the block diagram. The software portion of the application is compiled for implementation in one or more DPEs of the DPE array.

20 Claims, 32 Drawing Sheets

(56) References Cited

U.S. PATENT DOCUMENTS

| | | |
|---|---|---|
| 6,204,687 B1 | 3/2001 | Schultz et al. |
| 6,462,579 B1 | 10/2002 | Camilleri et al. |
| 6,526,557 B1 | 2/2003 | Young et al. |
| 6,759,869 B1 | 7/2004 | Young et al. |
| 6,781,407 B2 | 8/2004 | Schultz |
| 6,810,514 B1 | 10/2004 | Alfke et al. |
| 6,836,842 B1 | 12/2004 | Guccione et al. |
| 6,907,595 B2 | 6/2005 | Curd et al. |
| 7,024,651 B1 | 4/2006 | Camilleri et al. |
| 7,057,413 B1 | 6/2006 | Young et al. |
| 7,080,283 B1 | 7/2006 | Songer et al. |
| 7,124,338 B1 | 10/2006 | Mark et al. |
| 7,185,309 B1 | 2/2007 | Kulkarni et al. |
| 7,199,608 B1 | 4/2007 | Trimberger |
| 7,224,184 B1 | 5/2007 | Levi et al. |
| 7,281,093 B1 | 10/2007 | Kulkarni et al. |
| 7,301,822 B1 | 11/2007 | Walstrum, Jr. et al. |
| 7,302,625 B1 | 11/2007 | Payakapan et al. |
| 7,454,658 B1 | 1/2008 | Baxter |
| 7,328,335 B1 | 2/2008 | Sundararajan et al. |
| 7,380,035 B1 | 5/2008 | Donlin |
| 7,394,288 B1 | 7/2008 | Agarwal |
| 7,420,392 B2 | 9/2008 | Schultz et al. |
| 7,477,072 B1 | 1/2009 | Kao et al. |
| 7,478,357 B1 | 1/2009 | Mason et al. |
| 7,482,836 B2 | 1/2009 | Levi et al. |
| 7,500,060 B1 | 3/2009 | Anderson et al. |
| 7,506,298 B1 | 3/2009 | Ingoldby |
| 7,509,617 B1 | 3/2009 | Young et al. |
| 7,518,396 B1 | 4/2009 | Kondapalli et al. |
| 7,521,961 B1 | 4/2009 | Anderson |
| 7,546,572 B1 * | 6/2009 | Ballagh ............ H03K 19/17732 716/138 |
| 7,574,680 B1 | 8/2009 | Kulkarni et al. |
| 7,576,561 B1 | 8/2009 | Huang |
| 7,619,442 B1 | 11/2009 | Mason et al. |
| 7,640,527 B1 | 12/2009 | Dorairaj et al. |
| 7,650,248 B1 | 1/2010 | Baxter |
| 7,653,820 B1 | 1/2010 | Trimberger |
| 7,689,726 B1 | 3/2010 | Sundararajan et al. |
| 7,724,815 B1 | 5/2010 | Raha et al. |
| 7,746,099 B1 | 6/2010 | Chan et al. |
| 7,788,625 B1 | 8/2010 | Donlin et al. |
| 7,831,801 B1 | 11/2010 | Anderson |
| 8,006,021 B1 | 8/2011 | Li et al. |
| 8,020,163 B2 | 9/2011 | Nollet et al. |
| 8,045,546 B1 | 10/2011 | Bao et al. |
| 8,102,188 B1 | 1/2012 | Chan et al. |
| 8,122,396 B1 | 2/2012 | Antwerpen |
| 8,214,694 B1 | 7/2012 | McKechnie et al. |
| 8,250,342 B1 | 8/2012 | Kostamov et al. |
| 8,359,448 B1 | 1/2013 | Neuendorffer |
| 8,370,776 B1 | 2/2013 | Chan |
| 8,415,974 B1 | 4/2013 | Lysaght |
| 8,719,750 B1 | 5/2014 | Balzli, Jr. |
| 8,719,808 B1 | 5/2014 | Prinzing |
| 8,796,539 B2 | 8/2014 | Asaumi et al. |
| 8,869,121 B2 | 10/2014 | Vorbach |
| 8,928,351 B1 | 1/2015 | Konduru |
| 9,081,634 B1 | 7/2015 | Simkins et al. |
| 9,134,976 B1 | 9/2015 | Ezick |
| 9,147,024 B1 | 9/2015 | Kathail |
| 9,152,794 B1 | 10/2015 | Sanders et al. |
| 9,165,143 B1 | 10/2015 | Sanders et al. |
| 9,218,443 B1 | 12/2015 | Styles et al. |
| 9,223,921 B1 | 12/2015 | Carrillo |
| 9,230,112 B1 | 1/2016 | Peterson et al. |
| 9,286,221 B1 | 3/2016 | Sundararajan |
| 9,304,986 B1 | 4/2016 | Smith |
| 9,323,876 B1 | 4/2016 | Lysaght et al. |
| 9,336,010 B2 | 5/2016 | Kochar et al. |
| 9,411,688 B1 | 8/2016 | Poolla et al. |
| 9,436,785 B1 | 9/2016 | Javre |
| 9,578,099 B2 | 2/2017 | Llorca et al. |
| 9,652,252 B1 | 5/2017 | Kochar et al. |
| 9,652,410 B1 | 5/2017 | Schelle et al. |
| 9,778,942 B2 | 10/2017 | Efremov |
| 9,864,828 B1 | 1/2018 | Puthana |
| 9,977,663 B2 | 5/2018 | Rong |
| 10,089,259 B2 | 10/2018 | Lavasani |
| 10,180,850 B1 | 1/2019 | Kasat |
| 10,243,882 B1 | 3/2019 | Swarbrick |
| 10,402,176 B2 | 9/2019 | Glossop |
| 10,558,437 B1 | 2/2020 | Denisenko |
| 10,635,419 B2 | 4/2020 | Yang |
| 2004/0114609 A1 | 6/2004 | Swarbrick et al. |
| 2004/0210695 A1 | 10/2004 | Weber et al. |
| 2007/0006137 A1 | 1/2007 | Savagaonkar |
| 2007/0245326 A1 | 10/2007 | Tatsuoka |
| 2008/0082759 A1 | 4/2008 | Pong |
| 2008/0320255 A1 | 12/2008 | Wingard et al. |
| 2008/0320268 A1 | 12/2008 | Wingard et al. |
| 2009/0070728 A1* | 3/2009 | Solomon ................. G06F 30/30 716/128 |
| 2010/0322237 A1 | 12/2010 | Raja et al. |
| 2012/0036296 A1 | 2/2012 | Wingard et al. |
| 2012/0284501 A1* | 11/2012 | Zievers ............... H04L 43/0811 713/100 |
| 2012/0310983 A1 | 12/2012 | Mittal |
| 2013/0191817 A1 | 7/2013 | Vorbach |
| 2013/0346953 A1 | 12/2013 | Chen |
| 2015/0109024 A1 | 4/2015 | Abdelfattah et al. |
| 2015/0301983 A1 | 10/2015 | Vorbach |
| 2017/0024338 A1 | 1/2017 | Lavasani |
| 2017/0140800 A1 | 5/2017 | Wingard et al. |
| 2017/0195258 A1 | 7/2017 | Wang et al. |
| 2017/0220499 A1 | 8/2017 | Gray |
| 2017/0315944 A1 | 11/2017 | Mayer et al. |
| 2018/0004496 A1 | 1/2018 | Rong |
| 2019/0042306 A1 | 2/2019 | Pelt |
| 2019/0138680 A1 | 5/2019 | Teh |
| 2019/0140648 A1 | 5/2019 | Clark |
| 2019/0215280 A1 | 7/2019 | Hutton |
| 2019/0220566 A1 | 7/2019 | Tang |
| 2019/0227963 A1 | 7/2019 | Ooi |
| 2019/0235892 A1 | 8/2019 | Schkufza |
| 2019/0238453 A1 | 8/2019 | Swarbrick et al. |
| 2019/0266125 A1 | 8/2019 | Swarbrick et al. |
| 2019/0303033 A1 | 10/2019 | Noguera Serra et al. |
| 2019/0303311 A1 | 10/2019 | Bilski et al. |
| 2019/0303323 A1 | 10/2019 | Swarbrick et al. |
| 2019/0303328 A1 | 10/2019 | Bilski et al. |

OTHER PUBLICATIONS

Xilinx, "Versal: The First Adaptive Compute Acceleration Platform (ACAP)," WP505 (v1.0), Oct. 2, 2018, 21 pg., Xilinx, Inc., San Jose, California, USA.

Xilinx, "SDAccel Development Environment User Guide," UG1023 (v.2015.1), Sep. 15, 2015, 95 pg., Xilinx, Inc., San Jose, California, USA.

Xilinx, "Xilinx AI Engines and Their Applications," WP506 (v1.0. 2), Oct. 3, 2018, 13 pg., Xilinx, Inc., San Jose, California, USA.

Xilinx, "Xilinx Unveils Revolutionary Adaptable Computing Product Category", Mar. 19, 2018, 3 pg., Xilinx, Inc., San Jose, California, USA <https://www.xilinx.com/news/press/2018/xilinx-unveils-revolutionary-adaptable-computing-product-category.html>.

Bokhari, S.H., "On the mapping problem," IEEE Transactions on Computers, Mar. 1981, vol. 1, No. 3, pp. 207-214.

ARM Limited, "AMBA 3 APB Protocol Specification," v1.0, Sep. 25, 2003, pp. 1-34, ARM Limited, Cambridge, UK.

ARM Limited, "AMBA 4 Axis-Stream Protocol SpecificaTIon," V1.0, Mar. 3, 2010, pp. 1-42, ARM Limited, Cambridge UK.

Bilski et al., "Device With Data Processing Engine Array", U.S. Appl. No. 15/944,307, filed Apr. 3, 2018, 123 pages, Xilinx, Inc., San Jose, CA, USA.

Xilinx, Inc., PCT International Application No. PCT/US2019/025414, Invitation to Pay Additional Fees, Communication Relating to the Results of the Partial International Search, and Provisional Opinion Accompanying the Partial Search Result, Jul. 5, 2019, 12 pg.

(56) References Cited

OTHER PUBLICATIONS

Dally, William J. et al., "Deadlock=Free Message Routing in Multiprocessor Interconnection Networks," IEEE Transactions on Computers, May 1987, pp. 547-553, vol. C-36, No. 5, IEEE, Piscataway, New Jersjey, USA.
Doud, B., "Accelerating the Data Plane With the Tile-MX Manycore Processor," Feb. 25, 2015, 19 pp., Linley Data Center Conference, EZChip Semiconductor, Inc., San Jose, California, USA.
Mellanox, Ezchip, "Tile-Gx72 Processor," PB041, Feb. 14, 2015, 2 pp., EZchip Semiconductor, Inc., San Jose, California, USA.
Glass, Christopher et al., "The Turn Model for Adaptive Routing," Journal of the Association for Computing Machinery, Sep. 1994, pp. 874,902, vol. 41, No. 5, ACM, New York, New York, USA.
Kalray, "Deep Learning for High-Performance Embedded Applications," 19 pp., Kalray Inc., Los Altos, California, USA.
Kalray, "Kalray NVMe-oF Target Controller Solutions," Dec. 18, 2017, 14 pp., Kalray Inc., Los Altos, California, USA.
Kalray, "MPPA Processors for Autonomous Driving," May 25, 2017, 18 pp., Kalray Inc., Los Altos, California, USA.
Mellanox, "BlueField Multicore System on Chip," copyright 2017, 4 pp., Mellanox Technologies, Sunnyvale, California, USA.
Mellanox, "NP-5 Network Processor," copyright 2017, 2 pp., Mellanox Technologies, Sunnyvale, California, USA.
ARM Limited, "AMBA AXI and ACE Protocol Specification," Jun 16, 2003, pp. 1-306, ARM Limited, Cambridge, UK.
Noguera, J.J. et al., "Data Processing Engine Arrangement in a Device," U.S. Appl. No. 15/944,160, filed Apr. 3, 2018, 125 pg., Xilinx, Inc., San Jose, California, USA.
Rantala, Ville et al., "Network on Chip R outing Algorithms," TUCS Technical Report No. 779, Aug. 2006, pp. 1-38, Turku Centre for Computer Science, Turku, Finland.
Schooler, Richard, "Tile Processors: Many-Core for Embedded and Cloud Computing," Sep. 15, 2010, 35 pp., 14th Annual Workshop on High Performance Embedded Computing (HPEC '10).
Swarbrick et al., "End-to-End Quality-of-Service in a Network-on-Chip," U.S. Appl. No. 15/886,583, filed Feb. 1, 2018, Xilinx, Inc., San Jose, CA, USA.
Swarbrick et al., "Configurable Network-on-Chip for a Programmable Device", U.S. Appl. No. 16/041,473, filed Jul. 20, 2018, Xilinx, Inc., San Jose, CA, USA.
Swarbrick, et al., "Peripheral Interconnect for Configurable Slave Endpont Circuits," U.S. Appl. No. 15/936,916, filed Jul. 20, 2018, 42 pg., Xilinx, Inc., San Jose, CA, USA.
Swarbrick, et al., "ECC Proxy Extension and Byte Organization for Multi-Master Systems," U.S. Appl. No. 16/106,691, filed Aug. 21, 2018, 31 pg., Xilinx, Inc., San Jose, CA, USA.
Swarbrick, et al., "Flexible Address Mapping for a NOC in an Integrated Circuit," U.S. Appl. No. 15/964,901, filed Apr. 27, 2018, 28 pg., Xilinx, Inc., San Jose, CA, USA.
Swarbrick, et al., "Multi-Chip Structure Having Configurable Network-On-Chip," U.S. Appl. No. 15/990,506, filed May 25, 2018, 33 pg., Xilinx, Inc., San Jose, CA, USA.
Swarbrick, et al., "Programmable NOC Compatible With Multiple Interface Communication Protocol," U.S. Appl. No. 15/904,211, filed Feb. 23, 2018, 27 pg., Xilinx, Inc., San Jose, CA, USA.
TIS Committee, Tool Interface Standard (TIS) Executable and Linking Format (ELF) Specification, Version 1.2, May 1995, 106 pg, Tool Interface Standard Committee.
Wentzlaff, David, et al., "On-Chip Interconnection Architecture of the Tile Processor," IEEE MICRO, Nov. 12, 2007, pp. 15-31, vol. 27, Issue 5, IEEE Computer Society Press, Los Alamitos, California, USA.
Xilinx, Inc., PCT International Application No. PCT/US2019/025115, International Search Report and Written Opinion, dated Jun. 28, 2019, 16 pg.
Xilinx, "UltraScale Architecture DSP Slice," UG579, Oct. 18, 2017, 74 pp., Xilinx, Inc., San Jose, California, USA.
Xilinx, Inc., "AXI4-Stream Interconnect v1.1, LogiCORE IP Product Guide," PG035, Vivado Design Suite,Chap. 2: Product Specification, Chap. 3: Designing With the Core, Oct. 4, 2017, 44 pg., Xilinx, Inc., San Jose, California, USA.
Xilinx, Inc., "Zynq-7000 AP SoC—32 Bit DDR Access with ECC Tech Tip," 15 pg., printed on Aug. 10, 2018, <http://www.wiki.xilinx.com/Zynq-7000+AP+XoC+-+32+Bit+DDR+Access+with+ECC+Tech+Tip>, San Jose, CA, USA.
Ezchip, "Tile-Gx72 Processor," Feb. 14, 2015, 2 pp., EZchip Semiconductor, Inc., San Jose, California, USA.
Mefenza Michael et al: "Framework for rapid prototyping of embedded vision applications", Proceedings of the 2014 Conference on Design and Architectures for Signal and Image Processing, European Electronic Chips & Systems Design Initiat, Oct. 8, 2014 (Oct. 8, 2014), pp. 1-8, XP032781101, DOI: 10.1 109/DASIP . 2014.7115621 [retrieved on May 29, 2015] section III; figures 1, 2.
Xilinx: "Xilinx Zynq-7000 SoC", Jul. 29, 2014 (Jul. 29, 2014), pp. 1-8, XP055718465, Retrieved from the Internet: URL:https://www.xilinx.com/publications/prod_mktg/zynq-7000-generation-ahead-backgrounder.pdf [retrieved on Jul. 28, 2020] the whole document.
Kees Goosens et al: "A Design Flow for Application-Specific Networks on Chip with Guaranteed Performance to Accelerate SOC Design and Verification", Design, Automation, and Test in Europe Conference and Exhibition. Proceedings, IEEE Computer Society, US, Mar. 7, 2005 (Mar. 7, 2005), pp. 1182-1187, XP058405536, ISSN : 1530-1591, DOI: 10.1109/DATE. 2005 .11 ISBN: 978-0-7695-2288-3 sections 2, 3, the whole document.
Kees Vissers: "Versal: New Xilinx Adaptive Compute Acceleration Platforms", Nov. 5, 2018 (Nov. 5, 2018), XP054980700, Retrieved from the Internet: URL:https://www.youtube.com/watch?v=aiPJij3ifvgv [retrieved on Jul. 16, 2020] the whole document.
Kia Bazargan et al: Xilinx Adaptive Compute Acceleration Platform: Versal TM Architecture, Proceedings of the 2019 ACM/SIGDA International Symposium on Field-Programmable Gate Arrays, FPGA 19, Feb. 20, 2019 (Feb. 20, 2019), pp. 84-93, XP055715259, New York, New York, USA DOI: 10.1145/3289602 .3293906 ISBN: 978-1-4503-6137-8 the whole document.
Juanjo Noguera: "HW/SW Programmable Engine: Domain Specific Architecture for Project Everest", HotChips 30 (2018), Aug. 21, 2018 (Aug. 21, 2018), XP055715263, Retrieved from the Internet: URL:https://www.hotchips.org/hc30/2conf/2.03_Xilinx_Juanjo_XilinxSWPEHotChips20180819.pdf [retrieved on Jul. 15, 2020] the whole document.
Chen, Guangyu, Feihui Li, and Mahmut Kandemir. "Compiler-directed application mapping for Noc based chip multiprocessors." ACM SIGPLAN Notices 42.7 (2007): 155-157. (Year: 2007).
Sahu, Pradip Kumar, and Santanu Chattopadhyay. "A survey on application mapping strategies for network-on-chip design." Journal of systems architecture 59.1 (2013): 60-76. (Year: 2013).
Kinsy, Michel A., Michael Pellauer, and Srinivas Devadas. "Heracles: a tool for fast RTL-based design space exploration of multicore processors." Proceedings of the ACM/SIGDA international symposium on Field programmable gate arrays. 2013. (Year: 2013).
Xilinx Inc. SDSoC Programmers Guide V2019.1 Published May 22, 2019. available at <https://www.xilinx.com/support/documentation/sw_manuals/xilinx2019_ 1/ug 1278-sdsoc-programmers-guide.pdf> (Year: 2019).
Xilinx Inc. SDSoC Platform Development Guide V2018.3 Published Jan. 24, 2019 available at <https://www.xilinx.com/support/documentation/sw_manuals/xilinx2018_3/ug 1146-sdsoc-platform-development.pdf. (Year: 2019).

* cited by examiner

2000

Receive application specifying a software portion for implementation in a DPE array of the SoC and a hardware portion for implementation in PL of the SoC
2002

↓

Generate logical architecture and an SoC interface block solution
2004

↓

Build block diagram for hardware portion that incorporates base platform and one or more IP cores
2006

↓

Perform implementation flow on block diagram
2008

Hardware compiler exchanges design data with the DPE compiler and/or the NoC compiler
2010

↓

Export hardware design as a hardware package with configuration bitstream for programming the PL
2012

↓

Configure and generate new platform using the hardware package for use in compiling software portion of the application
2014

↓

Compile software portion of the application using platform of block 2014 for implementation in the DPE array
2016

FIG. 20

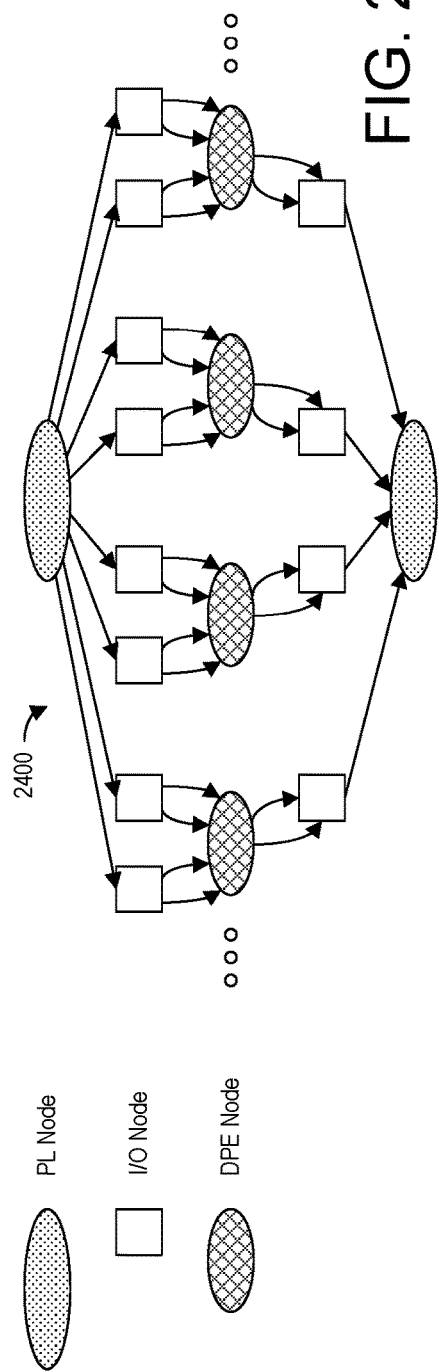
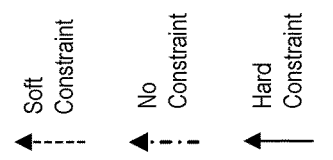
FIG. 24
FIG. 25

3500

For an application specifying a software portion for implementation within a DPE array of a device and a hardware portion having HLS kernels for implementation within PL of the device, generating a first interface solution mapping logical resources used by the software portion to hardware resources of an interface block coupling the DPE array and the programmable logic
3502

Generate a connection graph specifying connectivity among the HLS kernels and nodes of the software portion to be implemented in the DPE array
3504

Generate a block diagram based on the connection graph and the HLS kernels, wherein the block diagram is synthesizable
3506

Perform an implementation flow on the block diagram based on the first interface solution
3508

Compile the software portion of the application for implementation in one or more DPEs of the DPE array.
3510

FIG. 35

HARDWARE-SOFTWARE DESIGN FLOW FOR HETEROGENEOUS AND PROGRAMMABLE DEVICES

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to integrated circuits (ICs) and, more particularly, to implementing applications that include hardware and software portions within heterogeneous and programmable ICs.

BACKGROUND

A programmable integrated circuit (IC) refers to a type of IC that includes programmable logic. An example of a programmable IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs).

Modern programmable ICs have evolved to include programmable logic in combination with one or more other subsystems. For example, some programmable ICs have evolved into System-on-Chips or "SoCs" that include both programmable logic and a hardwired processor system. Other varieties of programmable ICs include additional and/or different subsystems. The growing heterogeneity of subsystems included in programmable ICs presents challenges for implementing applications within these devices. Traditional design flows for ICs having both hardware and software-based subsystems (e.g., programmable logic circuitry and a processor) have relied on hardware designers first creating a monolithic hardware design for the IC. The hardware design is used as the platform upon which the software design is then created, compiled, and executed. This approach is often unduly limiting.

In other cases, the software and hardware design processes may be decoupled. Decoupling hardware and software design processes, however, provides no indication of software requirements or the placement of interfaces between the various subsystems in the IC. As such, the hardware and software design processes may fail to converge on a workable implementation of the application in the IC.

SUMMARY

In one aspect, a method can include, for an application specifying a software portion for implementation within a data processing engine (DPE) array of a device and a hardware portion for implementation within programmable logic (PL) of the device, generating, using a processor, a logical architecture for the application and a first interface solution specifying a mapping of logical resources to hardware of an interface circuit block between the DPE array and the programmable logic. The method can include building a block diagram of the hardware portion based on the logical architecture and the first interface solution and performing, using the processor, an implementation flow on the block diagram. The method can include compiling, using the processor, the software portion of the application for implementation in one or more DPEs of the DPE array.

In another aspect, a system includes a processor configured to initiate operations. The operations can include, for an application specifying a software portion for implementation within a DPE array of a device and a hardware portion for implementation within PL of the device, generating a logical architecture for the application and a first interface solution specifying a mapping of logical resources to hardware of an interface circuit block between the DPE array and the PL. The operations can include building a block diagram of the hardware portion based on the logical architecture and the first interface solution, performing an implementation flow on the block diagram, and compiling the software portion of the application for implementation in one or more DPEs of the DPE array.

In another aspect, a computer program product includes a computer readable storage medium having program code stored thereon. The program code is executable by computer hardware to initiate operations. The operations can include, for an application specifying a software portion for implementation within a DPE array of a device and a hardware portion for implementation within PL of the device, generating a logical architecture for the application and a first interface solution specifying a mapping of logical resources to hardware of an interface circuit block between the DPE array and the PL. The operations can include building a block diagram of the hardware portion based on the logical architecture and the first interface solution, performing an implementation flow on the block diagram, and compiling the software portion of the application for implementation in one or more DPEs of the DPE array.

In another aspect, a method can include, for an application having a software portion for implementation in a DPE array of a device and a hardware portion for implementation in PL of the device, performing, using a processor executing a hardware compiler, an implementation flow on the hardware portion based on an interface block solution that maps logical resources used by the software portion to hardware of an interface block coupling the DPE array to the PL. The method can include, in response to not meeting a design metric during the implementation flow, providing, using the processor executing the hardware compiler, an interface block constraint to a DPE compiler. The method can also include, in response to receiving the interface block constraint, generating, using the processor executing the DPE compiler, an updated interface block solution and providing the updated interface block solution from the DPE compiler to the hardware compiler.

In another aspect, a system includes a processor configured to initiate operations. The operations can include, for an application having a software portion for implementation in a DPE array of a device and a hardware portion for implementation in PL of a device, performing, using a hardware compiler, an implementation flow on the hardware portion based on an interface block solution that maps logical resources used by the software portion to hardware of an interface block coupling the DPE array to the PL. The operations can include, in response to not meeting a design metric during the implementation flow, providing, using the hardware compiler, an interface block constraint to a DPE compiler. The operations further can include, in response to receiving the interface block constraint, generating, using the DPE compiler, an updated interface block solution and providing the updated interface block solution from the DPE compiler to the hardware compiler.

In another aspect, a computer program product includes a computer readable storage medium having program code stored thereon. The program code is executable by computer hardware to initiate operations. The operations can include, for an application having a software portion for implementation in a DPE array of a device and a hardware portion for implementation in PL of a device, performing, using a hardware compiler, an implementation flow on the hardware portion based on an interface block solution that maps logical resources used by the software portion to hardware of an interface block coupling the DPE array to the PL. The operations can include, in response to not meeting a design metric during the implementation flow, providing, using the hardware compiler, an interface block constraint to a DPE compiler. The operations further can include, in response to receiving the interface block constraint, generating, using the DPE compiler, an updated interface block solution and providing the updated interface block solution from the DPE compiler to the hardware compiler.

In another aspect, a method can include, for an application specifying a software portion for implementation within a DPE array of a device and a hardware portion having HLS kernels for implementation within PL of the device, generating, using a processor, a first interface solution mapping logical resources used by the software portion to hardware resources of an interface block coupling the DPE array and the PL. The method can include generating, using the processor, a connection graph specifying connectivity among the HLS kernels and nodes of the software portion to be implemented in the DPE array and generating, using the processor, a block diagram based on the connection graph and the HLS kernels, wherein the block diagram is synthesizable. The method further can include performing, using the processor, an implementation flow on the block diagram based on the first interface solution and compiling, using the processor, the software portion of the application for implementation in one or more DPEs of the DPE array.

In another aspect, a system includes a processor configured to initiate operations. The operations can include, for an application specifying a software portion for implementation within a DPE array of a device and a hardware portion having HLS kernels for implementation within PL of the device, generating a first interface solution mapping logical resources used by the software portion to hardware resources of an interface block coupling the DPE array and the PL. The operations can include generating a connection graph specifying connectivity among the HLS kernels and nodes of the software portion to be implemented in the DPE array and generating a block diagram based on the connection graph and the HLS kernels, wherein the block diagram is synthesizable. The operations further can include performing an implementation flow on the block diagram based on the first interface solution and compiling the software portion of the application for implementation in one or more DPEs of the DPE array.

In another aspect, a computer program product includes a computer readable storage medium having program code stored thereon. The program code is executable by computer hardware to initiate operations. The operations can include, for an application specifying a software portion for implementation within a DPE array of a device and a hardware portion having HLS kernels for implementation within PL of the device, generating a first interface solution mapping logical resources used by the software portion to hardware resources of an interface block coupling the DPE array and the PL. The operations can include generating a connection graph specifying connectivity among the HLS kernels and nodes of the software portion to be implemented in the DPE array and generating a block diagram based on the connection graph and the HLS kernels, wherein the block diagram is synthesizable. The operations further can include performing an implementation flow on the block diagram based on the first interface solution and compiling the software portion of the application for implementation in one or more DPEs of the DPE array.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 20 illustrates an example method of performing a design flow to implement an application in an SoC.

FIG. 24 illustrates another example of an application for implementation in an SoC.

FIG. 25 illustrates an example of an SoC interface block solution generated by the DPE compiler.

FIG. 35 illustrates another example method of performing a design flow to implement an application in an SoC.

DETAILED DESCRIPTION

Figure 1:
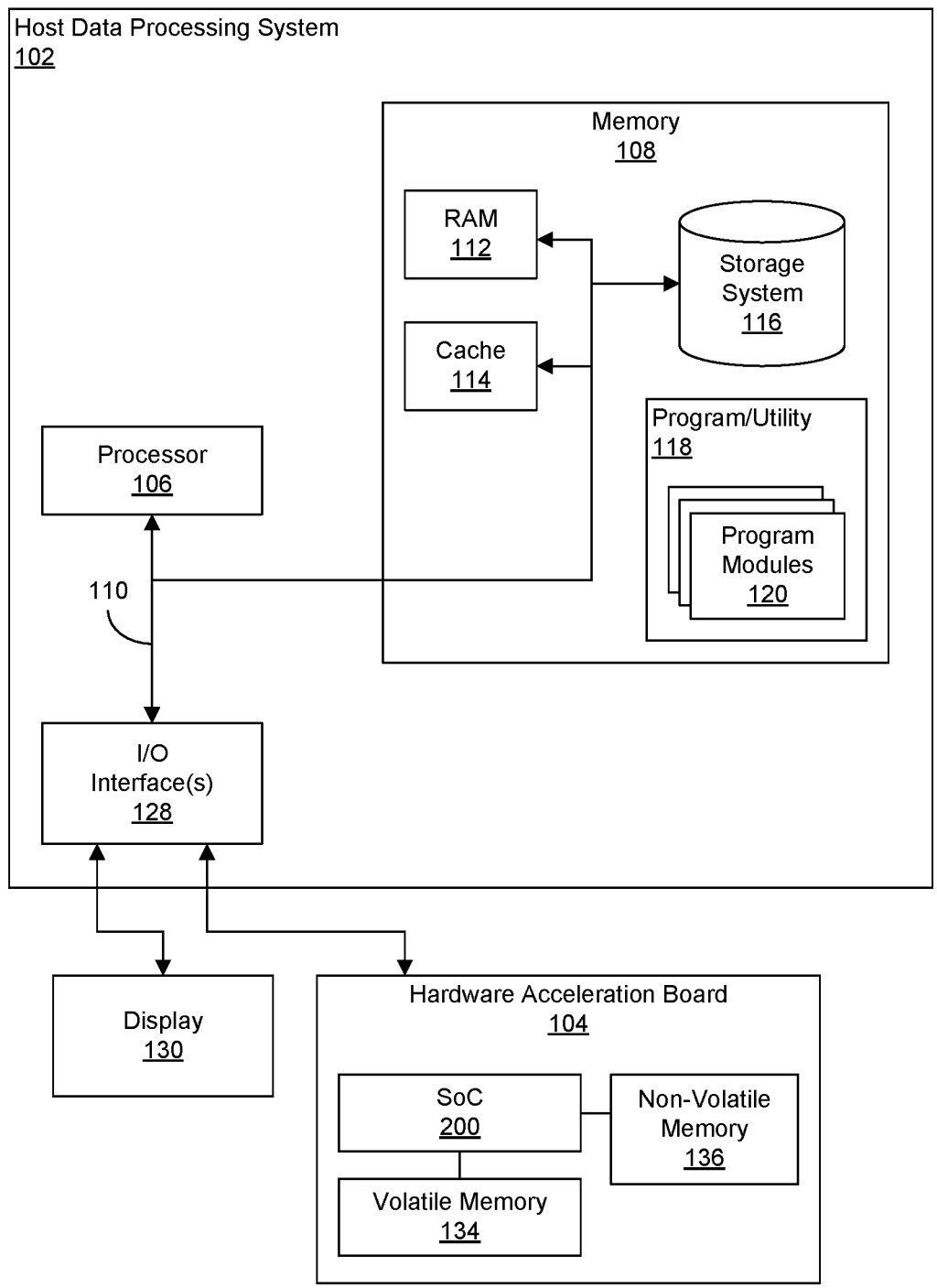
FIG. 1 illustrates an example of a computing node for use with one or more embodiments described herein.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to implementing applications that include hardware and software portions within heterogeneous and programmable ICs. An example of a heterogeneous and programmable IC is a device, e.g., an integrated circuit, that includes programmable circuitry referred to herein as "programmable logic" or "PL" and a plurality of hardwired and programmable data processing engines (DPEs). The plurality of DPEs may be arranged in an array that is communicatively linked to the PL of the IC through a System-on-Chip (SoC) interface block. As defined within this disclosure, a DPE is a hardwired and programmable circuit block that includes a core capable of executing program code and a memory module coupled to the core. The DPEs are capable of communicating with one another as described in greater detail within this disclosure.

An application that is intended for implementation in a device as described includes a hardware portion that is implemented using the PL of the device and a software portion that is implemented in, and executed by, the DPE array of the device. The device may also include a hardwired processor system or "PS" capable of executing further program code, e.g., another software portion of the application. As an example, the PS includes a central processing unit or "CPU" or other hardwired processor capable of executing program code. As such, the application may also include a further software portion that is intended for execution by the CPU of the PS.

In accordance with the inventive arrangements described within this disclosure, design flows are provided that may be performed by a data processing system. The design flows are capable of implementing both the hardware and the software portions of an application within a heterogeneous and programmable IC that includes a PL, a DPE array, and/or a PS. The IC may also include a Network-on-Chip (NoC) that is programmable.

In some implementations, the application is specified as a data flow graph that includes a plurality of interconnected nodes. Nodes of the data flow graph are designated for implementation within the DPE array or within the PL. A node implemented in a DPE, for example, is ultimately mapped to a particular DPE in the DPE array. Object code that is executed by each DPE of the array that is used for the application is generated to implement the node(s). A node implemented in the PL, for example, may be synthesized and implemented in the PL or implemented using a pre-built core (e.g., a Register Transfer Level or "RTL" core).

The inventive arrangements provide example design flows capable of coordinating the building and integration of the different portions of the application for implementation in the different heterogeneous subsystems of the IC. Different stages within the example design flows are targeted to particular subsystems. For example, one or more stages of the design flows are targeted to implementing the hardware portion of the application in the PL, while one or more other stages of the design flows are targeted to implementing the software portion of the application in the DPE array. Still, one or more other stages of the design flows are targeted to implementing another software portion of the application in the PS. Still other stages of the design flows are targeted to implementing routes or data transfers among different subsystems and/or circuit blocks through the NoC.

The different stages of the example design flows corresponding to the different subsystems can be performed by different compilers that are subsystem specific. For example, the software portions may be implemented using a DPE compiler and/or a PS compiler. The hardware portion to be implemented in the PL may be implemented by a hardware compiler. Routes for the NoC may be implemented by a NoC compiler. The various compilers are capable of communicating and interacting with one another while implementing the respective subsystems specified by the application in order to converge to a solution where the application is viably implemented in the IC. For example, the compilers are capable of exchanging design data during operation to converge to a solution where the design metrics specified for the application are met. Further, the solution (e.g., implementation of the application in the device) that is achieved is one where the various portions of the application are mapped to respective subsystems in the device and the interfaces between the different subsystems are consistent and mutually agreed upon.

Using the example design flows described within this disclosure, a system is able to implement an application within a heterogeneous and programmable IC in less time (e.g., less runtime) than would otherwise be the case, e.g., where all portions of the application are implemented on the device jointly. Further, the example design flows described within this disclosure achieve feasibility and quality for the resulting implementation of the application in the heterogeneous and programmable IC (e.g., closure of design metrics such as timing, area, power, etc.) that is often superior to results obtained using other conventional techniques where each portion of the application is mapped completely independently and then stitched or combined together. The example design flows achieve these results, at least in part, through the loosely-coupled joint convergence techniques described herein that rely on shared interface constraints among the different subsystems.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example of a computing node 100. Computing node 100 may include a host data processing system (host system) 102 and a hardware acceleration board 104. Computing node 100 is only one example implementation of a computing environment that may be used with a hardware acceleration board. In this regard, computing node 100 may be used in a standalone capacity, as a bare metal server, as part of a computing cluster, or as a cloud computing node within a cloud computing environment. FIG. 1 is not intended to suggest any limitation as to the scope of use or functionality of the examples described herein. Computing node 100 is an example of a system and/or computer hardware that is capable of performing the various operations described within this disclosure relating to implementing an application within an SoC 200. For example, computing node 100 may be used to implement an Electronic Design Automation (EDA) system.

Host system 102 is operational with numerous other general-purpose or special-purpose computing system environments or configurations. Examples of computing systems, environments, and/or configurations that may be suitable for use with host system 102 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

As illustrated, host system 102 is shown in the form of a computing device, e.g., a computer or server. Host system 102 can be practiced as a standalone device, in a cluster, or in a distributed cloud computing environment where tasks are performed by remote processing devices that are linked through a communications network. In a distributed cloud computing environment, program modules may be located in both local and remote computer system storage media including memory storage devices. The components of host system 102 may include, but are not limited to, one or more processors 106 (e.g., central processing units), a memory 108, and a bus 110 that couples various system components including memory 108 to processor 106. Processor(s) 106 may include any of a variety of processors that are capable of executing program code. Example processor types include, but are not limited to, processors having an x86 type of architecture (IA-32, IA-64, etc.), Power Architecture, ARM processors, and the like.

Bus 110 represents one or more of any of several types of communication bus structures, including a memory bus or memory controller, a peripheral bus, an accelerated graphics port, and a processor or local bus using any of a variety of available bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe) bus.

Host system 102 typically includes a variety of computer readable media. Such media may be any available media that is accessible by host system 102 and may include any combination of volatile media, non-volatile media, removable media, and/or non-removable media.

Memory 108 may include computer readable media in the form of volatile memory, such as random-access memory (RAM) 112 and/or cache memory 114. Host system 102 may also include other removable/non-removable, volatile/non-volatile computer system storage media. By way of example, storage system 116 may be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each may be connected to bus 110 by one or more data media interfaces. As will be further depicted and described below, memory 108 may include at least one computer program product having a set (e.g., at least one) of program modules (e.g., program code) that are configured to carry out the functions and/or operations described within this disclosure.

Program/utility 118, having a set (at least one) of program modules 120, may be stored in memory 108 by way of example, and not limitation, as well as an operating system, one or more application programs, other program modules, and program data. Program modules 120 generally carry out the functions and/or methodologies of embodiments of the invention as described herein. For example, program modules 120 may include one or more applications and a driver or daemon for communicating with hardware acceleration board 104 and/or SoC 200.

Program/utility 118 is executable by processor 106. Program/utility 118 and any data items used, generated, and/or operated upon by processor 106 are functional data structures that impart functionality when employed by processor 106. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Host system 102 may include one or more Input/Output (I/O) interfaces 128 communicatively linked to bus 110. I/O interface(s) 128 allow host system 102 to communicate with external devices, couple to external devices that allow user(s) to interact with host system 102, couple to external devices that allow host system 102 to communicate with other computing devices, and the like. For example, host system 102 may be communicatively linked to a display 130 and to hardware acceleration board 104 through I/O interface(s) 128. Host system 102 may be coupled to other external devices such as a keyboard (not shown) via I/O interface(s) 128. Examples of I/O interfaces 128 may include, but are not limited to, network cards, modems, network adapters, hardware controllers, etc.

In an example implementation, the I/O interface 128 through which host system 102 communicates with hardware acceleration board 104 is a PCIe adapter. Hardware acceleration board 104 may be implemented as a circuit board, e.g., a card, that couples to host system 102. Hardware acceleration board 104 may, for example, be inserted into a card slot, e.g., an available bus and/or PCIe slot of host system 102.

Hardware acceleration board 104 includes an SoC 200. The SoC 200 is a heterogeneous and programmable IC and, as such, has a plurality of heterogeneous subsystems. An example architecture for the SoC 200 is described in greater detail in connection with FIG. 2. Hardware acceleration board 104 also includes volatile memory 134 coupled to SoC 200 and a non-volatile memory 136 also coupled to the SoC 200. Volatile memory 134 may be implemented as a RAM and is considered a "local memory" of SoC 200, whereas memory 108, being within host system 102, is not considered local to SoC 200, but rather local to host system 102. In some implementations, volatile memory 134 may include multiple gigabytes of RAM, e.g., 64 GB of RAM. An example of non-volatile memory 136 includes flash memory.

In the example of FIG. 1, computing node 100 is capable of operating on an application for SoC 200 and implementing the application within SoC 200. The application may include hardware and software portions corresponding to the different heterogeneous subsystems available in SoC 200. In general, computing node 100 is capable of mapping the application onto the SoC 200 for execution by the SoC 200.

Figure 2:
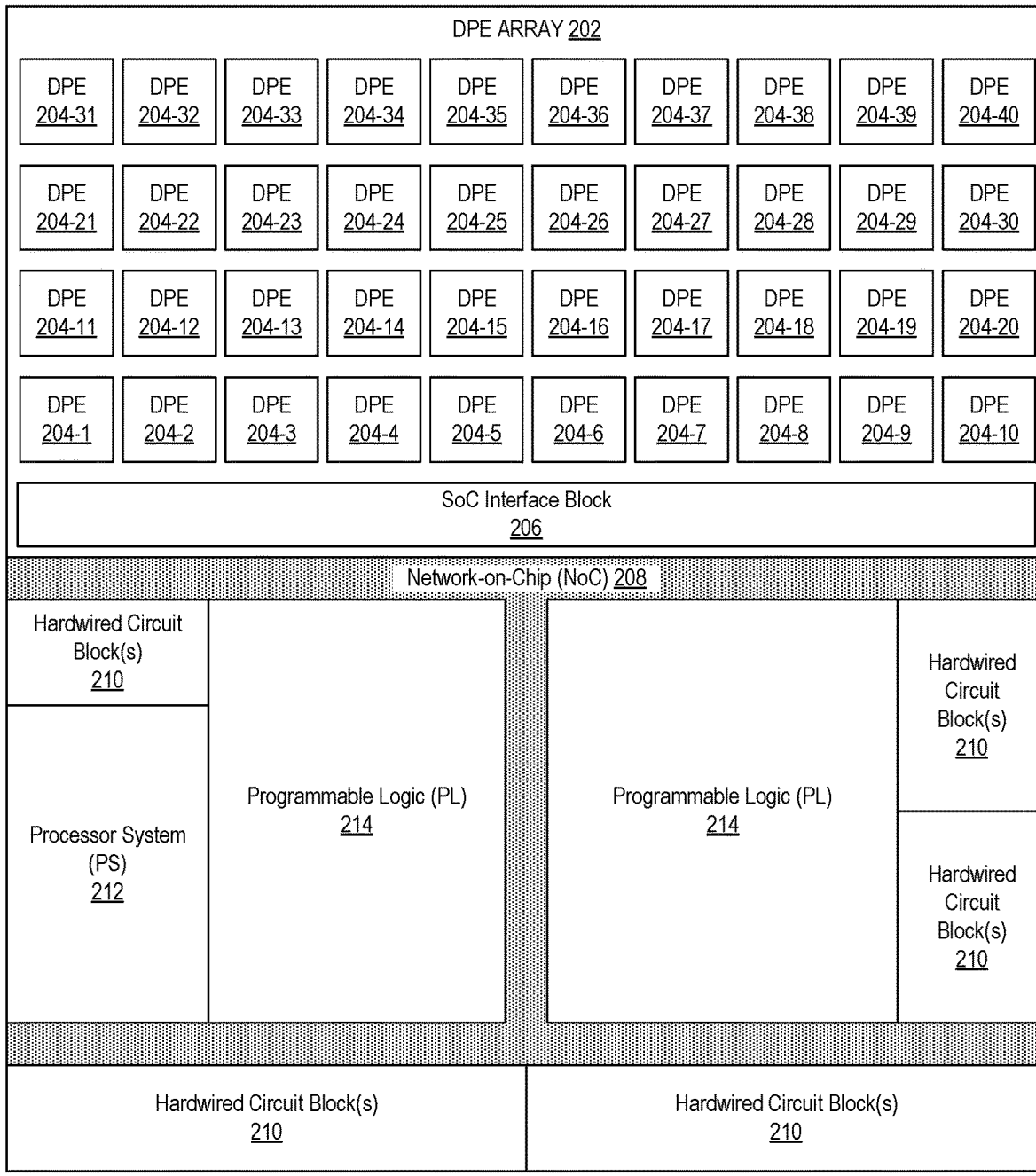
FIG. 2 illustrates an example architecture for a System-on-Chip (SoC) type of integrated circuit (IC).

FIG. 2 illustrates an example architecture for SoC 200. SoC 200 is an example of a programmable IC and an integrated programmable device platform. In the example of FIG. 2, the various, different subsystems or regions of the SoC 200 illustrated may be implemented on a single die provided within a single integrated package. In other examples, the different subsystems may be implemented on a plurality of interconnected dies provided as a single, integrated package.

In the example, the SoC 200 includes a plurality of regions having circuitry with different functionalities. In the example, the SoC 200 optionally includes a data processing engine (DPE) array 202. SoC 200 includes programmable logic (PL) regions 214 (hereafter PL region(s) or PL), a processing system (PS) 212, a Network-on-Chip (NoC) 208, and one or more hardwired circuit blocks 210. DPE array 202 is implemented as a plurality of interconnected, hardwired, and programmable processors having an interface to the other regions of the SoC 200.

PL 214 is circuitry that may be programmed to perform specified functions. As an example, PL 214 may be implemented as field programmable gate array type of circuitry. PL 214 can include an array of programmable circuit blocks. Examples of programmable circuit blocks within PL 214 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within PL 214 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 212 is implemented as hardwired circuitry that is fabricated as part of the SoC 200. The PS 212 may be implemented as, or include, any of a variety of different processor types each capable of executing program code. For example, PS 212 may be implemented as an individual processor, e.g., a single core capable of executing program code. In another example, PS 212 may be implemented as a multi-core processor. In still another example, PS 212 may include one or more cores, modules, co-processors, interfaces, and/or other resources. PS 212 may be implemented using any of a variety of different types of architectures. Example architectures that may be used to implement PS 212 may include, but are not limited to, an ARM processor architecture, an x86 processor architecture, a GPU architecture, a mobile processor architecture, a DSP architecture, other suitable architectures capable of executing computer-readable instructions or program code, and/or a combination of different processors and/or processor architectures.

NoC 208 includes an interconnecting network for sharing data between endpoint circuits in SoC 200. The endpoint circuits can be disposed in DPE array 202, PL regions 214, PS 212, and/or in hardwired circuit blocks 210. NoC 208 can include high-speed data paths with dedicated switching. In an example, NoC 208 includes horizontal paths, vertical paths, or both horizontal and vertical paths. The arrangement and number of regions shown in FIG. 1 is merely an example. The NoC 208 is an example of the common infrastructure that is available within the SoC 200 to connect selected components and/or subsystems.

NoC 208 provides connectivity to PL 214, PS 212, and to selected ones of the hardwired circuit blocks 210. NoC 208 is programmable. In the case of a programmable NoC used with other programmable circuitry, the nets and/or data transfers that are to be routed through NoC 208 are unknown until a user circuit design is created for implementation within the SoC 200. NoC 208 may be programmed by loading configuration data into internal configuration registers that define how elements within NoC 208 such as switches and interfaces are configured and operate to pass data from switch to switch and among the NoC interfaces.

NoC 208 is fabricated as part of the SoC 200 and while not physically modifiable, may be programmed to establish connectivity between different master circuits and different slave circuits of a user circuit design. NoC 208, for example, may include a plurality of programmable switches that are capable of establishing a packet switched network connecting user specified master circuits and slave circuits. In this regard, NoC 208 is capable of adapting to different circuit designs, where each different circuit design has different combinations of master circuits and slave circuits implemented at different locations in the SoC 200 that may be coupled by NoC 208. NoC 208 may be programmed to route data, e.g., application data and/or configuration data, among the master and slave circuits of the user circuit design. For example, NoC 208 may be programmed to couple different user-specified circuitry implemented within PL 214 with PS 212, and/or DPE array 202, with different hardwired circuit blocks, and/or with different circuits and/or systems external to the SoC 200.

The hardwired circuit blocks 210 may include input/output (I/O) blocks, and/or transceivers for sending and receiving signals to circuits and/or systems external to SoC 200, memory controllers, or the like. Examples of different I/O blocks may include single-ended and pseudo differential I/Os and high-speed differentially clocked transceivers. Further, the hardwired circuit blocks 210 may be implemented to perform specific functions. Additional examples of hardwired circuit blocks 210 include, but are not limited to, cryptographic engines, digital-to-analog converters, analog-to-digital converters, and the like. The hardwired circuit blocks 210 within the SoC 200 may be referred to herein from time-to-time as application-specific blocks.

In the example of FIG. 2, PL 214 is shown in two separate regions. In another example, PL 214 may be implemented as a unified region of programmable circuitry. In still another example, PL 214 may be implemented as more than two different regions of programmable circuitry. The particular organization of PL 214 is not intended as a limitation. In this regard, SoC 200 includes one or more PL regions 214, PS 212, and NoC 208.

In other example implementations, the SoC 200 may include two or more DPE arrays 202 located in different regions of the IC. In still other examples, the SoC 200 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

DPE array 202 is implemented as a two-dimensional array of DPEs 204 that includes SoC interface block 206. DPE array 202 may be implemented using any of a variety of different architectures to be described herein in greater detail below. For purposes of illustration and not limitation, FIG. 2 illustrates DPEs 204 arranged in aligned rows and aligned columns. In other embodiments, however, DPEs 204 may be arranged where DPEs in selected rows and/or columns are horizontally inverted or flipped relative to DPEs in adjacent rows and/or columns. In one or more other embodiments, rows and/or columns of DPEs may be offset relative to adjacent rows and/or columns. One or more or all DPEs 204 may be implemented to include a one or more cores each capable of executing program code. The number of DPEs 204, particular arrangement of DPEs 204, and/or orientation of DPEs 204 is not intended to be limiting.

SoC interface block 206 is capable of coupling DPEs 204 to one or more other subsystems of SoC 200. In one or more embodiments, SoC interface block 206 is coupled to adjacent DPEs 204. For example, SoC interface block 206 may be directly coupled to each DPE 204 in the bottom row of DPEs in DPE array 202. In illustration, SoC interface block 206 may be directly connected to DPE 204-1, 204-2, 204-3, 204-4, 204-5, 204-6, 204-7, 204-8, 204-9, and 204-10.

FIG. 2 is provided for purposes of illustration. In other embodiments, SoC interface block 206 may be located at the top of DPE array 202, to the left of DPE array 202 (e.g., as a column), to the right of DPE array 202 (e.g., as a column), or at multiple locations in and around DPE array 202 (e.g., as one or more intervening rows and/or columns within DPE array 202). Depending on the layout and location of SoC interface block 206, the particular DPEs coupled to SoC interface block 206 may vary.

For purposes of illustration, if SoC interface block 206 is located to the left of DPEs 204, SoC interface block 206 may be directly coupled to the left column of DPEs including DPE 204-1, DPE 204-11, DPE 204-21, and DPE 204-31. If SoC interface block 206 is located to the right of DPEs 204, SoC interface block 206 may be directly coupled to the right column of DPEs including DPE 204-10, DPE 204-20, DPE 204-30, and DPE 204-40. If SoC interface block 206 is located at the top of DPEs 204, SoC interface block 206 may be coupled to the top row of DPEs including DPE 204-31, DPE 204-32, DPE 204-33, DPE 204-34, DPE 204-35, DPE 204-36, DPE 204-37, DPE 204-38, DPE 204-39, and DPE 204-40. If SoC interface block 206 is located at multiple locations, the particular DPEs that are directly connected to SoC interface block 206 may vary. For example, if SoC interface block is implemented as a row and/or column within DPE array 202, the DPEs that are directly coupled to SoC interface block 206 may be those that are adjacent to SoC interface block 206 on one or more or each side of SoC interface block 206.

DPEs 204 are interconnected by DPE interconnects (not shown), which, when taken collectively, form a DPE interconnect network. As such, SoC interface block 206 is capable of communicating with any DPE 204 of DPE array 202 by communicating with one or more selected DPEs 204 of DPE array 202 directly connected to SoC interface block 206 and utilizing the DPE interconnect network formed of DPE interconnects implemented within each respective DPE 204.

SoC interface block 206 is capable of coupling each DPE 204 within DPE array 202 with one or more other subsystems of SoC 200. For example, SoC interface block 206 is capable of coupling to DPE array 202 to the NoC 208 and PL 214. As such, the DPE array 202 is capable of communicating with circuit blocks implemented in PL 214, the PS 212, and/or any of the hardwired circuit blocks 210. For example, SoC interface block 206 is capable of establishing connections between selected DPEs 204 and PL 214. SoC interface block 206 is also capable of establishing connections between selected DPEs 204 and NoC 208. Through NoC 208, the selected DPEs 204 are capable of communicating with PS 212 and/or hardwired circuit blocks 210. Selected DPEs 204 are capable of communicating with hardwired circuit blocks 210 via SoC interface block 206 and PL 214. In particular embodiments, SoC interface block 206 may be coupled directly to one or more subsystems of SoC 200. For example, SoC interface block 206 may be coupled directly to PS 212 and/or to hardwired circuit blocks 210.

In one or more embodiments, DPE array 202 includes a single clock domain. Other subsystems such as NoC 208, PL 214, PS 212, and the various hardwired circuit blocks 210 may be in one or more separate or different clock domain(s). Still, DPE array 202 may include additional clocks that may be used for interfacing with other ones of the subsystems. In particular embodiments, SoC interface block 206 includes a clock signal generator that is capable of generating one or more clock signals that may be provided or distributed to DPEs 204 of DPE array 202.

DPE array 202 may be programmed by loading configuration data into internal configuration memory cells (also referred to herein as "configuration registers") that define connectivity among DPEs 204 and SoC interface block 206 and how DPEs 204 and SoC interface block 206 operate. For example, for a particular DPE 204 or group of DPEs 204 to communicate with a subsystem, the DPE(s) 204 and SoC interface block 206 are programmed to do so. Similarly, for one or more particular DPEs 204 to communicate with one or more other DPEs 204, the DPEs are programmed to do so. DPE(s) 204 and SoC interface block 206 may be programmed by loading configuration data into configuration registers within DPE(s) 204 and SoC interface block 206, respectively. In another example, the clock signal generator, being part of SoC interface block 206, may be programmable using configuration data to vary the clock frequencies provided to DPE array 202.

Figure 3:
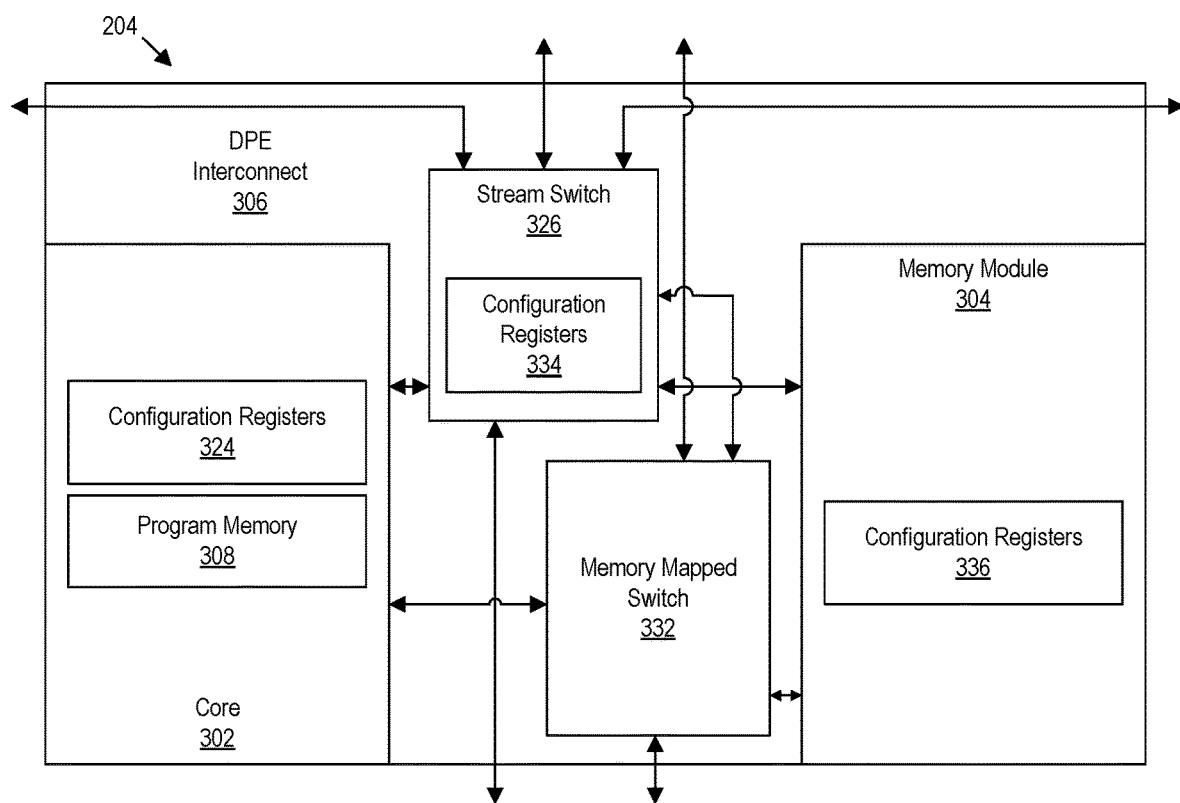
FIG. 3 illustrates an example architecture for a data processing engine (DPE) of the DPE array of FIG. 2.

FIG. 3 illustrates an example architecture for a DPE 204 of DPE array 202 of FIG. 2. In the example of FIG. 3, DPE 204 includes a core 302, a memory module 304, and DPE interconnect 306. Each DPE 204 is implemented as a hardwired and programmable circuit block on the SoC 200.

Core 302 provides the data processing capabilities of DPE 204. Core 302 may be implemented as any of a variety of different processing circuits. In the example of FIG. 3, core 302 includes an optional program memory 308. In an example implementation, core 302 is implemented as a processor that is capable of executing program code, e.g., computer readable instructions. In that case, program memory 308 is included and is capable of storing instructions that are executed by core 302. Core 302, for example, may be implemented as a CPU, a GPU, a DSP, a vector processor, or other type of processor that is capable of executing instructions. Core 302 may be implemented using any of the various CPU and/or processor architectures described herein. In another example, core 302 is implemented as a very long instruction word (VLIW) vector processor or DSP.

In particular implementations, program memory 308 is implemented as a dedicated program memory that is private to core 302 (e.g., accessed exclusively by core 302). Program memory 308 may only be used by the core of the same DPE 204. Thus, program memory 308 may only be accessed by core 302 and is not shared with any other DPE or component of another DPE. Program memory 308 may include a single port for read and write operations. Program memory 308 may support program compression and is addressable using the memory mapped network portion of DPE interconnect 306 described in greater detail below. Via the memory mapped network of DPE interconnect 306, for example, program memory 308 may be loaded with program code that may be executed by core 302.

Core 302 may include configuration registers 324. Configuration registers 324 may be loaded with configuration data to control operation of core 302. In one or more embodiments, core 302 may be activated and/or deactivated based upon configuration data loaded into configuration registers 324. In the example of FIG. 3, configuration registers 324 are addressable (e.g., may be read and/or written) via the memory mapped network of DPE interconnect 306 described in greater detail below.

In one or more embodiments, memory module 304 is capable of storing data that is used by and/or generated by core 302. For example, memory module 304 is capable of storing application data. Memory module 304 may include a read/write memory such as a random-access memory (RAM). Accordingly, memory module 304 is capable of storing data that may be read and consumed by core 302. Memory module 304 is also capable of storing data (e.g., results) that are written by core 302.

In one or more other embodiments, memory module 304 is capable of storing data, e.g., application data, that may be used by and/or generated by one or more other cores of other DPEs within the DPE array. One or more other cores of DPEs may also read from and/or write to memory module 304. In particular embodiments, the other cores that may read from and/or write to memory module 304 may be cores of one or more neighboring DPEs. Another DPE that shares a border or boundary with DPE 204 (e.g., that is adjacent) is said to be a "neighboring" DPE relative to DPE 204. By allowing core 302 and one or more other cores from neighboring DPEs to read and/or write to memory module 304, memory module 304 implements a shared memory that supports communication among the different DPEs and/or cores capable of accessing memory module 304.

Referring to FIG. 2, for example, DPEs 204-14, 204-16, 204-5, and 204-25 are considered neighboring DPEs of DPE 204-15. In one example, the core within each of DPEs 204-16, 204-5, and 204-25 is capable of reading and writing to the memory module within DPE 204-15. In particular embodiments, only those neighboring DPEs that are adjacent to the memory module may access the memory module of DPE 204-15. For example, DPE 204-14, while adjacent to DPE 204-15, may not be adjacent to the memory module of DPE 204-15 since the core of DPE 204-15 may be located between the core of DPE 204-14 and the memory module of DPE 204-15. As such, in particular embodiments, the core of DPE 204-14 may not access the memory module of DPE 204-15.

In particular embodiments, whether a core of a DPE is able to access the memory module of another DPE depends upon the number of memory interfaces included in the memory module and whether such cores are connected to an available one of the memory interfaces of the memory module. In the example above, the memory module of DPE 204-15 includes four memory interfaces, where the core of each of DPEs 204-16, 204-5, and 204-25 is connected to such a memory interface. Core 302 within DPE 204-15 itself is connected to the fourth memory interface. Each memory interface may include one or more read and/or write channels. In particular embodiments, each memory interface includes multiple read channels and multiple write channels so that the particular core attached thereto is capable of reading and/or writing to multiple banks within memory module 304 concurrently.

In other examples, more than four memory interfaces may be available. Such other memory interfaces may be used to allow DPEs on a diagonal to DPE 204-15 to access the memory module of DPE 204-15. For example, if the cores in DPEs such as DPEs 204-14, 204-24, 204-26, 204-4, and/or 204-6 are also coupled to an available memory interface of the memory module in DPE 204-15, such other DPEs would also be capable of accessing the memory module of DPE 204-15.

Memory module 304 may include configuration registers 336. Configuration registers 336 may be loaded with configuration data to control operation of memory module 304. In the example of FIG. 3, configuration registers 336 (and 324) are addressable (e.g., may be read and/or written) via the memory mapped network of DPE interconnect 306 described in greater detail below.

In the example of FIG. 3, DPE interconnect 306 is specific to DPE 204. DPE interconnect 306 facilitates various operations including communication between DPE 204 and one or more other DPEs of DPE array 202 and/or communication with other subsystems of the SoC 200. DPE interconnect 306 further enables configuration, control, and debugging of DPE 204.

In particular embodiments, DPE interconnect 306 is implemented as an on-chip interconnect. An example of an on-chip interconnect is an Advanced Microcontroller Bus Architecture (AMBA) eXtensible Interface (AXI) bus (e.g., or switch). An AMBA AXI bus is an embedded microcontroller bus interface for use in establishing on-chip connections between circuit blocks and/or systems. An AXI bus is provided herein as an example of interconnect circuitry that may be used with the inventive arrangements described within this disclosure and, as such, is not intended as a limitation. Other examples of interconnect circuitry may include other types of buses, crossbars, and/or other types of switches.

In one or more embodiments, DPE interconnect 306 includes two different networks. The first network is capable of exchanging data with other DPEs of DPE array 202 and/or other subsystems of the SoC 200. For example, the first network is capable of exchanging application data. The second network is capable of exchanging data such as configuration, control, and/or debugging data for the DPE(s).

In the example of FIG. 3, the first network of DPE interconnect 306 is formed of stream switch 326 and one or more stream interfaces (not shown). For example, stream switch 326 includes a stream interface for connecting to each of core 302, memory module 304, memory mapped switch 332, a DPE above, a DPE to the left, a DPE to the right, and a DPE below. Each stream interface may include one or more masters and one or more slaves.

Stream switch 326 is capable of allowing non-neighboring DPEs and/or DPEs that are not coupled to a memory interface of memory module 304 to communicate with core 302 and/or memory module 304 via the DPE interconnect network formed by the DPE interconnects of the respective DPEs 204 of DPE array 202.

Referring again to FIG. 2 and using DPE 204-15 as a point of reference, stream switch 326 is coupled to, and capable of, communicating with another stream switch located in the DPE interconnect of DPE 204-14. Stream switch 326 is coupled to, and capable of, communicating with another stream switch located in the DPE interconnect of DPE 204-25. Stream switch 326 is coupled to, and capable of, communicating with another stream switch located in the DPE interconnect of DPE 204-16. Stream switch 326 is coupled to, and capable of, communicating with another stream switch located in the DPE interconnect of DPE 204-5. As such, core 302 and/or memory module 304 are also capable of communicating with any of the DPEs within DPE array 202 via the DPE interconnects in the DPEs.

Stream switch 326 may also be used to interface to subsystems such as PL 214 and/or NoC 208. In general, stream switch 326 is programmed to operate as a circuit-switching stream interconnect or a packet-switched stream interconnect. A circuit-switching stream interconnect is capable of implementing point-to-point, dedicated streams that are suitable for high-bandwidth communication among DPEs. A packet-switching stream interconnect allows streams to be shared to time-multiplex multiple logical streams onto one physical stream for medium bandwidth communication.

Stream switch 326 may include configuration registers (abbreviated as "CR" in FIG. 3) 334. Configuration data may be written to configuration registers 334 by way of the memory mapped network of DPE interconnect 306. The configuration data loaded into configuration registers 334 dictates which other DPEs and/or subsystems (e.g., NoC 208, PL 214, and/or PS 212) DPE 204 will communicate with and whether such communications are established as circuit-switched point-to-point connections or as packet-switched connections.

The second network of DPE interconnect 306 is formed of memory mapped switch 332. Memory mapped switch 332 includes a plurality of memory mapped interfaces (not shown). Each memory mapped interface may include one or more masters and one or more slaves. For example, memory mapped switch 332 includes a memory mapped interface for connecting to each of core 302, memory module 304, the memory mapped switch in the DPE above DPE 204, and the memory mapped switch in the DPE below DPE 204.

Memory mapped switch 332 is used to convey configuration, control, and debugging data for DPE 204. In the example of FIG. 3, memory mapped switch 332 is capable of receiving configuration data that is used to configure DPE 204. Memory mapped switch 332 may receive configuration data from a DPE located below DPE 204 and/or from SoC interface block 206. Memory mapped switch 332 is capable of forwarding received configuration data to one or more other DPEs above DPE 204, to core 302 (e.g., to program memory 308 and/or to configuration registers 324), to memory module 304 (e.g., to memory within memory module 304 and/or to configuration registers 336), and/or to configuration registers 334 within stream switch 326.

DPE interconnect 306 is coupled to the DPE interconnect of each neighboring DPE and/or SoC interface block 206 depending upon the location of DPE 204. Taken collectively, DPE interconnects of DPEs 204 form a DPE interconnect network (which may include the stream network and/or the memory mapped network). The configuration registers of the stream switches of each DPE may be programmed by loading configuration data through the memory mapped switches. Through configuration, the stream switches and/or stream interfaces are programmed to establish connections, whether packet-switched or circuit-switched, with other endpoints, whether in one or more other DPEs 204 and/or in SoC interface block 206.

In one or more embodiments, DPE array 202 is mapped to the address space of a processor system such as PS 212. Accordingly, any configuration registers and/or memories within DPE 204 may be accessed via a memory mapped interface. For example, memory in memory module 304, program memory 308, configuration registers 324 in core 302, configuration registers 336 in memory module 304, and/or configuration registers 334 may be read and/or written via memory mapped switch 332.

In the example of FIG. 3, memory mapped switch 332 is capable of receiving configuration data for DPE 204. The configuration data may include program code that is loaded into program memory 308 (if included), configuration data for loading into configuration registers 324, 334, and/or 336, and/or data to be loaded into memory (e.g., memory banks) of memory module 304. In the example of FIG. 3, configuration registers 324, 334, and 336 are shown as being located within the particular circuit structures that the configuration registers are intended to control, e.g., core 302, stream switch 326, and memory module 304. The example of FIG. 3 is for purposes of illustration only and illustrates that elements within core 302, memory module 304, and/or stream switch 326 may be programmed by way of loading configuration data into the corresponding configuration registers. In other embodiments, the configuration registers may be consolidated within a particular region of DPE 204 despite controlling operation of components distributed throughout DPE 204.

Accordingly, stream switch 326 may be programmed by loading configuration data into configuration registers 334. The configuration data programs stream switch 326 to operate in a circuit-switching mode between two different DPEs and/or other subsystems or in a packet-switching mode between selected DPEs and/or other subsystems. Thus, connections established by stream switch 326 to other stream interfaces and/or switches are programmed by loading suitable configuration data into configuration registers 334 to establish actual connections or application data paths within DPE 204, with other DPEs, and/or with other subsystems of IC 300.

Figure 4:
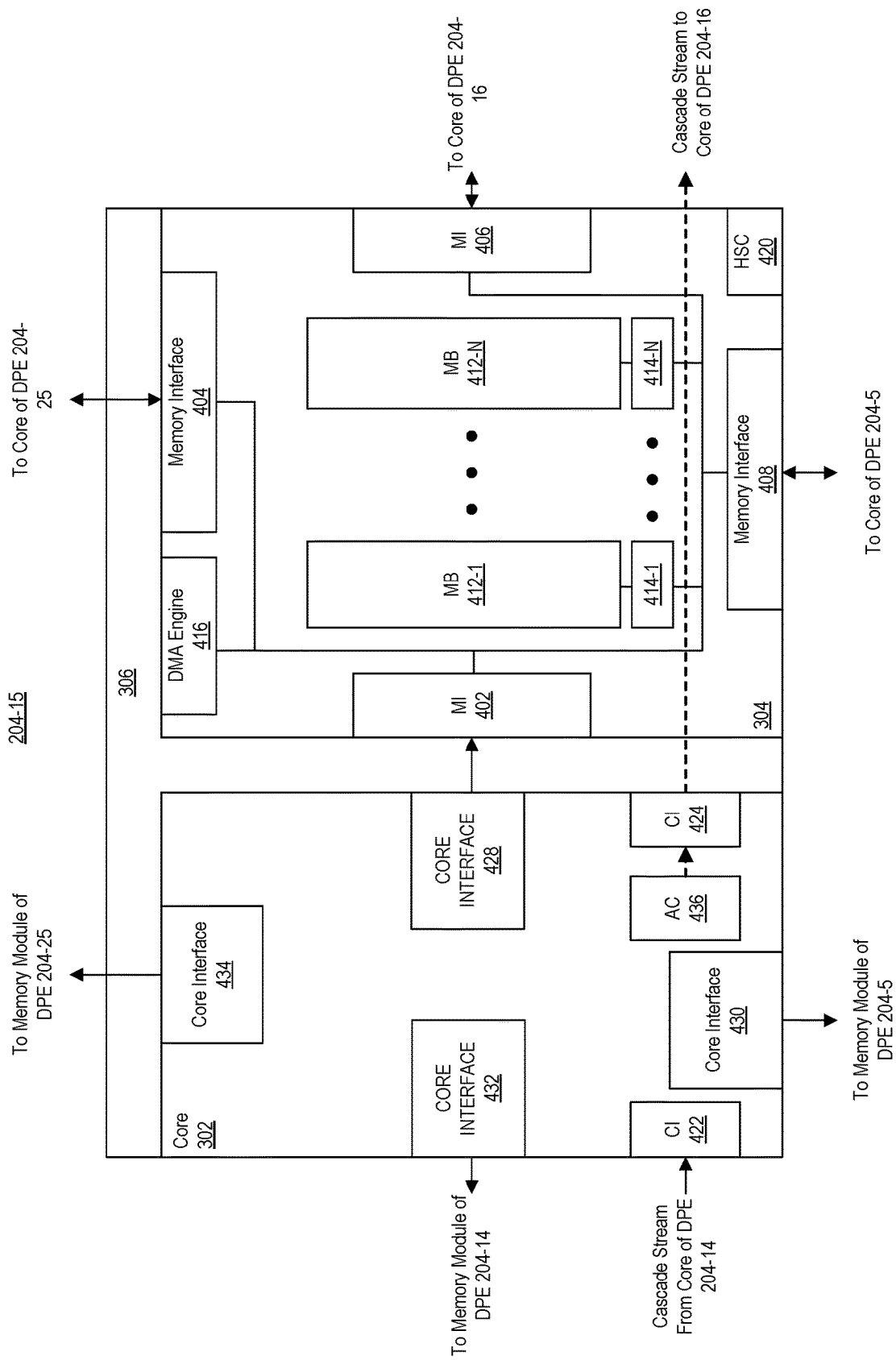
FIG. 4 illustrates further aspects of the example architecture of FIG. 3.

FIG. 4 illustrates further aspects of the example architecture of FIG. 3. In the example of FIG. 4, details relating to DPE interconnect 306 are not shown. FIG. 4 illustrates connectivity of core 302 with other DPEs through shared memory. FIG. 4 also illustrates additional aspects of memory module 304. For purposes of illustration, FIG. 4 refers to DPE 204-15.

As pictured, memory module 304 includes a plurality of memory interfaces 402, 404, 406, and 408. Within FIG. 4, memory interfaces 402 and 408 are abbreviated as "MI." Memory module 304 further includes a plurality of memory banks 412-1 to 412-N. In particular embodiments, memory module 304 includes eight memory banks. In other embodiments, memory module 304 may include fewer or more memory banks 412. In one or more embodiments, each memory bank 412 is single-ported thereby allowing up to one access to each memory bank each clock cycle. In the case where memory module 304 includes eight memory banks 412, such a configuration supports eight parallel accesses each clock cycle. In other embodiments, each memory bank 412 is dual-ported or multi-ported thereby allowing a larger number of parallel accesses each clock cycle.

In the example of FIG. 4, each of memory banks 412-1 through 412-N has a respective arbiter 414-1 through 414-N. Each arbiter 414 is capable of generating a stall signal in response to detecting conflicts. Each arbiter 414 may include arbitration logic. Further, each arbiter 414 may include a crossbar. Accordingly, any master is capable of writing to any particular one or more of memory banks 412. As noted in connection with FIG. 3, memory module 304 is connected to memory mapped switch 332 thereby facilitating reading and writing of data to memory bank 412. As such, the particular data stored in memory module 304 may be controlled, e.g., written, as part of a configuration, control, and/or debugging process through memory mapped switch 332.

Memory module 304 further includes a direct memory access (DMA) engine 416. In one or more embodiments, DMA engine 416 includes at least two interfaces. For example, one or more interfaces are capable of receiving input data streams from DPE interconnect 306 and writing the received data to memory banks 412. One or more other interfaces are capable of reading data from memory banks 412 and sending the data out via a stream interface (e.g., a stream switch) of DPE interconnect 306. For example, DMA engine 416 may include stream interface for accessing stream switch 326 of FIG. 3.

Memory module 304 is capable of operating as a shared memory that may be accessed by a plurality of different DPEs. In the example of FIG. 4, memory interface 402 is coupled to core 302 via core interface 428 included in core 302. Memory interface 402 provides core 302 with access to memory banks 412 through arbiters 414. Memory interface 404 is coupled to the core of DPE 204-25. Memory interface 404 provides the core of DPE 204-25 with access to memory banks 412. Memory interface 406 is coupled to the core of DPE 204-16. Memory interface 406 provides the core of DPE 204-16 with access to memory banks 412. Memory interface 408 is coupled to the core of DPE 204-5. Memory interface 408 provides the core of DPE 204-5 with access to memory banks 412. Accordingly, in the example of FIG. 4, each DPE that has a shared boundary with memory module 304 of DPE 204-15 is capable of reading and writing to memory banks 412. In the example of FIG. 4, the core of DPE 204-14 does not have direct access to memory module 304 of DPE 204-15.

Core 302 is capable of accessing memory modules of other neighboring DPEs via core interfaces 430, 432, and 434. In the example of FIG. 4, core interface 434 is coupled to a memory interface of DPE 204-25. Accordingly, core 302 is capable of accessing the memory module of DPE 204-25 via core interface 434 and the memory interface contained within the memory module of DPE 204-25. Core interface 432 is coupled to a memory interface of DPE 204-14. Accordingly, core 302 is capable of accessing the memory module of DPE 204-14 via core interface 432 and the memory interface contained within the memory module of DPE 204-14. Core interface 430 is coupled to a memory interface within DPE 204-5. Accordingly, core 302 is capable of accessing the memory module of DPE 204-5 via core interface 430 and the memory interface contained within the memory module of DPE 204-5. As discussed, core 302 is capable of accessing memory module 304 within DPE 204-15 via core interface 428 and memory interface 402.

In the example of FIG. 4, core 302 is capable of reading and writing to any of the memory modules of DPEs that share a boundary with core 302 in DPE 204-15 (e.g., DPEs 204-25, 204-14, and 204-5). In one or more embodiments, core 302 is capable of viewing the memory modules within DPEs 204-25, 204-15, 204-14, and 204-5 as a single, contiguous memory (e.g., as a single address space). As such, the process of core 302 reading and/or writing to memory modules of such DPEs is the same as core 302 reading and/or writing to memory module 304. Core 302 is capable of generating addresses for reads and writes presuming this contiguous memory model. Core 302 is capable of directing the read and/or write requests to the appropriate core interface 428, 430, 432, and/or 434 based upon the addresses that are generated.

As noted, core 302 is capable of mapping read and/or write operations in the correct direction through core interface 428, 430, 432, and/or 434 based upon the addresses of such operations. When core 302 generates an address for a memory access, core 302 is capable of decoding the address to determine the direction (e.g., the particular DPE to be accessed) and forwards the memory operation to the correct core interface in the determined direction.

Accordingly, core 302 is capable of communicating with the core of DPE 204-25 via a shared memory which may be the memory module within DPE 204-25 and/or memory module 304 of DPE 204-15. Core 302 is capable of communicating with the core of DPE 204-14 via a shared memory which is the memory module within DPE 204-14. Core 302 is capable of communicating with the core of DPE 204-5 via a shared memory which may be the memory module within DPE 204-5 and/or memory module 304 of DPE 204-15. Further, core 302 is capable of communicating with the core of DPE 204-16 via a shared memory which is memory module 304 within DPE 204-15.

As discussed, DMA engine 416 may include one or more stream-to-memory interfaces. Through DMA engine 416, application data may be received from other sources within the SoC 200 and stored in memory module 304. For example, data may be received from other DPEs that do and/or do not share a boundary with DPE 204-15 by way of stream switch 326. Data may also be received from other subsystems of the SoC (e.g., NoC 208, hardwired circuit blocks 210, PL 214, and/or PS 212) by way of SoC interface block 206 through the stream switches of the DPEs. DMA engine 416 is capable of receiving such data from the stream switches and writing the data to an appropriate memory bank or memory banks 412 within memory module 304.

DMA engine 416 may include one or more memory-to-stream interfaces. Through DMA engine 416, data may be read from memory bank or memory banks 412 of memory module 304 and sent to other destinations via the stream interfaces. For example, DMA engine 416 is capable of reading data from memory module 304 and sending such data to other DPEs that do and/or do not share a boundary with DPE 204-15 by way of the stream switches. DMA engine 416 is also capable of sending such data to other subsystems (e.g., NoC 208, hardwired circuit blocks 210, PL 214, and/or PS 212) by way of the stream switches and SoC interface block 206.

In one or more embodiments, DMA engine 416 is programmed by memory mapped switch 332 within DPE 204-15. For example, DMA engine 416 may be controlled by configuration registers 336. Configuration registers 336 may be written using memory mapped switch 332 of DPE interconnect 306. In particular embodiments, DMA engine 416 may be controlled by the stream switch 326 within DPE 204-15. For example, DMA engine 416 may include control registers that may be written by stream switch 326 connected thereto. Streams received via stream switch 326 within DPE interconnect 306 may be connected to DMA engine 416 in memory module 304 and/or directly to core 302 depending upon the configuration data loaded into configuration registers 324, 334, and/or 336. Streams may be sent from DMA engine 416 (e.g., memory module 304) and/or core 302 depending upon the configuration data loaded into configuration registers 324, 334, and/or 336.

Memory module 304 further may include hardware synchronization circuitry 420 (abbreviated as "HSC" in FIG. 4). In general, hardware synchronization circuitry 420 is capable of synchronizing operation of different cores (e.g., cores of neighboring DPEs), core 302 of FIG. 4, DMA engine 416, and other external masters (e.g., PS 212) that may communicate via DPE interconnect 306. As an illustrative and non-limiting example, hardware synchronization circuitry 420 is capable of synchronizing two different cores, stream switches, memory mapped interfaces, and/or DMAs in DPE 204-15 and/or different DPEs accessing the same, e.g., a shared, buffer in memory module 304.

In the case where two DPEs are not neighbors, the two DPEs do not have access to a common memory module. In that case, application data may be transferred via a data stream (the terms "data stream" and "stream" may be used interchangeably from time-to-time within this disclosure). As such, the local DMA engine is capable of converting the transfer from a local memory-based transfer to a stream-based transfer. In that case, core 302 and DMA engine 416 are capable of synchronizing using hardware synchronization circuitry 420.

PS 212 is capable of communicating with core 302 via memory mapped switch 332. PS 212, for example, is capable of accessing memory module 304 and hardware synchronization circuitry 420 by initiating memory reads and writes. In another embodiment, hardware synchronization circuitry 420 may also send an interrupt to PS 212 when status of a lock changes to avoid polling by PS 212 of hardware synchronization circuitry 420. PS 212 is also capable of communicating with DPE 204-15 via the stream interfaces.

In addition to communicating with neighboring DPEs through shared memory modules and neighboring and/or non-neighboring DPEs via DPE interconnect 306, core 302 may include cascade interfaces. In the example of FIG. 4, core 302 includes cascade interfaces 422 and 424 (abbreviated as "CI" in FIG. 4). Cascade interfaces 422 and 424 are capable of providing direct communication with other cores. As pictured, cascade interface 422 of core 302 receives an input data stream directly from the core of DPE 204-14. The data stream received via cascade interface 422 may be provided to the data processing circuitry within core 302. Cascade interface 424 of core 302 is capable of sending an output data stream directly to the core of DPE 204-16.

In the example of FIG. 4, each of cascade interface 422 and cascade interface 424 may include a first-in-first-out (FIFO) interface for buffering. In particular embodiments, cascade interfaces 422 and 424 are capable of conveying data streams that may be hundreds of bits in width. The particular bit width of cascade interfaces 422 and 424 is not intended as a limitation. In the example of FIG. 4, cascade interface 424 is coupled to an accumulator register 436 (abbreviated as "AC" within FIG. 4) within core 302. Cascade interface 424 is capable of outputting the contents of accumulator register 436 and may do so each clock cycle. Accumulation register 436 may store data that is generated and/or being operated upon by data processing circuitry within core 302.

In the example of FIG. 4, cascade interfaces 422 and 424 may be programmed based upon configuration data loaded into configuration registers 324. For example, based upon configuration registers 324, cascade interface 422 may be activated or deactivated. Similarly, based upon configuration registers 324, cascade interface 424 may be activated or deactivated. Cascade interface 422 may be activated and/or deactivated independently of cascade interface 424.

In one or more other embodiments, cascade interfaces 422 and 424 are controlled by core 302. For example, core 302 may include instructions to read/write to cascade interfaces 422 and/or 424. In another example, core 302 may include hardwired circuitry that is capable of reading and/or writing to cascade interfaces 422 and/or 424. In particular embodiments, cascade interfaces 422 and 424 may be controlled by an entity outside of core 302.

Within the embodiments described within this disclosure, DPEs 204 do not include cache memories. By omitting cache memories, DPE array 202 is capable of achieving predictable, e.g., deterministic, performance. Further, significant processing overhead is avoided since maintaining coherency among cache memories located in different DPEs is not required.

In accordance with one or more embodiments, cores 302 of DPEs 204 do not have input interrupts. Thus, cores 302 of DPEs 204 are capable of operating uninterrupted. Omitting input interrupts to cores 302 of DPEs 204 also allows DPE array a02 to achieve predictable, e.g., deterministic, performance.

Figure 5:
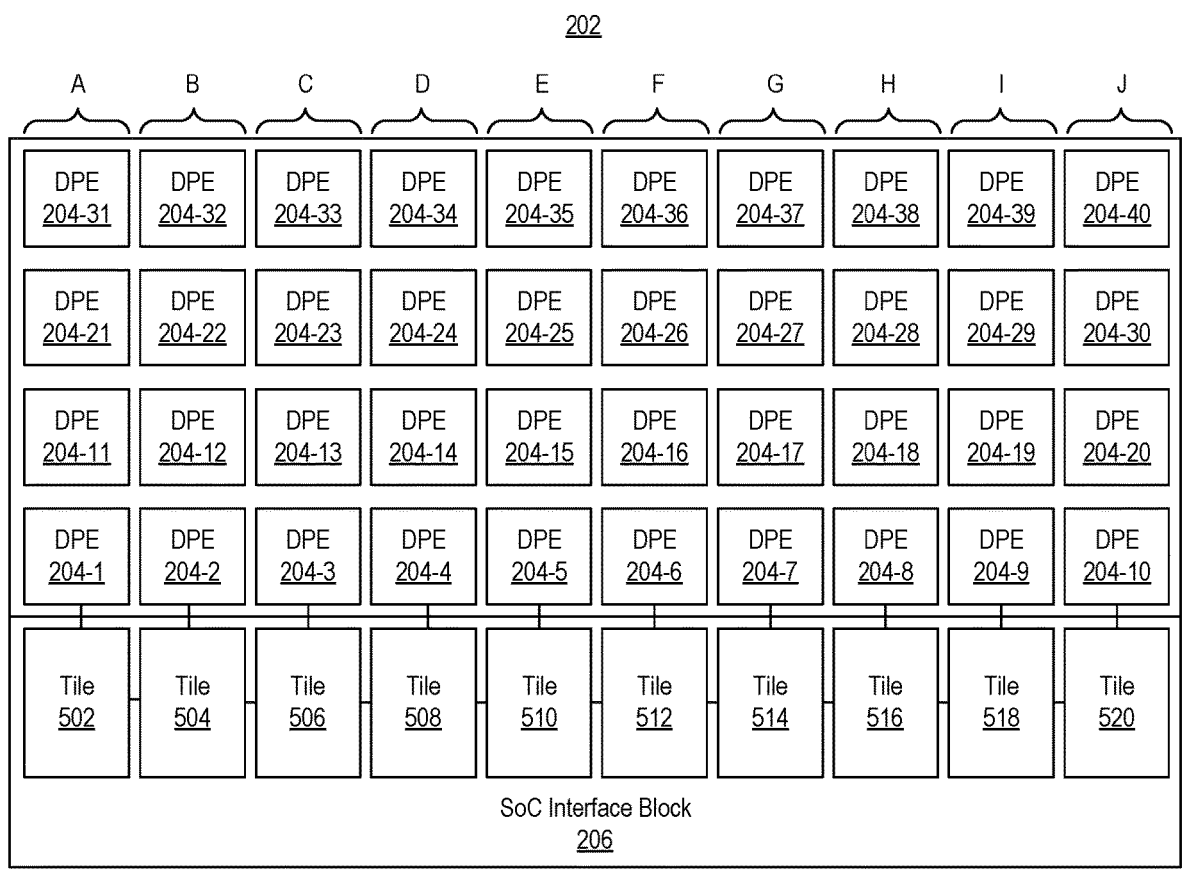
FIG. 5 illustrates another example architecture for a DPE array.

FIG. 5 illustrates another example architecture for a DPE array. In the example of FIG. 5, SoC interface block 206 provides an interface between DPEs 204 and other subsystems of the SoC 200. SoC interface block 206 integrates DPEs into the device. SoC interface block 206 is capable of conveying configuration data to DPEs 204, conveying events from DPEs 204 to other subsystems, conveying events from other subsystems to DPEs 204, generating and conveying interrupts to entities external to DPE array 202, conveying application data between other subsystems and DPEs 204, and/or conveying trace and/or debug data between other subsystems and DPEs 204.

In the example of FIG. 5, SoC interface block 206 includes a plurality of interconnected tiles. For example, SoC interface block 206 includes tiles 502, 504, 506, 508, 510, 512, 514, 516, 518, and 520. In the example of FIG. 5, tiles 502-520 are organized in a row. In other embodiments, tiles may be arranged in a column, in a grid, or in another layout. For example, SoC interface block 206 may be implemented as a column of tiles on the left of DPEs 204, on the right of DPEs 204, between columns of DPEs 204, or the like. In another embodiment, SoC interface block 206 may be located above DPE array 202. SoC interface block 206 may be implemented so that tiles are located in any combination of below DPE array 202, to the left of DPE array 202, to the right of DPE array 202, and/or above DPE array 202. In this regard, FIG. 5 is provided for purposes of illustration and not limitation.

In one or more embodiments, tiles 502-520 have a same architecture. In one or more other embodiments, tiles 502-520 may be implemented with two or more different architectures. In particular embodiments, different architectures may be used to implement tiles within SoC interface block 206 where each different tile architecture supports communication with a different type of subsystem or combination of subsystems of SoC 200.

In the example of FIG. 5, tiles 502-520 are coupled so that data may be propagated from one tile to another. For example, data may be propagated from tile 502 through tiles 504, 506, and on down the line of tiles to tile 520. Similarly, data may be propagated in the reverse direction from tile 520 to tile 502. In one or more embodiments, each of tiles 502-520 is capable of operating as an interface for a plurality of DPEs. For example, each of tiles 502-520 is capable of operating as an interface for a subset of the DPEs 204 of DPE array 202. The subset of DPEs to which each tile provides an interface may be mutually exclusive such that no DPE is provided with an interface by more than one tile of SoC interface block 206.

In one example, each of tiles 502-520 provides an interface for a column of DPEs 204. For purposes of illustration, tile 502 provides an interface to the DPEs of column A. Tile 504 provides an interface to the DPEs of column B, etc. In each case, the tile includes a direct connection to an adjacent DPE in the column of DPEs, which is the bottom DPE in this example. Referring to column A, for example, tile 502 is directly connected to DPE 204-1. Other DPEs within column A may communicate with tile 502 but do so through the DPE interconnects of the intervening DPEs in the same column.

For example, tile 502 is capable of receiving data from another source such as PS 212, PL 214, and/or another hardwired circuit block 210 such as an application-specific circuit block. Tile 502 is capable of providing those portions of the data addressed to DPEs in column A to such DPEs while sending data addressed to DPEs in other columns (e.g., DPEs for which tile 502 is not an interface) on to tile 504. Tile 504 may perform the same or similar processing where data received from tile 502 that is addressed to DPEs in column B is provided to such DPEs, while sending data addressed to DPEs in other columns on to tile 506, and so on.

In this manner, data may propagate from tile to tile of SoC interface block 206 until reaching the tile that operates as an interface for the DPEs to which the data is addressed (e.g., the "target DPE(s)"). The tile that operates as an interface for the target DPE(s) is capable of directing the data to the target DPE(s) using the memory mapped switches of the DPEs and/or the stream switches of the DPEs.

As noted, the use of columns is an example implementation. In other embodiments, each tile of SoC interface block 206 is capable of providing an interface to a row of DPEs of DPE array 202. Such a configuration may be used in cases where SoC interface block 206 is implemented as a column of tiles, whether on the left, right, or between columns of DPEs 204. In other embodiments, the subset of DPEs to which each tile provides an interface may be any combination of fewer than all DPEs of DPE array 202. For example, DPEs 204 may be apportioned to tiles of SoC interface block 206. The particular physical layout of such DPEs may vary based upon connectivity of the DPEs as established by DPE interconnects. For example, tile 502 may provide an interface to DPEs 204-1, 204-2, 204-11, and 204-12. Another tile of SoC interface block 206 may provide an interface to four other DPEs, and so forth.

Figure 6:
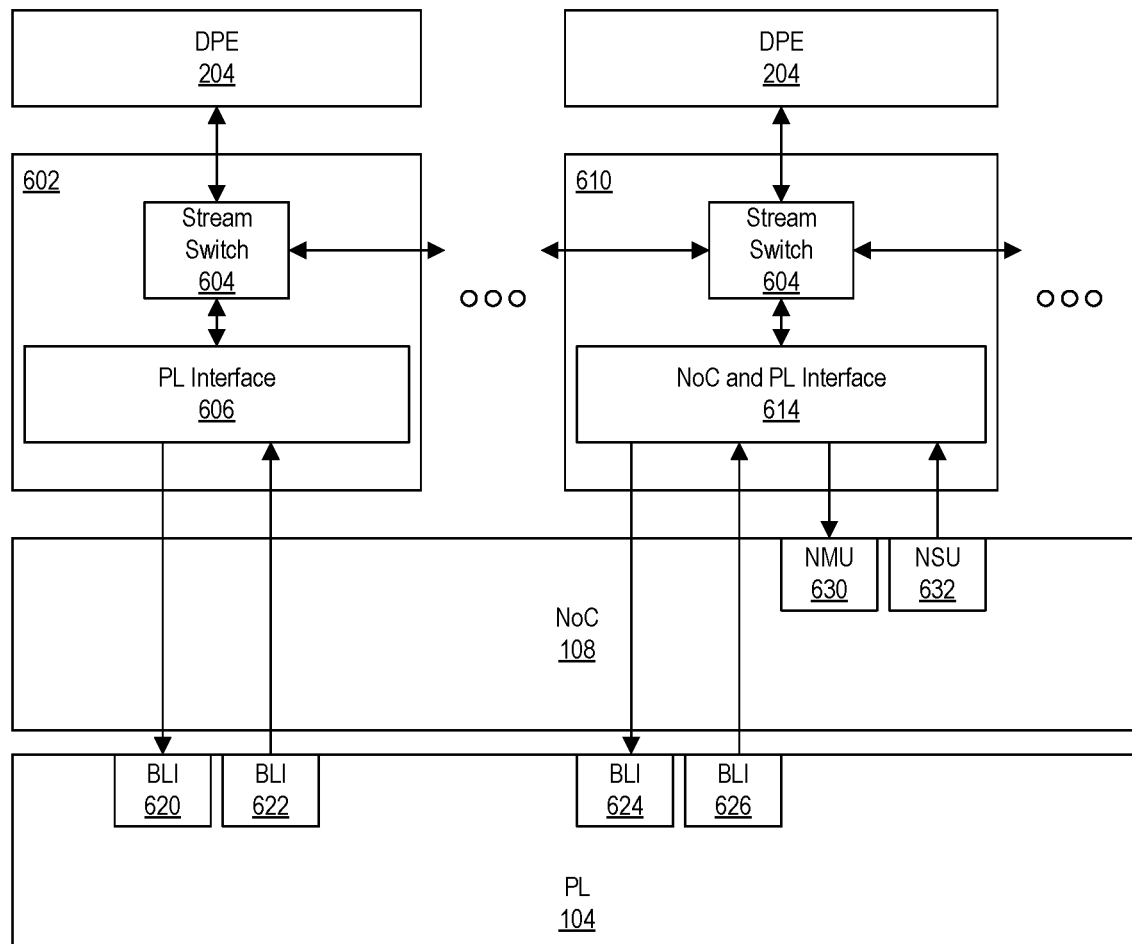
FIG. 6 illustrates an example architecture for tiles of the SoC interface block of the DPE array.

FIG. 6 illustrates an example architecture for tiles of SoC interface block 206. In the example of FIG. 6, two different types of tiles for SoC interface block 206 are shown. Tile 602 is configured to serve as an interface between DPEs and only PL 214. Tile 610 is configured to serve as an interface between DPEs and NoC 208 and between DPEs and PL 214. SoC interface block 206 may include a combination of tiles using both architectures as illustrated for tile 602 and for tile 610 or, in another example, only tiles having an architecture as illustrated for tile 610.

In the example of FIG. 6, tile 602 includes a stream switch 604 connected to a PL interface 606 and to a DPE such as DPE 204-1 immediately above. PL interface 606 connects to Boundary Logic Interface (BLI) circuit 620 and BLI circuit 622 each located in PL 214. Tile 610 includes a stream switch 612 connected to NoC and PL interface 614 and to a DPE such as DPE 204-5 immediately above. NoC and PL interface 614 connects to BLI circuits 624 and 626 in the PL 214 and also to NoC Master Unit (NMU) 630 and NoC Slave Unit (NSU) 632 of the NoC 208.

In the example of FIG. 6, each stream interface 604 is capable of outputting six different 32-bit data streams to, and receiving 4 different 32-bit data streams from, the DPE coupled thereto. Each of PL interface 606 and NoC and PL interface 614 is capable of providing 6 different 64-bit data streams to PL 214 by way of BLI 620 and BLI 624, respectively. In general, each of BLIs 620, 622, 624, and 626 provides an interface or connection point within PL 214 to which PL interface 606 and/or NoC and PL interface 614 connect. Each of PL interface 606 and NoC and PL interface 614 is capable of receiving 8 different 64-bit data streams from PL 214 by way of BLI 622 and BLI 624, respectively.

NoC and PL interface 614 is also connected to NoC 208. In the example of FIG. 6, NoC and PL interface 614 connects to one or more NMUs 630 and to one or more NSUs 632. In one example, NoC and PL interface 614 is capable of providing two different 128-bit data streams to NoC 208, wherein each data stream is provided to a different NMU 630. NoC and PL interface 614 is capable of receiving two different 128-bit data streams from NoC 208, where each data stream is received from a different NSU 632.

Stream switches 604 in adjacent tiles are connected. In an example, stream switches 604 in adjacent tiles are capable of communicating by way of four different 32-bit data streams in each of the left and right directions (e.g., so long as a tile is to the right or to the left as the case may be).

Tiles 602 and 610 each may include one or more memory mapped switches to convey configuration data. For purposes of illustration, the memory mapped switches are not shown. The memory mapped switches, for example, are capable of connecting vertically to a memory mapped switch of the DPE immediately above, to memory mapped switches in other adjacent tiles in SoC interface block 206 in the same or similar manner as stream switches 604, to configuration registers in tiles 602 and 610 (not shown), and/or to PL interface 608 or NoC and PL interface 614 as the case may be.

The various bit widths and numbers of data streams described in connection with the various switches included in the DPEs 204 and/or the tiles 602 and/or 610 of the SoC interface block 206 are provided for purposes of illustration and are not intended to be limiting of the inventive arrangements described within this disclosure.

Figure 7:
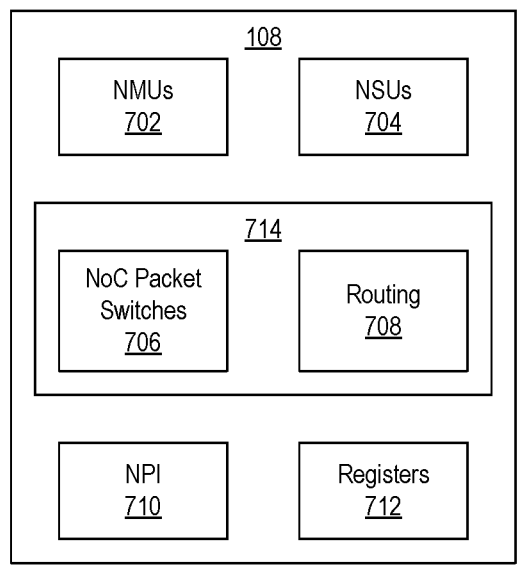
FIG. 7 illustrates an example implementation of the Network-on-Chip (NoC) of FIG. 1.

FIG. 7 illustrates an example implementation of NoC 208. NoC 208 includes NMUs 702, NSUs 704, a network 714, NoC peripheral interconnect (NPI) 710, and registers 712. Each NMU 702 is an ingress circuit that connects an endpoint circuit to the NoC 208. Each NSU 704 is an egress circuit that connects the NoC 208 to an endpoint circuit. The NMUs 702 are connected to the NSUs 704 through the network 714. In an example, the network 714 includes NoC packet switches 706 (NPSs) and routing 708 between the NPSs 706. Each NPS 706 performs switching of NoC packets. The NPSs 706 are connected to each other and to the NMUs 702 and NSUs 704 through the routing 708 to implement a plurality of physical channels. The NPSs 706 also support multiple virtual channels per physical channel.

The NPI 710 includes circuitry to program the NMUs 702, NSUs 704, and NPSs 706. For example, the NMUs 702, NSUs 704, and NPSs 706 can include registers 712 that determine functionality thereof. The NPI 710 includes a peripheral interconnect coupled to the registers 712 for programming thereof to set functionality. The registers 712 in the NoC 208 support interrupts, Quality of Service (QoS), error handling and reporting, transaction control, power management, and address mapping control. The registers 712 can be initialized in a usable state before being reprogrammed, such as by writing to the registers 712 using write requests. Configuration data for the NoC 208 can be stored in a non-volatile memory (NVM), e.g., as part of a programming device image (PDI), and provided to the NPI 710 for programming the NoC 208 and/or other endpoint circuits.

The NMUs 702 are traffic ingress points. The NSUs 704 are traffic egress points. Endpoint circuits coupled to the NMUs 702 and NSUs 704 can be hardened circuits (e.g., hardwired circuit blocks 210) or circuits implemented in PL 214. A given endpoint circuit can be coupled to more than one NMU 702 or more than one NSU 704.

Figure 8:
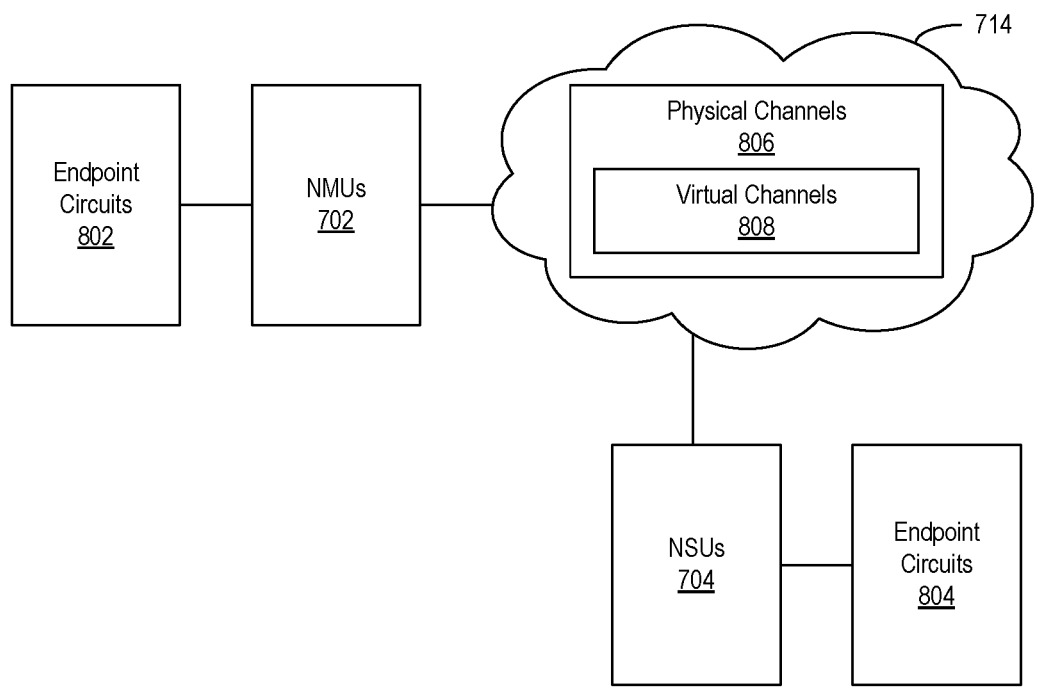
FIG. 8 is a block diagram depicting connections between endpoint circuits in the SoC of FIG. 1 through the NoC.

FIG. 8 is a block diagram depicting connections between endpoint circuits in the SoC 200 through the NoC 208 according to an example. In the example, endpoint circuits 802 are connected to endpoint circuits 804 through the NoC 208. The endpoint circuits 802 are master circuits, which are coupled to NMUs 702 of the NoC 208. The endpoint circuits 804 are slave circuits coupled to the NSUs 704 of the NoC 208. Each endpoint circuit 802 and 804 can be a circuit in the PS 212, a circuit in a PL region 214, or a circuit in another subsystem (e.g., hardwired circuit blocks 210).

The network 714 includes a plurality of physical channels 806. The physical channels 806 are implemented by programming the NoC 208. Each physical channel 806 includes one or more NPSs 706 and associated routing 708. An NMU 702 connects with an NSU 704 through at least one physical channel 806. A physical channel 806 can also have one or more virtual channels 808.

Connections through the network 714 use a master-slave arrangement. In an example, the most basic connection over the network 714 includes a single master connected to a single slave. However, in other examples, more complex structures can be implemented.

Figure 9:
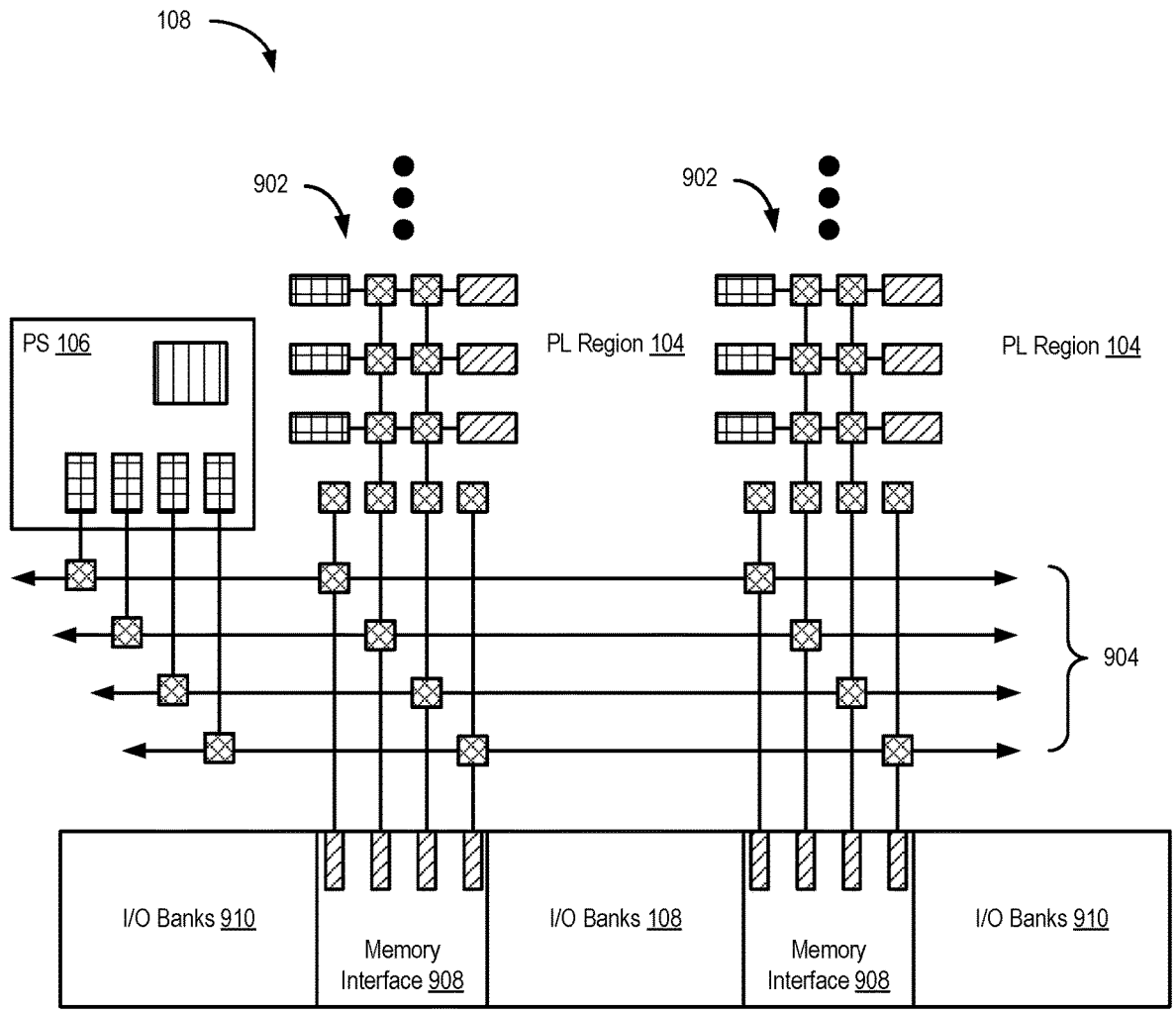
FIG. 9 is a block diagram depicting the NoC according to another example.

FIG. 9 is a block diagram depicting the NoC 208 according to another example. In the example, the NoC 208 includes vertical portions 902 (VNoC) and horizontal portion 904 (HNoC). Each VNoC 902 is disposed between PL regions 214. The HNoC 904 is disposed between the PL regions 214 and the I/O banks 910 (e.g., I/O blocks and/or transceivers corresponding to hardwired circuit blocks 210). The NoC 208 is connected to the memory interfaces 908 (e.g., hardwired circuit blocks 210). The PS 212 is coupled to the HNoC 904.

In the example, the PS 212 includes a plurality of NMUs 702 coupled to the HNoC 904. The VNoC 902 includes both NMUs 702 and NSUs 704, which are disposed in the PL regions 214. The memory interfaces 908 include NSUs 704 coupled to the HNoC 904. Both the HNoC 904 and the VNoC 902 include NPSs 706 connected by routing 708. In the VNoC 902, the routing 708 extends vertically. In the HNoC 904, the routing extends horizontally. In each VNoC 902, each NMU 702 is coupled to an NPS 706. Likewise, each NSU 704 is coupled to an NPS 706. NPSs 706 are coupled to each other to form a matrix of switches. Some NPSs 706 in each VNoC 902 are coupled to other NPSs 706 in the HNoC 904.

Although only a single HNoC 904 is shown, in other examples, the NoC 208 can include more than one HNoC 904. In addition, while two VNoCs 902 are shown, the NoC 208 can include more than two VNoCs 902. Although memory interfaces 908 are shown by way of example, it is to be understood that hardwired circuit blocks 210 other hardwired circuit blocks 210 can be used in place of, or in addition to, the memory interfaces 908.

Figure 10:
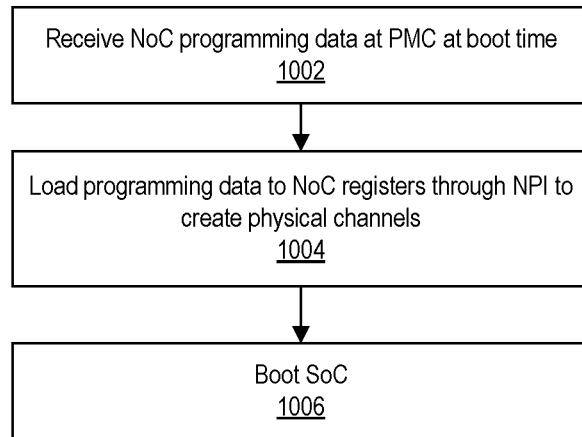
FIG. 10 illustrates an example method of programming the NoC.

FIG. 10 illustrates an example method 1000 of programming the NoC 208. Though described independently of the other subsystems of the SoC 200, method 1000 may be included and/or used as part of a larger boot or programming, process for SoC 200.

At block 1002, a Platform Management Controller (PMC) implemented in the SoC 200 receives NoC programming data at boot time. The NoC programming data may be a part of a PDI. The PMC is responsible for managing the SoC 200. The PMC is capable of maintaining a safe and secure environment, booting the SoC 200, and managing the SoC 200 during normal operations.

At block 1004, the PMC loads the NoC programming data to the registers 712 through the NPI 710 to create physical channels 806. In an example, the programming data can also include information for configuring routing tables in the NPSs 706. At block 1006, the PMC boots the SoC 200. In this manner, the NoC 208 includes at least configuration information for the physical channels 806 between NMUs 702 and NSUs 704. Remaining configuration information for the NoC 208 can be received during runtime, as described further below. In another example, all or a portion of the configuration information described below as being received during runtime can be received at boot time.

Figure 11:
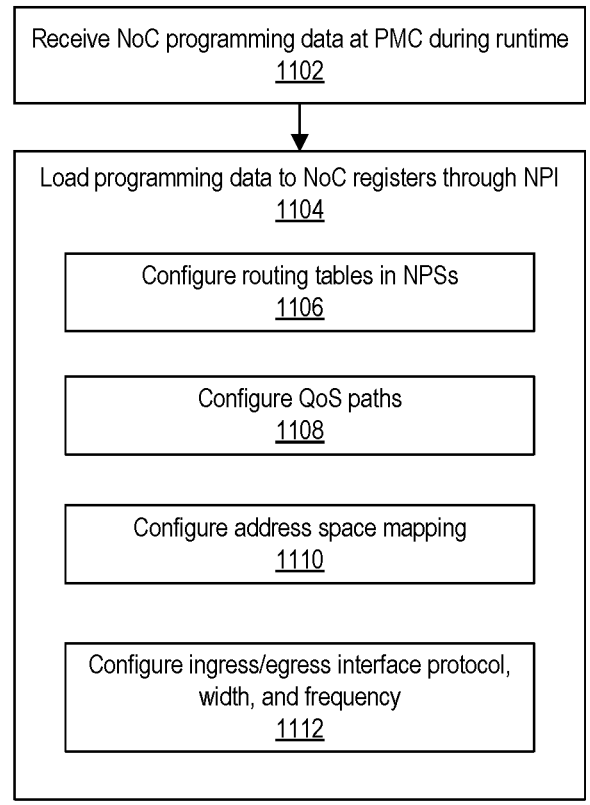
FIG. 11 illustrates another example method of programming the NoC.

FIG. 11 illustrates an example method 1100 of programming the NoC 208. At block 1102, the PMC receives NoC programming data during runtime. At block 1104, the PMC loads the programming data to NoC registers 712 through the NPI 710. In an example, at block 1106, the PMC configures routing tables in the NPSs 706. At block 1108, the PMC configures QoS paths over the physical channels 806. At block 1110, the PMC configures address space mappings. At block 1112, the PMC configures ingress/egress interface protocol, width, and frequency. The QoS paths, address space mappings, routing tables, and ingress/egress configuration are discussed further below.

Figure 12:
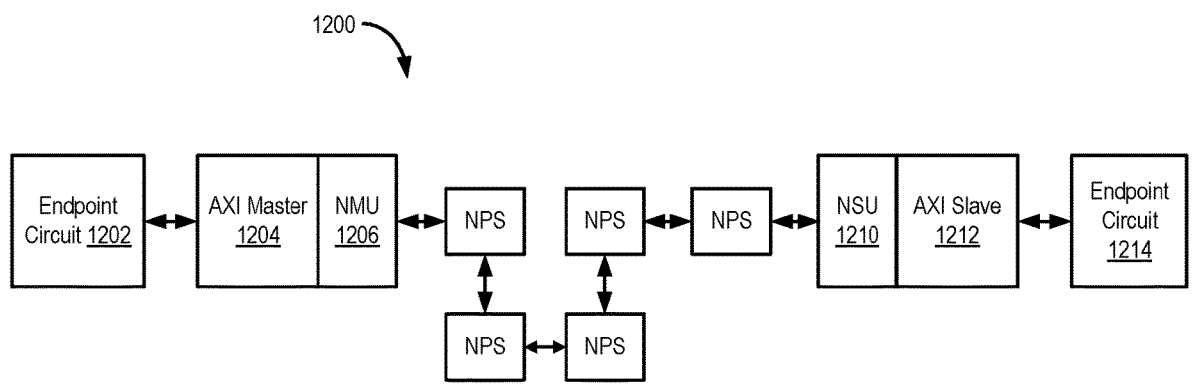
FIG. 12 illustrates an example data path through the NoC between endpoint circuits.

FIG. 12 illustrates an example data path 1200 through the NoC 208 between endpoint circuits. The data path 1200 includes an endpoint circuit 1202, an AXI master circuit 1204, an NMU 1206, NPSs 1208, an NSU 1210, an AXI slave circuit 1212, and an endpoint circuit 1214. The endpoint circuit 1202 is coupled to the AXI master circuit 1204. The AXI master circuit 1204 is coupled to the NMU 1206. In another example, the AXI master circuit 1204 is part of the NMU 1206.

The NMU 1206 is coupled to an NPS 1208. The NPSs 1208 are coupled to each other to form a chain of NPSs 1208 (e.g., a chain of five NPSs 1208 in the present example). In general, there is at least one NPS 1208 between the NMU 1206 and the NSU 1210. The NSU 1210 is coupled to one of the NPSs 1208. The AXI slave circuit 1212 is coupled to the NSU 1210. In another example, the AXI slave circuit 1212 is part of the NSU 1210. The endpoint circuit 1214 is coupled to the AXI slave circuit 1212.

The endpoint circuits 1202 and 1214 can each be a hardened circuit (e.g., a PS circuit, a hardwired circuit 210, one or more DPEs 204) or a circuit configured in the PL 214. The endpoint circuit 1202 functions as a master circuit and sends read/write requests to the NMU 1206. In the example, the endpoint circuits 1202 and 1214 communicate with the NoC 208 using an AXI protocol. While AXI is described in the example, it is to be understood that the NoC 208 may be configured to receive communications from endpoint circuits using other types of protocols known in the art. For purposes of clarity by example, the NoC 208 is described as supporting the AXI protocol herein. The NMU 1206 relays the request through the set of NPSs 1208 to reach the destination NSU 1210. The NSU 1210 passes the request to the attached AXI slave circuit 1212 for processing and distribution of data to the endpoint circuit 1214. The AXI slave circuit 1212 can send read/write responses back to the NSU 1210. The NSU 1210 can forward the responses to the NMU 1206 through the set of NPSs 1208. The NMU 1206 communicates the responses to the AXI master circuit 1204, which distributes the data to the endpoint circuit 1202.

Figure 13:
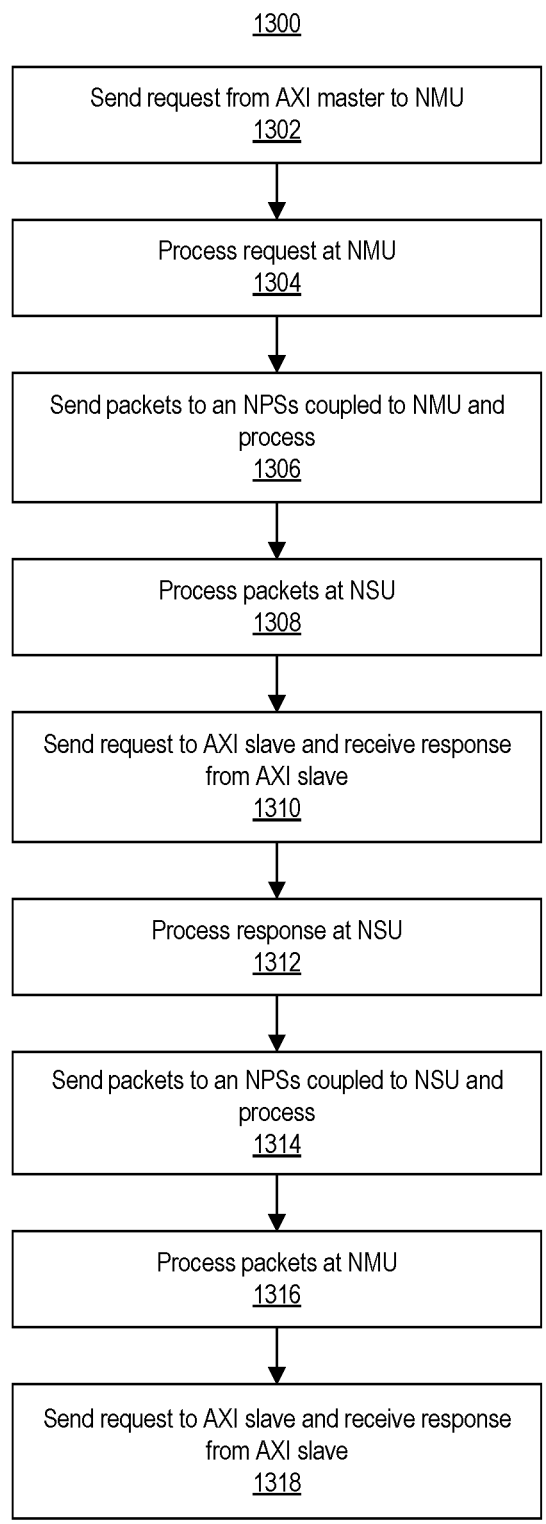
FIG. 13 illustrates an example method of processing read/write requests and responses relating to the NoC.

FIG. 13 illustrates an example method 1300 of processing read/write requests and responses. The method 1300 begins at block 1302, where the endpoint circuit 1202 sends a request (e.g., a read request or a write request) to the NMU 1206 through the AXI master 1204. At block 1304, the NMU 1206 processes the response. In an example, the NMU 1206 performs asynchronous crossing and rate-matching between the clock domain of the endpoint circuit 1202 and the NoC 208. The NMU 1206 determines a destination address of the NSU 1210 based on the request. The NMU 1206 can perform address remapping in case virtualization is employed. The NMU 1206 also performs AXI conversion of the request. The NMU 1206 further packetizes the request into a stream of packets.

At block 1306, the NMU 1206 sends the packets for the request to the NPSs 1208. Each NPS 1208 performs a table lookup for a target output port based on the destination address and routing information. At block 1308, the NSU 1210 processes the packets of the request. In an example, the NSU 1210 de-packetizes the request, performs AXI conversion, and performs asynchronous crossing and rate-matching from the NoC clock domain to the clock domain of the endpoint circuit 1214. At block 1310, the NSU 1210 sends the request to the endpoint circuit 1214 through the AXI slave circuit 1212. The NSU 1210 can also receive a response from the endpoint circuit 1214 through the AXI slave circuit 1212.

At block 1312, the NSU 1210 processes the response. In an example, the NSU 1210 performs asynchronous cross and rate-matching from the clock domain of the endpoint circuit 1214 and the clock domain of the NoC 208. The NSU 1210 also packetizes the response into a stream of packets. At block 1314, the NSU 1210 sends the packets through the NPSs 1208. Each NPS 1208 performs a table lookup for a target output port based on the destination address and routing information. At block 1316, the NMU 1206 processes the packets. In an example, the NMU 1206 de-packetizes the response, performs AXI conversion, and performs asynchronous crossing and rate-matching from the NoC clock domain to the clock domain of the endpoint circuit 1202. At block 1318, the NMU 1206 sends the response to the endpoint circuit 1202 through the AXI master circuit 1204.

Figure 14:
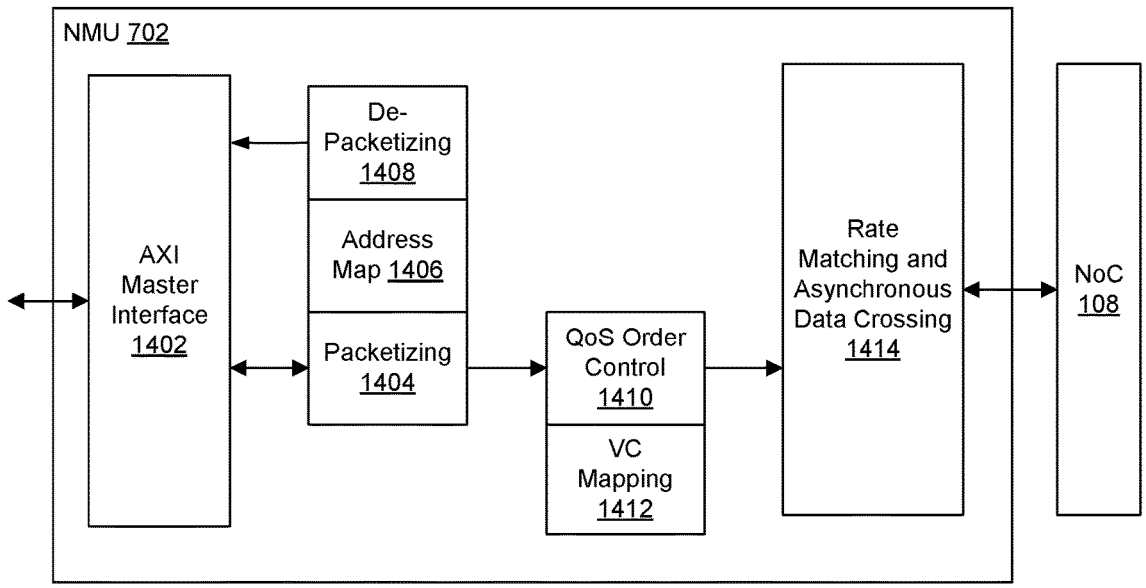
FIG. 14 illustrates an example implementation of a NoC master unit.

FIG. 14 illustrates an example implementation of an NMU 702. The NMU 702 includes an AXI master interface 1402, packetizing circuitry 1404, an address map 1406, de-packetizing circuitry 1408, QoS circuitry 1410, VC mapping circuitry 1412, and clock management circuitry 1414. The AXI master interface 1402 provides an AXI interface to the NMU 702 for an endpoint circuit. In other examples, a different protocol can be used and thus the NMU 702 can have a different master interface that complies with a selected protocol. The NMU 702 routes inbound traffic to the packetizing circuitry 1404, which generates packets from the inbound data. The packetizing circuitry 1404 determines a destination ID from the address map 1406, which is used to route the packets. The QoS circuitry 1410 can provide ingress rate control to control the injection rate of packets into the NoC 208. The VC mapping circuitry 1412 manages QoS virtual channels on each physical channel. The NMU 702 can be configured to select which virtual channel the packets are mapped to. The clock management circuitry 1414 performs rate matching and asynchronous data crossing to provide an interface between the AXI clock domain and the NoC clock domain. The de-packetizing circuitry 1408 receives return packets from the NoC 208 and is configured to de-packetize the packets for output by the AXI master interface 1402.

Figure 15:
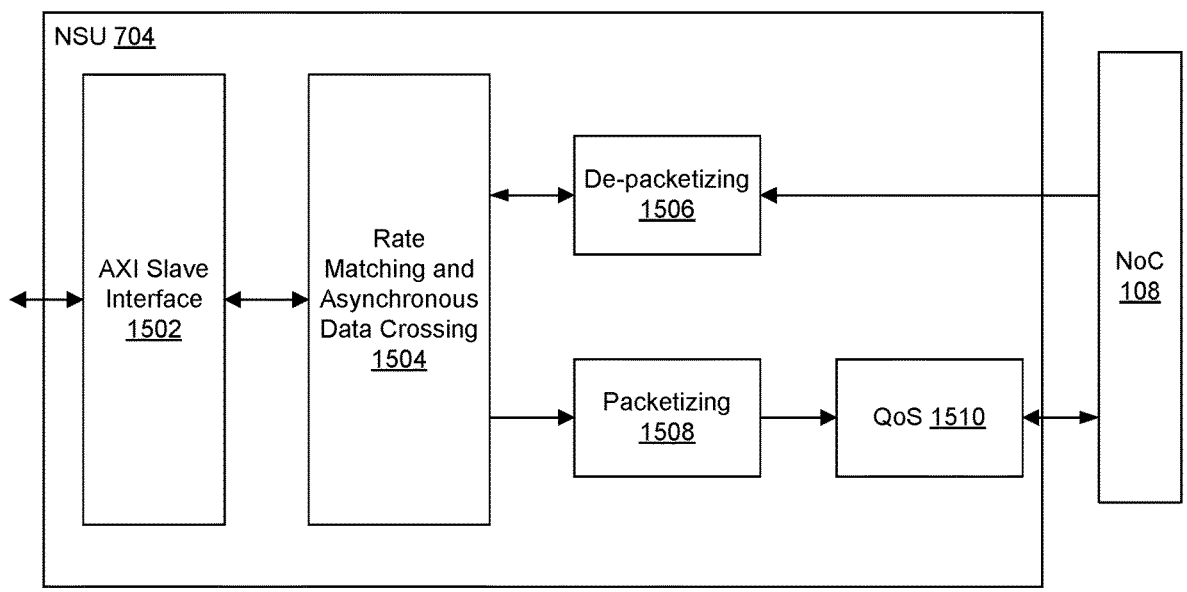
FIG. 15 illustrates an example implementation of an NoC slave unit.

FIG. 15 illustrates an example implementation of an NSU 704. The NSU 704 includes an AXI slave interface 1502, clock management circuitry 1504, packetizing circuitry 1508, de-packetizing circuitry 1506, and QoS circuitry 1510. The AXI slave interface 1502 provides an AXI interface to the NSU 704 for an endpoint circuit. In other examples, a different protocol can be used and thus the NSU 704 can have a different slave interface that complies with a selected protocol. The NSU 704 routes inbound traffic from the NoC 208 to the de-packetizing circuitry 1506, which generates de-packetized data. The clock management circuitry 1504 performs rate matching and asynchronous data crossing to provide an interface between the AXI clock domain and the NoC clock domain. The packetizing circuitry 1508 receives return data from the slave interface 1502 and is configured to packetize the return data for transmission through the NoC 208. The QoS circuitry 1510 can provide ingress rate control to control the injection rate of packets into the NoC 208.

Figure 16:
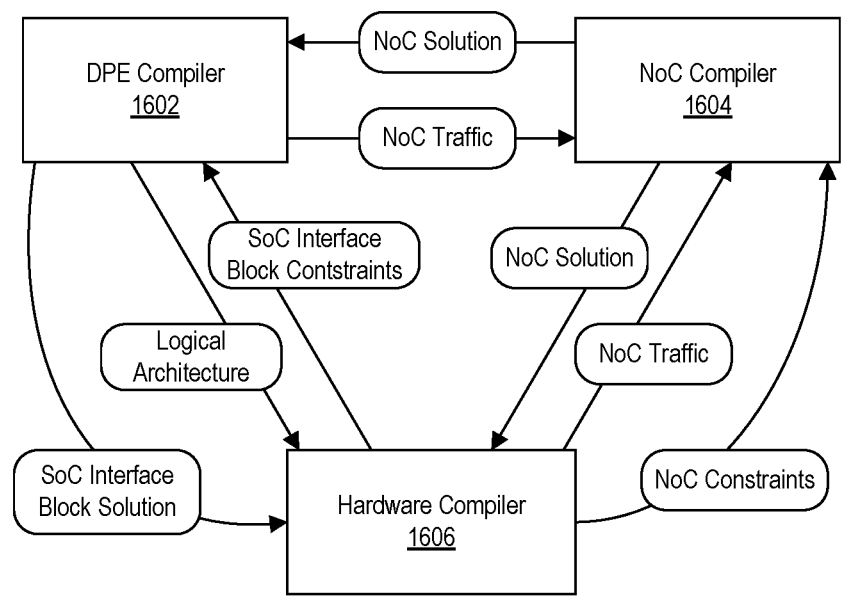
FIG. 16 illustrates an example software architecture that is executable by the system described in connection with FIG. 1.

FIG. 16 illustrates an example software architecture that is executable by the system described in connection with FIG. 1. For example, the architecture of FIG. 16 may be implemented as one or more of the program modules 120 of FIG. 1. The software architecture of FIG. 16 includes a DPE compiler 1602, a NoC compiler 1604, and a hardware compiler 1606. FIG. 16 illustrates an example of the various types of design data that may be exchanged among the compilers during operation (e.g., performing a design flow to implement an application in the SoC 200).

The DPE compiler 1602 is capable of generating, from the application, one or more binaries that may be loaded into one or more DPEs and/or subsets of DPEs 204 of DPE array 202. Each binary may include object code that is executable by the core(s) of the DPE(s), optionally application data, and configuration data for the DPEs. The NoC compiler 1604 is capable of generating a binary including the configuration data that is loaded into the NoC 208 to create data paths therein for the application. Hardware compiler 1606 is capable of compiling a hardware portion of the application to generate a configuration bitstream for implementation in the PL 214.

FIG. 16 illustrates an example of how the DPE compiler 1602, the NoC compiler 1604, and the hardware compiler 1606 communicate with one another during operation. The respective compilers communicate in a coordinated manner by exchanging design data to converge to a solution. The solution is an implementation of the application within the SoC 200 that meets design metrics and constraints and includes common interfaces through which the various heterogeneous subsystems of the SoC 200 communicate.

As defined within this disclosure, the term "design metric" defines an objective or requirement of an application to be implemented in SoC 200. Examples of design metrics include, but are not limited to, a power consumption requirement, a data throughput requirement, a timing requirement, or the like. Design metrics may be provided via user input, a file, or another manner to define higher or system level requirements of the application. As defined within this disclosure, a "design constraint" is a requirement that an EDA tool may or may not follow to achieve a design metric or requirement. Design constraints may be specified as compiler directives and typically specify lower level requirements or suggestions to be followed by the EDA tool (e.g., compiler(s)). Design constraints may be specified by way of user input(s), files containing one or more design constraints, command line input, and the like.

In one aspect, the DPE compiler 1602 is capable of generating a logical architecture and an SoC interface block solution for the application. The DPE compiler 1602, for example, is capable of generating the logical architecture based on high-level, user-defined metrics for the software portion of the application to be implemented in the DPE array 202. Examples of the metrics can include, but are not limited to, data throughput, latency, resource utilization, and power consumption. Based on the metrics and the application (e.g., the particular nodes to be implemented in the DPE array 202), the DPE compiler 1602 is capable of generating the logical architecture.

The logical architecture is a file or data structure that can specify hardware resource block information required by the various portions of the application. For example, the logical architecture can specify the number of DPEs 204 that are needed to implement the software portion of the application, any Intellectual Property (IP) cores needed in the PL 214 to communicate with the DPE array 202, any connections that need to be routed through the NoC 208, and port information for the DPE array 202, the NoC 208 and the IP cores in the PL 214. An IP core is a reusable block or portion of logic, cells, or IC layout design that may be used in a circuit design as a reusable block of circuitry capable of performing a particular function or operation. The IP core may be specified in a format that may be incorporated into a circuit design for implementation within the PL 214. While this disclosure refers to various types of cores, the term "core" without any other modifier is intended to refer to such different types of cores generically.

Example 1 within this disclosure located at the end of the detailed description illustrates an example schema that may be used to specify the logical architecture for the application. Example 1 illustrates various types of information included in the logical architecture for the application. In one aspect, the hardware compiler 1606 is capable of implementing the hardware portion of the application based on, or using, the logical architecture and the SoC interface block solution as opposed to using the application itself.

The port information for the DPE array 202 and the port information for the NoC 208 and the IP cores in the PL 214 may include the logical configuration of the ports, e.g., such as whether each port is a stream data port, a memory mapped port, or a parameter port, and whether the ports are masters or slaves. Other examples of port information for the IP cores include data width of the ports and frequency of operation. Connectivity among the DPE array 202, the NoC 208 and the IP cores in the PL 214 may be specified as logical connections between the ports of the respective hardware resource blocks specified in the logical architecture.

The SoC interface block solution is a data structure or file that specifies a mapping of the connections in and out of the DPE array 202 to the physical data paths (e.g., physical resources) of the SoC interface block 206. For example, the SoC interface block solution maps the particular logical connections used for data transfers in and out of the DPE array 202 to particular stream channels of the SoC interface block 206, e.g., to particular tiles, stream switches, and/or stream switch interfaces (e.g., ports) of the SoC interface block 206. Example 2 located following Example 1 toward the end of the detailed description illustrates an example schema for the SoC interface block solution for the application.

In one aspect, the DPE compiler 1602 is capable of analyzing or simulating data traffic over the NoC 208 based on the application and the logical architecture. The DPE compiler 1602 is capable of providing the data transfer requirements of the software portion of the application, e.g., the "NoC traffic", to NoC compiler 1604. NoC compiler 1604 is capable of generating a routing for the data paths through the NoC 208 based on the NoC traffic received from the DPE compiler 1602. The result from the NoC compiler 1604, shown as the "NoC solution", may be provided to the DPE compiler 1602.

In one aspect, the NoC solution may be an initial NoC solution that specifies only ingress and/or egress points of the NoC 208 to which nodes of the application that connect to the NoC 208 are to be connected. For example, more detailed routing and/or configuration data for the data paths within the NoC 208 (e.g., between ingress and egress points) may be excluded from the NoC solution for purposes of convergence of the compilers. Example 3 located following Example 2 toward the end of the detailed description illustrates an example schema for the NoC solution for the application.

The hardware compiler 1606 is capable of operating on the logical architecture to implement the hardware portion of the application in the PL 214. In the event the hardware compiler 1606 is unable to generate an implementation of the hardware portion of the application (e.g., using the logical architecture) that meets established design constraints (e.g., for timing, power, data throughput, etc.), the hardware compiler 1606 is capable of generating one or more SoC interface block constraints and/or receiving one or more user-specified SoC interface block constraints. The hardware compiler 1606 is capable of providing the SoC interface block constraints to the DPE compiler 1602 as requests. The SoC interface block constraints effectively remap one or more portions of the logical architecture to different stream channels of the SoC interface block 206. The SoC interface block constraints provided from the hardware compiler 1606 are more favorable for the hardware compiler 1606 to generate an implementation of the hardware portion of the application in the PL 214 that meets the design metrics. Example 4 located following Example 3 toward the end of the detailed description illustrates example constraints for the SoC interface block and/or the NoC for the application.

In another aspect, the hardware compiler 1606 is also capable of generating and providing NoC traffic to the NoC compiler 1604 based on the application and the logical architecture. The hardware compiler 1606, for example, may analyze or simulate the hardware portion of the application to determine the data traffic generated by the hardware portion of the design that will be conveyed over the NoC 208 to the PS 212, the DPE array 202, and/or other portions of the SoC 200. The NoC compiler 1604 is capable of generating and/or updating the NoC solution based on the information received from the hardware compiler 1606. The NoC compiler 1604 is capable of providing the NoC solution or an updated version thereof to the hardware compiler 1606 and also to the DPE compiler 1602. In this regard, the DPE compiler 1602 is capable of updating the SoC interface block solution and providing the updated solution to the hardware compiler 1606 in response to receiving a NoC solution or an updated NoC solution from NoC compiler 1604 and/or in response to receiving one or more SoC interface block constraints from the hardware compiler 1606. The DPE compiler 1602 generates the updated SoC interface block solution based on the SoC interface block constraint(s) received from the hardware compiler 1606 and/or from the updated NoC solution from NoC compiler 1604.

It should be appreciated that the data flows among the compilers shown in the example of FIG. 16 are for purposes of illustration only. In this regard, the exchange of information among the compilers may be performed at various stages of the example design flows described within this disclosure. In other aspects, the exchange of design data among the compilers may be performed in an iterative manner so that each compiler may continually refine the implementation of the part of the application handled by that compiler based on received information from the other compilers to converge to a solution.

In one particular example, the hardware compiler 1606, after receiving the logical architecture and the SoC interface block solution from the DPE compiler 1602 and the NoC solution from the NoC compiler 1604, may determine that generating an implementation of the hardware portion of the application that meets established design metrics is not possible. The initial SoC interface block solution generated by the DPE compiler 1602 is generated based on the DPE compiler's 1602 knowledge of the portion of the application to be implemented in the DPE array 202. Likewise, the initial NoC solution generated by the NoC compiler 1604 is generated based on the initial NoC traffic provided by the DPE compiler 1602 to the NoC compiler 1604. Example 5 located following Example 4 toward the end of the detailed description illustrates an example schema for the NoC traffic for the application. It should be appreciated that while schemas are used in Examples 1-5, other formatting and/or data structures may be used to specify the information illustrated.

The hardware compiler 1606 attempts to perform an implementation flow on the hardware portion of the application including synthesis (if required), placement, and routing the hardware portion. As such, the initial SoC interface block solution and the initial NoC solution may result in a placement and/or routes within the PL 214 that do not meet established timing constraints. In other cases, the SoC interface block solution and the NoC solution may not have a sufficient number of physical resources such as wires to accommodate the data that must be conveyed resulting in congestion in the PL 214. In such cases, the hardware compiler 1606 is capable of generating one or more different SoC interface block constraints and/or receiving one or more user-specified SoC interface block constraints and providing the SoC interface block constraints to the DPE compiler 1602 as a request for regenerating the SoC interface block solution. Likewise, the hardware compiler 1606 is capable of generating one or more different NoC constraints and/or receiving one or more user-specified NoC constraints and providing the NoC constraints to the NoC compiler 1604 as a request for regenerating the NoC solution. In this manner, the hardware compiler 1606 invokes the DPE compiler 1602 and/or the NoC compiler 1604.

The DPE compiler 1602 is capable of taking the received SoC interface block constraints from the hardware compiler 1606 and updating the SoC interface block solution using the received SoC interface block constraints, if possible, and providing the updated SoC interface block solution back to the hardware compiler 1606. Similarly, the NoC compiler 1604 is capable of taking the received NoC constraints from the hardware compiler 1606 and updating the NoC solution using the received NoC constraints, if possible, and providing the updated NoC solution back to the hardware compiler 1606. The hardware compiler 1606 may then continue the implementation flow to generate the hardware portion of the application for implementation within the PL 214 using the updated SoC interface block solution received from the DPE compiler 1602 and the updated NoC solution received from the NoC compiler 1604.

In an aspect, the hardware compiler 1606 invoking the DPE compiler 1602 and/or the NoC compiler 1604 by providing one or more SoC interface block constraints and one or more NoC constraints respectively may be part of a validation process. The hardware compiler 1606, for example, is seeking validation from the DPE compiler 1602 and/or the NoC compiler 1604 that the SoC interface block constraints and the NoC constraints provided from the hardware compiler 1606 can be used or integrated into a routable SoC interface block solution and/or NoC solution.

Figure 17A:
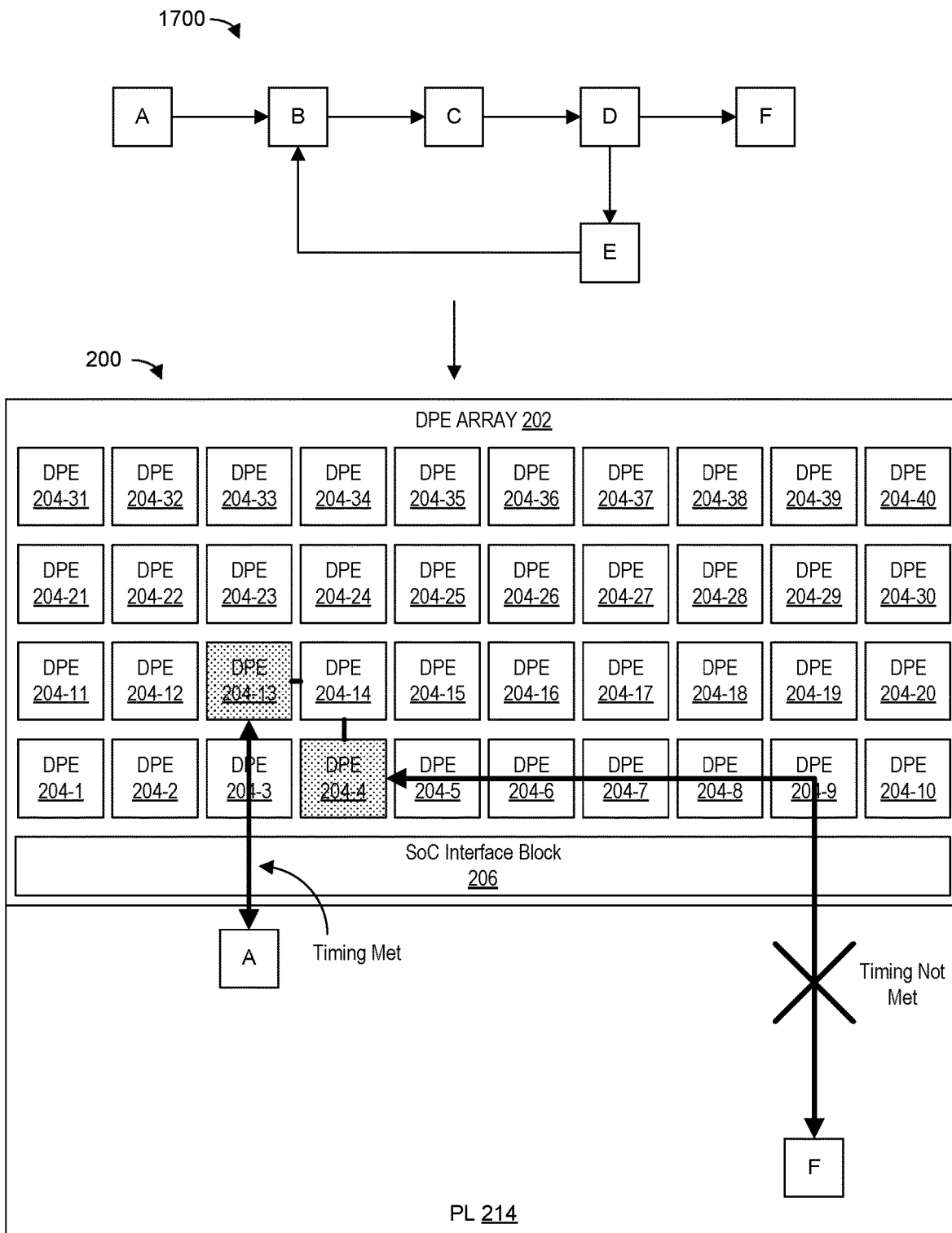
FIGS. 17A and 17B illustrate an example of an application mapped onto an SoC using a system as described in connection with FIG. 1.

FIG. 17A illustrates an example of an application 1700 mapped onto an SoC 200 using a system as described in connection with FIG. 1. For purposes of illustration, only a subset of the different subsystems of the SoC 200 are shown. Application 1700 includes nodes A, B, C, D, E, and F having the connectivity shown. Example 6 below illustrates example source code that may be used to specify application 1700.

Example 6

```
using namespace cardano; // class library with graph
        building primitives
class radio:cardano::graph {// an example graph class
public:
    input_port in;
    output_port out;
    kernel a,b,c,d,e,f;
    radio( ) {// graph constructor
        a=kernel::create(polarclip);
        b=kernel::create(feedback);
        c=kernel::create(equalizer);
        d=kernel::create(fir_tap11);
        e=kernel::create(fir_tap7);
        f=kernel::create(scale);
        fabric<fpga>(a); fabric<fpga>(f);
        runtime<ratio>(b)=0.6; runtime<ratio>(c)=0.2;
        runtime<ratio>(d)=0.8; runtime<ratio>(e)=0.1;
        connect<stream, window<64,8> > (a.out[0], b.in
            [0]);
        connect<window<32> > (b.out[0], c.in[0]);
        connect<window<32, 24> > (c.out[0], d.in[0]);
        connect<window<32, 16> > (d.out[1], e.in[0]);
        connect<window<32, 8> > (e.out[0], async(b.in
            [1]));
        connect<window<16>, stream> (d.out[0], f.in[0]);
        connect<stream> (in, a.in[0]);
        connect<stream> (f.out[0], out);
    }
}
radio mygraph; //top level testbench
simulation::platform<1, 1> platform("in.txt", "out.txt");
connect< > net0(platform.src[0], mygraph.in);
connect< > net1(platform.sink[0], mygraph.out);
int main(void) {/control program for PS
    mygraph.init( );
    mygraph.run( );
    mygraph.end( );
    return 0;
}
```

In one aspect, application 1700 is specified as a data flow graph that includes a plurality of nodes. Each node represents a computation, which corresponds to a function as opposed to a single instruction. The nodes are interconnected by edges that represent data flows. The hardware implementation of a node may only execute in response to receiving data from each of the inputs to that node. Nodes generally execute in a non-blocking manner. The data flow graph specified by application 1700 represents a parallel specification to be implemented in the SoC 200 as opposed to a sequential program. The system is capable of operating on application 1700 (e.g., in graph form as illustrated in Example 1) to map the various nodes to the appropriate subsystems of the SoC 200 for implementation therein.

In one example, application 1700 is specified in a high-level programming language (HLL) such as C and/or C++. As noted, though specified in an HLL, which is conventionally used to create sequential programs, application 1700, being a data flow graph, is a parallel specification. The system is capable of providing a class library that is used to build data flow graphs and, as such, application 1700. The data flow graph is defined by the user and compiled onto the architecture of the SoC 200. The class library may be implemented as a helper library with pre-defined classes and constructors for graphs, nodes, and edges that can be used to build application 1700. Application 1700 effectively executes on the SoC 200 and includes delegated objects that execute in the PS 212 of the SoC 200. The objects of application 1700 that execute in the PS 212 may be used to direct and monitor actual computations that are running on the SoC 200, e.g., in the PL 214, in the DPE array 202, and/or in hardwired circuit blocks 210.

In accordance with the inventive arrangements described within this disclosure, accelerators (e.g., PL nodes) may be represented as objects in the data flow graph (e.g., application). The system is capable of automatically synthesizing the PL nodes and connecting the synthesized PL nodes for implementation in the PL 214. By comparison, in conventional EDA systems, users specify applications for hardware acceleration that utilize sequential semantics. The function that is hardware accelerated is specified through a function call. The interface to the hardware accelerated function (e.g., the PL node in this example) is defined by the function call and the various arguments provided in the function call as opposed to the connections on the data flow graph.

As illustrated in the source code of Example 6, nodes A and F are designated for implementation in the PL 214, while nodes B, C, D, and E are designated for implementation within the DPE array 202. Connectivity of the nodes is specified by the data transfer edges in the source code. The source code of Example 6 also specifies a top level testbench and a control program that is executed in the PS 212.

Returning to FIG. 17A, application 1700 is mapped onto the SoC 200. SoC 200. As pictured, nodes A and F are mapped onto the PL 214. The shaded DPEs 204-13 and 204-14 represent the DPEs 204 onto which nodes B, C, D, and E are mapped. For example, nodes B and C are mapped onto DPE 204-13, while nodes D and E are mapped onto DPE 204-4. Nodes A and F are implemented in the PL 214 and are connected to DPE 204-13 and 204-44 via routing through the PL 214, particular tiles and switches of the SoC interface block 206, switches in the DPE interconnect of intervening DPEs 204, and using particular memories of selected neighboring DPEs 204.

The binary generated for DPE 204-13 includes the necessary object code for DPE 204-13 to implement the computations corresponding to nodes B and C and configuration data to establish data paths between DPE 204-13 and DPE 204-14 and between DPE 204-13 and DPE 204-3. The binary generated for DPE 204-4 includes the necessary object code for DPE 204-4 to implement the computations corresponding to nodes D and E and configuration data to establish data paths with DPE 204-14 and DPE 204-5.

Other binaries are generated for other DPEs 204 such as DPE 204-3, 204-5, 204-6, 204-7, 204-8, and 204-9 to connect DPEs 204-13 and DPE 204-4 to the SoC interface block 206. Appreciably, such binaries will include any object code should such other DPEs 204 implement other computations (have nodes of the application assigned thereto).

In this example, the hardware compiler 1606 is unable to generate an implementation of the hardware portion that meets timing constraints due to the long route connecting DPE 204-14 and node F. Within this disclosure, a particular state of the implementation of the hardware portion of the application may be referred to as a state of a hardware design, where the hardware design is generated and/or updated throughout an implementation flow. The SoC interface block solution, for example, may allocate the signal crossing for node F to the tile of the SoC interface block below DPE 204-9. In that case, the hardware compiler 1606 is capable of providing a requested SoC interface block constraint to the DPE compiler 1602 requesting that the crossing through the SoC interface block 206 for node F be moved closer to DPE 204-4. For example, the requested SoC interface block constraint from the hardware compiler 1606 may request that the logical connections for DPE 204-4 be mapped to a tile immediately below DPE 204-4 within the SoC interface block 206. This remapping would allow the hardware compiler to place node F much closer to DPE 204-4 to improve timing.

Figure 17B:
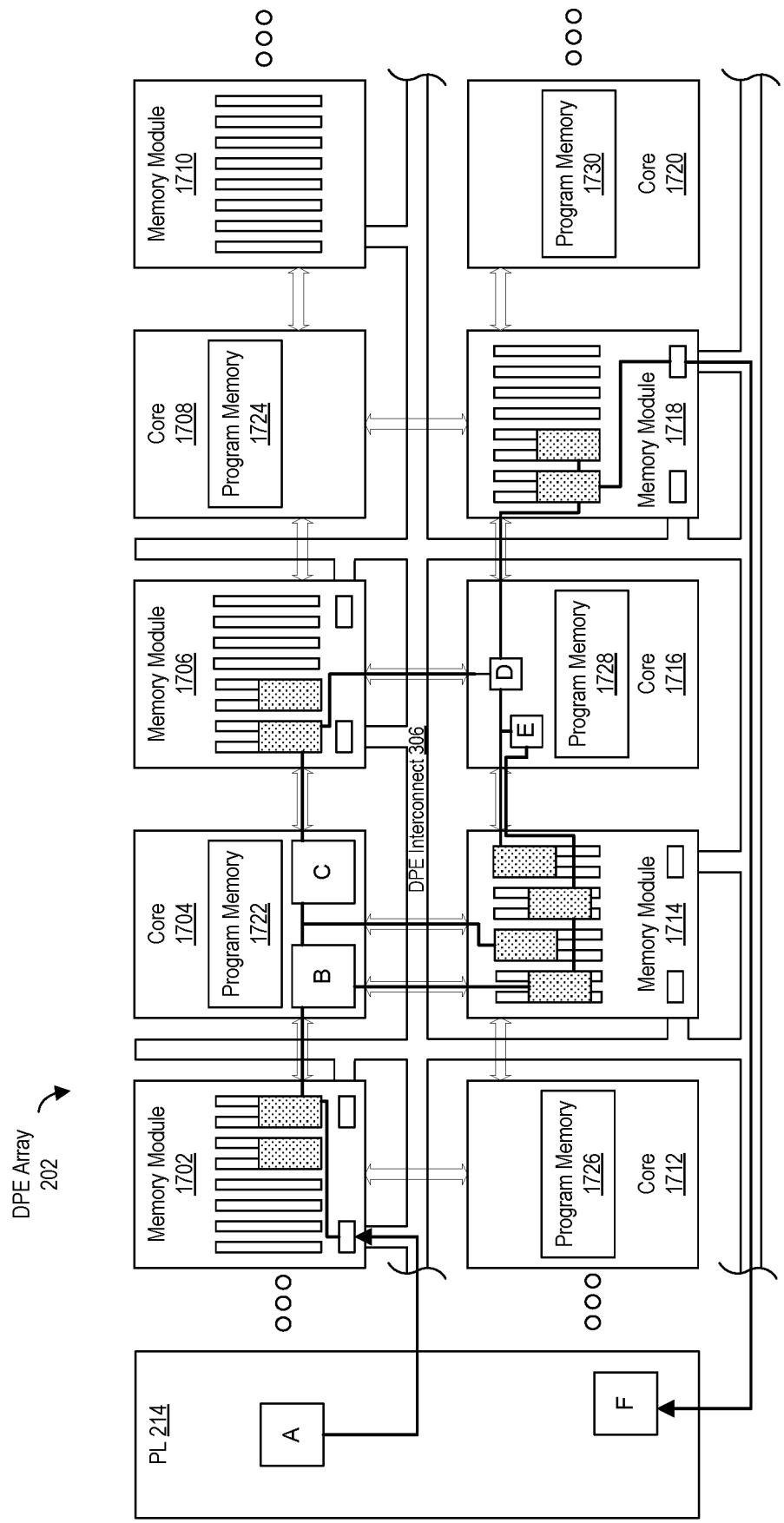

FIG. 17B illustrates another example mapping of application 1700 onto SoC 200. FIG. 17B illustrates an alternative and more detailed example than illustrated in FIG. 17A. FIG. 17B, for example, illustrates the mapping of nodes of application 1700 to particular DPEs 204 of the DPE array 202, connectivity established between the DPEs 204 to which nodes of application 1700 are mapped, the allocation of memory in memory modules of DPEs 204 to nodes of application 1700, mapping of data transfers to memory and core interfaces (e.g., 428, 430, 432, 434, 402, 404, 406, and 408) of DPEs 204 (represented with dual headed arrows) and/or to stream switches in the DPE interconnect 306, as performed by the DPE compiler 1602.

In the example of FIG. 17B, memory modules 1702, 1706, 1710, 1714, and 1718 are shown along with cores 1704, 1708, 1712, 1716, and 1720. Cores 1704, 1708, 1712, 1716, and 1720 include program memories 1722, 1724, 1726, 1728, and 1730, respectively. In the upper row, core 1704 and memory module 1706 form a DPE 204, while core 1708 and memory module 1710 form another DPE 204. In the lower row, memory module 1714 and core 1716 form a DPE 204, while memory module 1718 and core 1720 for another DPE 204.

As illustrated, nodes A and F are mapped to the PL 214. Node A is connected to memory banks (e.g., shaded portions of memory banks) in memory module 1702 by way of stream switches and an arbiter in memory module 1702. Nodes B and C are mapped to core 1704. Instructions for implementing nodes B and C are stored in program memory 1722. Nodes D and E are mapped to core 1716, with instructions for implementing nodes D and E stored in program memory 1728. Node B is allocated and accesses the shaded portions of memory banks in memory module 1702 via the core-memory interfaces, while node C is allocated and accesses the shaded portions of memory banks in memory module 1706 via the core-memory interfaces. Nodes B, C, and E are allocated and capable of accessing the shaded portions of memory banks in memory module 1714 via the core-memory interfaces. Node D is capable of accessing the shaded portions of memory banks in memory module 1718 via the core-memory interfaces. Node F is connected to memory module 1718 via an arbiter and stream switches.

FIG. 17B illustrates that connectivity between nodes of the application may be implemented using memory and/or core interfaces sharing memories among cores and using the DPE interconnect 306.

Figure 18:
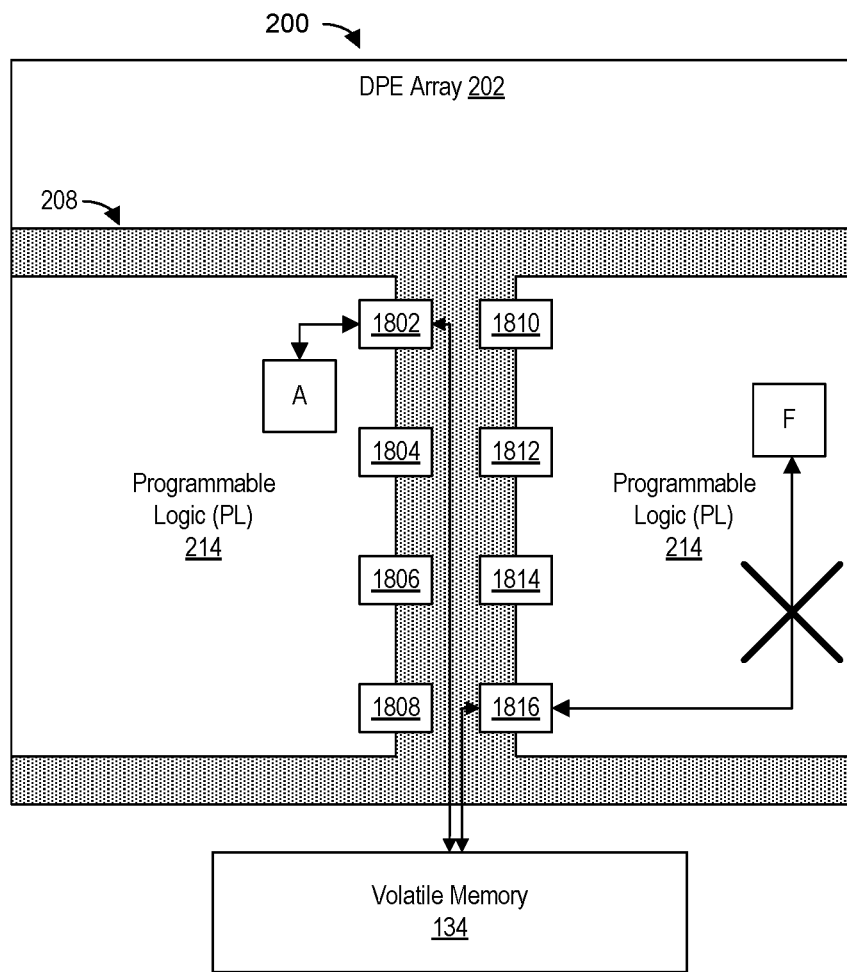
FIG. 18 illustrates an example implementation of another application that has been mapped onto an SoC.

FIG. 18 illustrates an example implementation of another application that has been mapped onto the SoC 200. For purposes of illustration, only a subset of the different subsystems of the SoC 200 are shown. In this example, connections to nodes A and F, each being implemented in the PL 214, are routed through the NoC 208. The NoC 208 includes ingress/egress points 1802, 1804, 1806, 1808, 1810, 1812, 1814, and 1816 (e.g., NMUs/NSUs). The example of FIG. 18 illustrates the case where node A is placed relatively close to ingress/egress point 1802, while node F, which accesses volatile memory 134, has a long route through the PL 214 to reach the ingress/egress point 1816. If the hardware compiler 1606 is unable to place node F closer to the ingress/egress point 1816, the hardware compiler 1606 may request an updated NoC solution from the NoC compiler 1604. In that case, the hardware compiler 1606 is capable of invoking the NoC compiler 1604 with a NoC constraint to generate an updated NoC solution specifying a different ingress/egress point for node F, e.g. the ingress/egress point 1812. A different ingress/egress point for node F would allow the hardware compiler 1606 to place node F closer to the newly designated ingress/egress point specified in the updated NoC solution and take advantage of the faster data paths available in the NoC 208.

Figure 19:
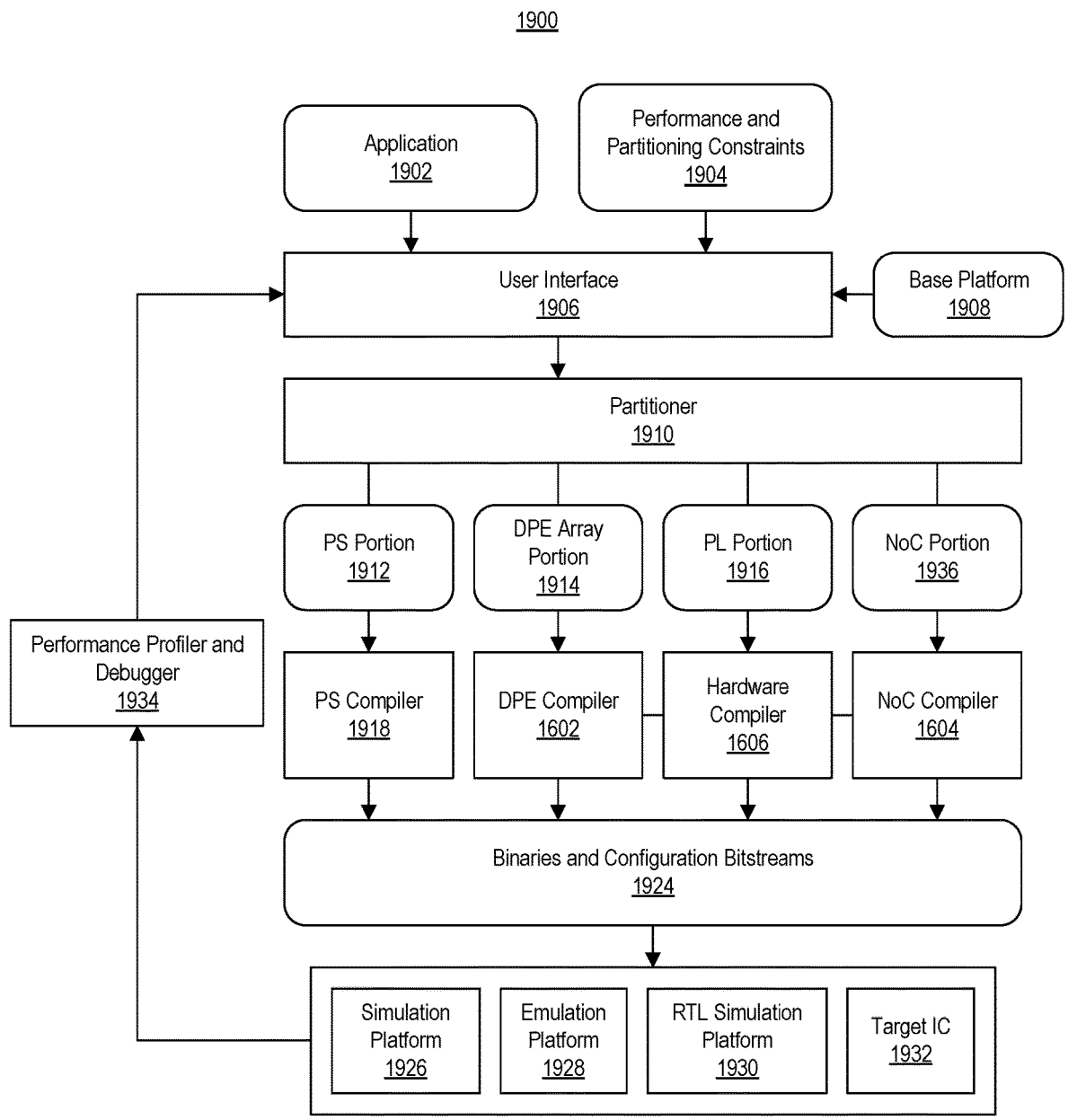
FIG. 19 illustrates another example software architecture executable by the system described in connection with FIG. 1.

FIG. 19 illustrates another example software architecture 1900 executable by the system described in connection with FIG. 1. For example, architecture 1900 may be implemented as one or more of the program modules 120 of FIG. 1. In the example of FIG. 19, application 1902 is intended for implementation within SoC 200.

In the example of FIG. 19, a user is capable of interacting with a user interface 1906 provided by the system. In interacting with user interface 1906, the user may specify or provide an application 1902, performance and partitioning constraints 1904 for application 1902, and a base platform 1908.

Application 1902 may include a plurality of different portions each corresponding to a different subsystem available in the SoC 200. Application 1902 may be specified as described in connection with Example 6, for example. Application 1902 includes a software portion that is to be implemented in the DPE array 202 and a hardware portion that is to be implemented in the PL 214. Application 1902 may optionally include an additional software portion that is to be implemented in the PS 212 and a portion that is to be implemented in the NoC 208.

The partitioning constraints (of the performance and partitioning constraints 1904) optionally specify the location or subsystem in which the various nodes of application 1902 are to be implemented. For example, partitioning constraints may indicate, on a per node basis for application 1902, whether the node is to be implemented in the DPE array 202 or in the PL 214. In other examples, location constraints are capable of providing more specific or detailed information to DPE compiler 1602 to perform mapping of kernels to DPE's, networks or data flows to stream switches, and buffers to the memory modules and/or banks of memory modules of DPEs.

As an illustrative example, implementation of an application may require specific mapping. For instance, in an application where multiple copies of a kernel are to be implemented in the DPE array and each copy of the kernel operates on a different data set concurrently, it is preferable to have the data sets be located at the same relative address (location in memory) for every copy of the kernel executing in a different DPE of the DPE array. This may be accomplished using a location constraint. If this condition is not upheld by the DPE compiler 1602, each copy of the kernel must be programmed separately or independently rather than replicating the same programming across a plurality of different DPEs in the DPE array.

Another illustrative example is placing a location constraint on an application that utilizes the cascade interfaces among DPEs. Since the cascade interfaces flow in one direction in each row, it may be preferable to have the start of a chain of DPEs coupled using the cascade interfaces not begin in a DPE having a missing cascade interface (e.g., a corner DPE) or in a position that cannot be easily replicated elsewhere in the DPE array (e.g., the last DPE in a row). The location constraint can force the start of the chain of DPEs of the application to begin at a particular DPE.

The performance constraints (of the performance and partitioning constraints 1904) may specify various metrics such as power requirements, latency requirements, timing, and/or data throughput to be achieved by the implementation of the node whether in the DPE array 202 or in the PL 214.

Base platform 1908 is a description of the infrastructure circuitry that is to be implemented in the SoC 200 that interacts with and/or connects to the circuitry on the circuit board on which the SoC 200 is coupled. The base platform 1908 may be synthesizable. Base platform 1908, for example, specifies the circuitry that is to be implemented within the SoC 200 that receives signals from outside of the SoC 200 (e.g., external to the SoC 200) and provides signals to systems and/or circuitry outside of the SoC 200. As an example, base platform 1908 may specify circuit resources such as a Peripheral Component Interconnect Express (PCIe) node for communicating with the host system 102 and/or computing node 100 of FIG. 1, a memory controller or controllers for accessing volatile memory 134 and/or non-volatile memory 136, and/or other resources such as internal interfaces coupling the DPE array 202 and/or the PL 214 with the PCIe node. The circuitry specified by base platform 1908 is available for any application that may be implemented in the SoC 200 given a particular type of circuit board. In this regard, base platform 1908 is specific to the particular circuit board to which the SoC 200 is coupled.

In one example, partitioner 1910 is capable of separating out the different portions of application 1902 based on the subsystem of SoC 200 in which each portion of application 1902 is to be implemented. In an example implementation, partitioner 1910 is implemented as a user directed tool where the user provides input indicating which of the different portions (e.g., nodes) of application 1902 corresponds to each of the different subsystems of the SoC 200. The input provided, for example, may be the performance and partitioning constraints 1904. For purposes of illustration, partitioner 1910 partitions application 1902 into a PS portion 1912 that is to execute on the PS 212, a DPE array portion 1914 that is to execute on the DPE array 202, a PL portion 1916 that is to be implemented in the PL 214, and a NoC portion 1936 that is implemented in the NoC 208. In one aspect, the partitioner 1910 is capable of generating each of the PS portion 1912, the DPE array portion 1914, the PL portion 1916, and the NoC portion 1936 as separate files or separate data structures.

As pictured, each of the different portions corresponding to different subsystems is processed by a different compiler that is subsystem specific. For example, PS compiler 1918 is capable of compiling PS portion 1912 to generate one or more binaries that include object code executable by the PS 212. DPE compiler 1602 is capable of compiling DPE array portion 1914 to generate one or more binaries that include object code executable by different DPEs 204, application data, and/or configuration data. Hardware compiler 1606 is capable of performing an implementation flow on PL portion 1916 to generate a configuration bitstream that can be loaded into the SoC 200 to implement PL portion 1916 in the PL 214. As defined herein, the term "implementation flow" means a process in which place and route and optionally synthesis are performed. The NoC compiler 1604 is capable of generating a binary specifying configuration data for the NoC 208 that, when loaded into the NoC 208, creates data paths therein connecting the various masters and slaves of the application 1902. These different outputs generated by compilers 1918, 1602, 1604, and/or 1606 are illustrated as binaries and configuration bitstreams 1924.

In particular implementations, certain ones of compilers 1918, 1602, 1604, and/or 1606 are capable of communicating with one another during operation. By communicating at various stages during the design flow operating on application 1902, compilers 1918, 1602, 1604, and/or 1606 are capable of converging to a solution. In the example of FIG. 19, DPE compiler 1602 and hardware compiler 1606 are capable of communicating during operation while compiling portions 1914 and 1916, respectively, of application 1902. The hardware compiler 1606 and NoC compiler 1604 are capable of communicating during operation while compiling portions 1916 and 1936, respectively, of application 1902. The DPE compiler 1602 may also invoke the NoC compiler 1604 for obtaining a NoC routing solution and/or an updated NoC routing solution.

The resulting binaries and configuration bitstreams 1924 may be provided to any of a variety of different targets. For example, the resulting binaries and configuration bitstream(s) 1924 may be provided to a simulation platform 1926, a hardware emulation platform 1928, an RTL simulation platform 1930, and/or to the target IC 1932. In the case of the RTL simulation platform 1930, hardware compiler 1922 may be configured to output RTL for the PL portion 1916 that may be simulated in RTL simulation platform 1930.

Results obtained from the simulation platform 1926, the emulation platform 1928, the RTL simulation platform 1930, and/or from implementation of application 1902 in target IC 1932 may be provided to performance profiler and debugger 1934. Results from performance profiler and debugger 1934 may be provided to user interface 1906, where the user may view the results of executing and/or simulating application 1902.

FIG. 20 illustrates an example method 2000 of performing a design flow to implement an application in the SoC 200. Method 2000 may be performed by a system as described in connection with FIG. 1. The system may execute a software architecture as described in connection with FIG. 16 or FIG. 19.

In block 2002, the system receives an application. The application may specify a software portion for implementation within the DPE array 202 of SoC 200 and a hardware portion for implementation within the PL 214 of the SoC 200.

In block 2004, the system is capable of generating a logical architecture for the application. For example, the DPE compiler 1602, as executed by the system, is capable of generating the logical architecture based on the software portion of the application to be implemented in the DPE array 202 and any high-level, user-specified metrics. The DPE compiler 1602 is also capable of generating an SoC interface block solution specifying a mapping of the connections in and out of the DPE array 202 to the physical data paths of the SoC interface block 206.

In another aspect, in generating the logical architecture and the SoC interface block solution, the DPE compiler 1602 is capable of generating an initial mapping of nodes of the application to be implemented in the DPE array 202 (referred to as "DPE nodes") to particular DPEs 204. The DPE compiler 1602 optionally generates an initial mapping and routing of the global memory data structures of the application to global memory (e.g., volatile memory 134) by providing the NoC traffic for the global memory to the NoC compiler 1604. As discussed, the NoC compiler 1604 is capable of generating a NoC solution from the received NoC traffic. Using the initial mappings and routings, the DPE compiler 1602 is capable of simulating the DPE portion to validate the initial implementation of the DPE portion. The DPE compiler 1602 is capable of outputting the data generated by the simulation to the hardware compiler 1606 corresponding to each stream channel used in the SoC interface block solution.

In one aspect, generating the logical architecture, as performed by the DPE compiler 1602, implements the partitioning previously described in connection with FIG. 19. The various example schemas illustrate how the different compilers (DPE compiler 1602, hardware compiler 1606, and the NoC compiler 1604) in FIG. 19 exchange decisions and constraints while compiling the portion of the application that is allocated to each respective compiler. The various example schemas further illustrate how the decisions and/or constraints are logically across the different subsystems of the SoC 200.

In block 2006, the system is capable of building a block diagram of the hardware portion. For example, the hardware compiler 1606, as executed by the system, is capable of generating a block diagram. The block diagram incorporates the hardware portion of the application, as specified by the logical architecture, with the base platform for the SoC 200. For example, the hardware compiler 1606 is capable of connecting the hardware portion and the base platform in generating the block diagram. Further, the hardware compiler 1606 is capable of generating the block diagram to connect IP cores corresponding to the hardware portion of the application to the SoC interface block based on the SoC interface block solution.

For example, each node in the hardware portion of the application, as specified by the logical architecture, may be mapped to a particular RTL core (e.g., a user-provided or specified portion of custom RTL) or an available IP core. With the mappings of the nodes to cores being specified by the user, the hardware compiler 1606 is capable of building the block diagram to specify the various circuit blocks of the base platform, any IP cores of the PL 214 needed to interface with the DPE array 202 per the logical architecture, and/or any additional user specified IP cores and/or RTL cores that are to be implemented in the PL 214. Examples of the additional IP cores and/or RTL cores that may be manually inserted by the user include, but are not limited to, datawidth conversion blocks, hardware buffers, and/or clock domain logic. In one aspect, each block of the block diagram can correspond to a particular core (e.g., circuit block) that is to be implemented in the PL 214. The block diagram specifies the connectivity of the cores to be implemented in the PL and connectivity of the cores with physical resources of the NoC 208 and/or the SoC interface block 206 as determined from the SoC interface block solution and the logical architecture.

In one aspect, the hardware compiler 1606 is also capable of creating logical connections between the cores of the PL 214 and the global memory (e.g., volatile memory 134) by creating NoC traffic as per the logical architecture and executing the NoC compiler 1604 to obtain the NoC solution. In one example, the hardware compiler 1606 is capable of routing the logical connections to validate the capacity of the PL 214 to implement the block diagram and the logical connections. In another aspect, the hardware compiler 1606 is capable of using SoC interface block traces (e.g., described below in greater detail) with one or more data traffic generators as part of a simulation to validate the functionality of the block diagram with actual data traffic.

In block 2008, the system performs an implementation flow on the block diagram. For example, the hardware compiler is capable of performing an implementation flow involving synthesis if needed, placement, and routing on the block diagram to generate a configuration bitstream that may be loaded into the SoC 200 to implement the hardware portion of the application in the PL 214.

The hardware compiler 1606 is capable of performing the implementation flow on the block diagram using the SoC interface block solution and the NoC solution. For example, since the SoC interface block solution specifies particular stream channels of the SoC interface block 206 over which particular DPEs 204 communicate with the PL 214, the placer is capable of placing blocks of the block diagram that have connections to the DPEs 204 through the SoC interface block 206 close (e.g., within a particular distance) to the particular stream channels of the SoC interface block 206 to which the blocks are to connect. The ports of the blocks, for example, may be correlated with the stream channels specified by the SoC interface block solution. The hardware compiler 1606 is also capable of routing connections between the ports of blocks of the block diagram that connect to the SoC interface block 206 by routing signals input to and/or output from the ports to the BLIs of the PL 214 that connect to the particular stream channel(s) coupled to the ports as determined from the SoC interface block solution.

Similarly, since the NoC solution specifies particular ingress/egress points to which circuit blocks in the PL 214 are to connect, the placer is capable of placing blocks of the block diagram that have connections to the NoC 208 close (e.g., within a particular distance) to the particular ingress/egress points to which the blocks are to connect. The ports of the blocks, for example, may be correlated with the ingress/egress points of the NoC solution. The hardware compiler 1606 is also capable of routing connections between the ports of blocks of the block diagram that connect to ingress/egress points of the NoC 208 by routing signals input to and/or output from the ports to the ingress/egress points of the NoC 208 logically coupled to the ports as determined from the NoC solution. The hardware compiler 1606 is further capable of routing any signals that connect ports of blocks in the PL 214 to one another. In some applications, however, the NoC 208 may not be used to convey data between the DPE array 202 and the PL 214.

In block 2010, during the implementation flow, the hardware compiler optionally exchanges design data with the DPE compiler 1602 and/or the NoC compiler 1604. For example, the hardware compiler 1606, the DPE compiler 1602, and the NoC compiler 1604 are capable of exchanging design data as described in connection with FIG. 16 on a one-time basis, as needed, or on an iterative or repeated basis. Block 2010 may be optionally performed. The hardware compiler 1606 is capable of exchanging design data with the DPE compiler 1602 and/or the NoC compiler 1604 prior to, or during, building of the block diagram, prior to and/or during placement, and/or prior to and/or during routing, for example.

In block 2012, the system exports the final hardware design generated by the hardware compiler 1606 as a hardware package. The hardware package contains the configuration bitstream used to program the PL 214. The hardware package is generated according to the hardware portion of the application.

In block 2014, the user configures a new platform using the hardware package. The user initiates generation of the new platform based on the user-provided configuration. The platform, as generated by the system using the hardware package, is used to compile the software portion of the application.

In block 2016, the system compiles the software portion of the application for implementation in the DPE array 202. For example, the system executes the DPE compiler 1602 to generate one or more binaries that may be loaded into the various DPEs 204 of the DPE array 202. The binaries for the DPEs 204 can include the object code, application data, and the configuration data for the DPEs 204. Once the configuration bitstream and binaries are generated, the system is capable of loading the configuration bitstream and binaries into the SoC 200 to implement the application therein.

In another aspect, the hardware compiler 1606 is capable of providing the hardware implementation to the DPE compiler 1602. The DPE compiler 1602 is capable of extracting the final SoC interface block solution that was relied on by the hardware compiler 1606 in performing the implementation flow. The DPE compiler 1602 performs the compilation using the same SoC interface block solution used by the hardware compiler 1606.

In the example of FIG. 20, each portion of the application is solved by a subsystem-specific compiler. The compilers are capable of communicating design data, e.g., constraints and/or proposed solutions, to ensure that interfaces between the various subsystems (e.g., the SoC interface block), as implemented for the application, are compliant and consistent. Though not specifically shown in FIG. 20, the NoC compiler 1604 may also be invoked to generate a binary for programming the NoC 208 if used in the application.

Figure 21:
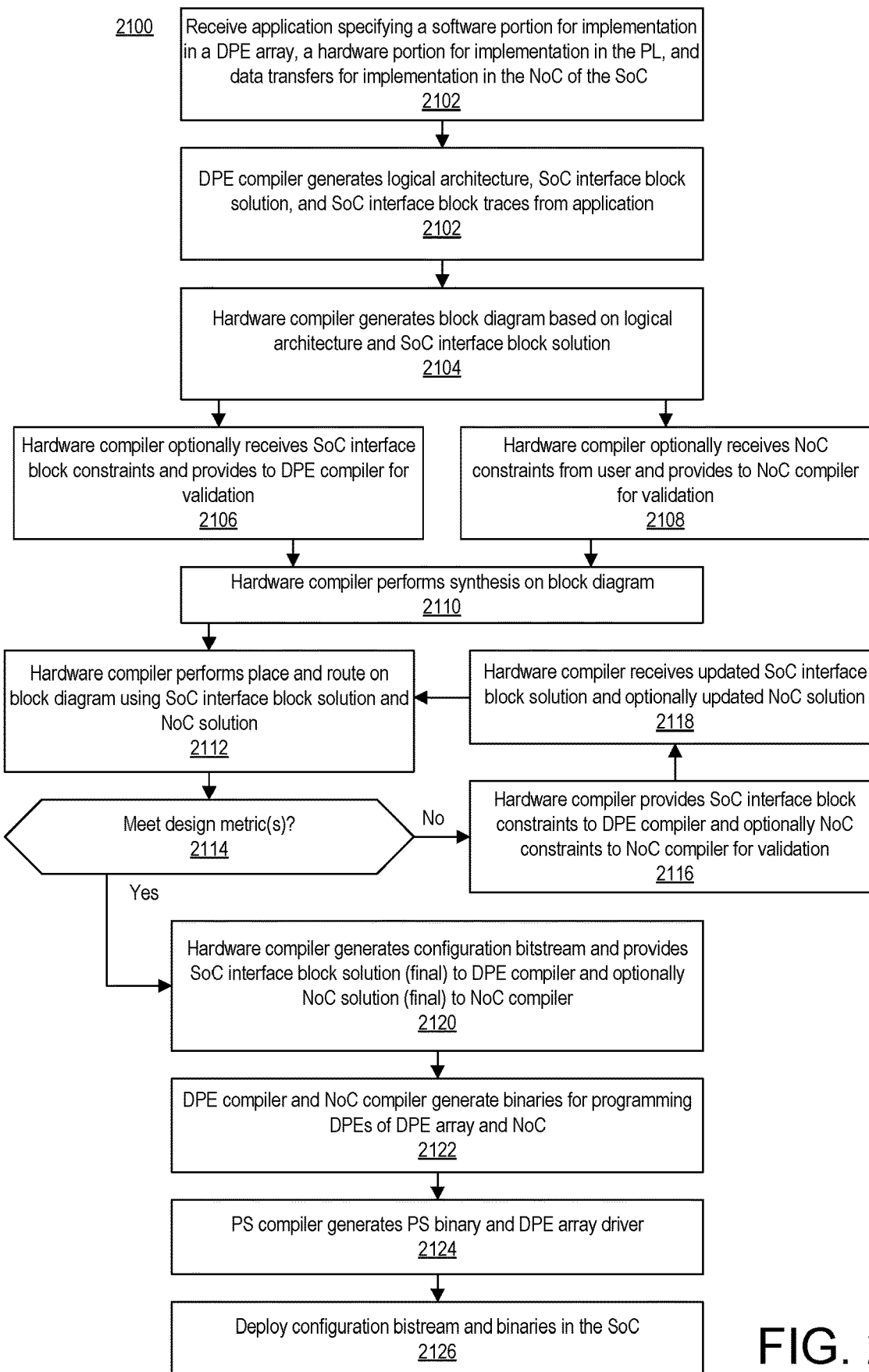
FIG. 21 illustrates another example method of performing a design flow to implement an application in an SoC.

FIG. 21 illustrates another example method 2100 of performing a design flow to implement an application in the SoC 200. Method 2100 may be performed by a system as described in connection with FIG. 1. The system may execute a software architecture as described in connection with FIG. 16 or FIG. 19. Method 2100 may begin in block 2102 where the system receives an application. The application may be specified as a data flow graph to be implemented in the SoC 200. The application may include a software portion for implementation in the DPE array 202, a hardware portion for implementation in the PL 214, and data transfers for implementation in the NoC 208 of the SoC 200. The application may also include a further software portion for implementation in the PS 212.

In block 2104, the DPE compiler 1602 is capable of generating a logical architecture, an SoC interface block solution, and SoC interface block traces from the application. The logical architecture may be based on the DPEs 204 required to implement the software portion of the application designated for implementation within the DPE array 202 and any IP cores to be implemented in the PL 214 needed to interface with the DPEs 204. As noted, the DPE compiler 1602 is capable of generating an initial DPE solution in which the DPE compiler 1602 performs an initial mapping of nodes (of the software portion of the application) to the DPE array 202. The DPE compiler 1602 is capable of generating an initial SoC interface block solution that maps the logical resources to physical resources (e.g., stream channels) of the SoC interface block 206. In one aspect, the SoC interface block solution may be generated using an initial NoC solution generated by the NoC compiler 1604 from the data transfers. The DPE compiler 1602 is further capable of simulating the initial DPE solution with the SoC interface block solution to simulate data flows through the SoC interface block 206. The DPE compiler 1602 is capable of capturing the data transfers through the SoC interface block during the simulation as "SoC interface block traces" for subsequent use during the design flow illustrated in FIG. 21.

In block 2104, the hardware compiler 1606 generates a block diagram of the hardware portion of the application to be implemented in the PL 214. The hardware compiler 1606 generates the block diagram based on the logical architecture and the SoC interface block solution and, optionally, additional IP cores specified by the user that are to be included in the block diagram with the circuit blocks specified by the logical architecture. In one aspect, the user manually inserts such additional IP cores and connects the IP cores to the other circuit blocks of the hardware description specified in the logical architecture.

In block 2106, the hardware compiler 1606 optionally receives one or more user-specified SoC interface block constraints and provides the SoC interface block constraints to the DPE compiler 1602.

In one aspect, prior to implementing the hardware portion of the application, the hardware compiler 1606 is capable of evaluating the physical connections defined between the NoC 208, the DPE array 202, and the PL 214 based on the block diagram and the logical architecture. The hardware compiler 1606 is capable of performing an architecture simulation of the block diagram to evaluate the connections between the block diagram (e.g., PL portion of the design) and the DPE array 202 and/or the NoC 208. For example, the hardware compiler 1606 is capable of performing a simulation using the SoC interface block traces generated by the DPE compiler 1602. As an illustrative and non-limiting example, the hardware compiler 1606 is capable of performing a SystemC simulation of the block diagram. In the simulation, data traffic is generated for the block diagram and for the stream channels (e.g., physical connections) between the PL 214 and the DPE array 202 (by way of the SoC interface block 206) and/or the NoC 208 using the SoC interface block traces. The simulation generates system performance and/or debugging information that is provided to the hardware compiler 1606.

The hardware compiler 1606 is capable of evaluating the system performance data. If, for example, the hardware compiler 1606 determines, from the system performance data, that one or more design metrics for the hardware portion of the application are not met, the hardware compiler 1606 is capable of generating one or more SoC interface block constraints under the direction of the user. The hardware compiler 1606 provides the SoC interface block constraints as a request to the DPE compiler 1602.

The DPE compiler 1602 is capable of performing an updated mapping of the DPE portion of the application to DPEs 204 of the DPE array 202 that utilizes the SoC interface block constraints provided by the hardware compiler 1606. If, for example, the application is implemented where the hardware portion in the PL 214 connects to the DPE array 202 directly through the SoC interface block 206 (e.g., without traversing through the NoC 208), the DPE compiler 1602 may generate an updated SoC interface block solution for the hardware compiler 1606 without involving the NoC compiler 1604.

In block 2108, the hardware compiler 1606 optionally receives one or more user-specified NoC constraints and provides the NoC constraints to the NoC compiler for validation. The hardware compiler 1606 may also provide NoC traffic to the NoC compiler 1606. The NoC compiler 1604 is capable of generating an updated NoC solution using the received NoC constraints and/or the NoC traffic. If, for example, the application is implemented where the hardware portion of the PL 214 connects to the DPE array 202, the PS 212, the hardwired circuit blocks 210, or the volatile memory 134 through the NoC 208, the hardware compiler 1606 is capable of calling the NoC compiler 1604 by providing the NoC constraints and/or NoC traffic to the NoC compiler 1604. The NoC compiler 1604 is capable of updating routing information for data paths through the NoC 208 as the updated NoC solution. The updated routing information may specify updated routes and particular ingress/egress points for the routes. The hardware compiler 1606 may obtain the updated NoC solution and, in response, generate updated SoC interface block constraints that are provided to the DPE compiler 1602. The process may be iterative in nature. The DPE compiler 1602 and the NoC compiler 1604 may operate concurrently as illustrated by blocks 2106 and 2108.

In block 2110, the hardware compiler 1606 is capable of performing synthesis on the block diagram. In block 2112, the hardware compiler 1606 performs place and route on the block diagram. In block 2114, while performing place and/or route, the hardware compiler is capable of determining whether the implementation of the block diagram, e.g., the current state of implementation of the hardware portion (e.g., the hardware design) at any of these different stages of the implementation flow, meets design metrics for the hardware portion of the application. For example, the hardware compiler 1606 is capable of determining whether the current implementation meets the design metrics prior to placement, during placement, prior to route, or during route. In response to determining that the current implementation of the hardware portion of the application does not meet a design metric, method 2100 continues to block 2116. Otherwise, method 2100 continues to block 2120.

In block 2116, the hardware compiler is capable of providing one or more user specified SoC interface block constraints to the DPE compiler 1602. The hardware compiler 1606 is capable of optionally providing one or more NoC constraints to the NoC compiler 1604. As discussed, the DPE compiler 1602 generates an updated SoC interface block solution using the SoC interface block constraint(s) received from the hardware compiler 1606. The NoC compiler 1604 optionally generates an updated NoC solution. For example, the NoC compiler 1604 can be invoked if one or more data paths between the DPE array 202 and the PL 214 flow through the NoC 208. In block 2118, the hardware compiler 1606 receives the updated SoC interface block solution and optionally the updated NoC solution. After block 2118, method 2100 continues to block 2112 where the hardware compiler 1606 continues to perform place and/or route using the updated SoC interface block solution and optionally the updated NoC solution.

FIG. 21 illustrates that the exchange of design data between the compilers may be performed in an iterative manner. For example, at any of a plurality of different points during the place and/or route stages, the hardware compiler 1606 is capable of determining whether the current state of the implementation of the hardware portion of the application meets the established design metrics. If not, the hardware compiler 1606 may initiate the exchange of design data as described to obtain an updated SoC interface block solution and an updated NoC solution that the hardware compiler 1606 uses for purposes of placement and routing. It should be appreciated that the hardware compiler 1606 need only invoke the NoC compiler 1604 in cases where the configuration of the NoC 208 is to be updated (e.g., where data from the PL 214 is provided to and/or received from other circuit blocks through the NoC 208).

In block 2120, in the case where the hardware portion of the application meets the design metrics, the hardware compiler 1606 generates a configuration bitstream specifying an implementation of the hardware portion within the PL 214. The hardware compiler 1606 is further capable of providing the final SoC interface block solution (e.g., the SoC interface block solution used for place and route) to the DPE compiler 1602 and providing the final NoC solution that may have been used for place and route to the NoC compiler 1604.

In block 2122, the DPE compiler 1602 generates binaries for programming the DPEs 202 of the DPE array 204. The NoC compiler 1604 generates a binary for programming the NoC 208. For example, throughout blocks 2106, 2108, and 2116, the DPE compiler 1602 and the NoC compiler 1604 may perform incremental validation functions where the SoC interface block solutions and the NoC solutions used are generated based on validation procedures that may be performed in less runtime than if complete solutions for the SoC interface block and the NoC were determined. In block 2122, the DPE compiler 1602 and the NoC compiler 1604 may generate the final binaries used to program the DPE array 202 and the NoC 208, respectively.

In block 2124, the PS compiler 1918 generates the PS binary. The PS binary includes the object code that is executed by the PS 212. The PS binary, for example, implements the control program executed by the PS 212 to monitor operation of the SoC 200 with the application implemented therein. The DPE compiler 1602 may also generate a DPE array driver that may be compiled by the PS compiler 1918 and executed by the PS 212 to read and/or write to the DPEs 204 of the DPE array 202.

In block 2126, the system is capable of deploying the configuration bitstream and the binaries in the SoC 200. The system, for example, is capable of combining the various binaries and the configuration bitstream into a PDI that may be provided to the SoC 200 and loaded into the SoC 200 to implement the application therein.

Figure 22:
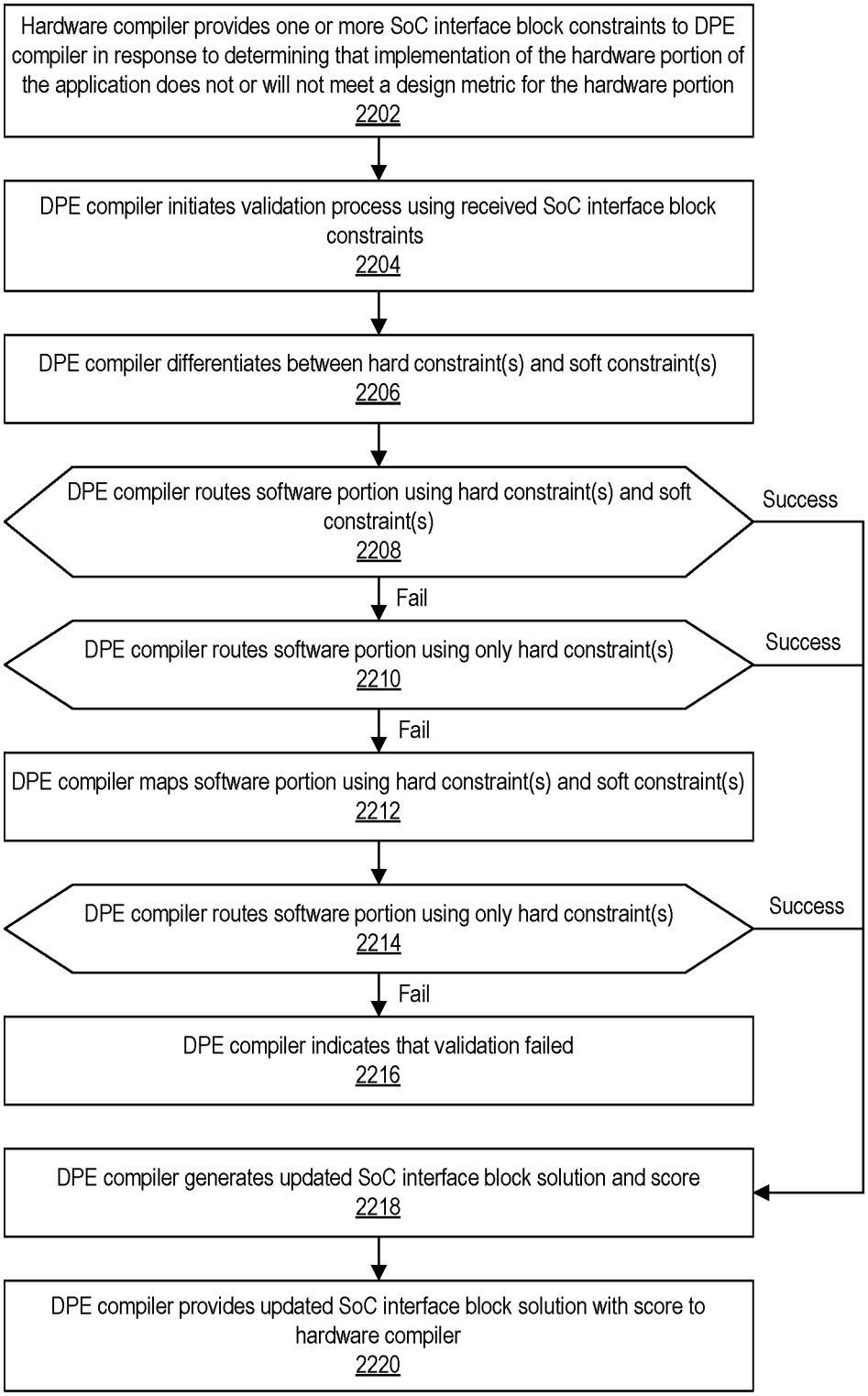
FIG. 22 illustrates an example method of communication between a hardware compiler and a DPE compiler.

FIG. 22 illustrates an example method 2200 of communication between the hardware compiler 1606 and the DPE compiler 1602. Method 2200 presents an example of how communications between the hardware compiler 1606 and the DPE compiler 1602 as described in connection with FIGS. 16, 19, 20, and 21 may be handled. Method 2200 illustrates an example implementation of a validation call (e.g., a validation procedure) conducted between the hardware compiler 1606 and the DPE compiler 1602. The example of method 2200 provides an alternative to performing full place and route for the DPE array 202 and/or the NoC 208 to generate updated SoC interface block solutions in response to SoC interface block constraints provided from the hardware compiler 1606. Method 2200 illustrates an incremental approach where re-routing is attempted prior to initiating a mapping and routing of the software portion of the application.

Method 2200 may begin in block 2202 where the hardware compiler 1606 provides one or more SoC interface block constraints to the DPE compiler 1602. The hardware compiler 1606, for example, during the implementation flow and in response to determining that a design metric for the hardware portion of the application is not or will not be met, may receive one or more user-specified SoC interface block constraints and/or generate one or more SoC interface block constraints. The SoC interface block constraints may specify a preferred mapping of the logical resource(s) to the physical stream channels of the SoC interface block 206 that is expected to result in improved Quality of Result (QoS) for the hardware portion of the application.

The hardware compiler 1606 provides the SoC interface block constraints to the DPE compiler 1602. The SoC interface block constraints provided from the hardware compiler 1606 may fall into two different categories. The first category of SoC interface block constraint is a hard constraint. The second category of SoC interface block constraint is a soft constraint. Hard constraints are design constraints that must be satisfied to implement the application within the SoC 200. Soft constraints are design constraints that may be violated in the implementation of the application for the SoC 200.

In one example, hard constraints are user-specified constraints for the hardware portion of the application to be implemented in the PL 214. The hard constraints may include any available constraint types such as location, power, timing, etc., that are user-specified constraints. Soft constraints may include any available constraint that is generated by the hardware compiler 1606 and/or the DPE compiler 1602 throughout the implementation flow such as a constraint specifying a particular mapping of logical resource(s) to stream channels of the SoC interface block 206 as described.

In block 2204, the DPE compiler 1602, in response to receiving the SoC interface block constraint(s), initiates a validation process to incorporate the received SoC interface block constraints in generating an updated SoC interface block solution. In block 2206, the DPE compiler 1602 is capable of differentiating between hard constraint(s) and soft constraint(s) received from the hardware compiler 1606 relating to the hardware portion of the application.

In block 2208, the DPE compiler 1602 routes the software portion of the application while following both the hard constraint(s) and the soft constraint(s) provided from the hardware compiler. The DPE compiler 1602, for example, is capable of routing connections among the DPEs 204 of the DPE array 202 and the data paths between the DPEs 204 and the SoC interface block 206 to determine which stream channels (e.g., tiles, stream switches, and ports) of the SoC interface block 206 are used for data path crossings between the DPE array 202 and the PL 214 and/or NoC 208. If the DPE compiler 1602 successfully routes the software portion of the application for implementation in the DPE array 202 while following both of the hard constraint(s) and the soft constraint(s), method 2200 continues to block 2218. If the DPE compiler 1602 is not able to generate a route for the software portion of the application in the DPE array while following both of the hard constraint(s) and the soft constraint(s), e.g., the constraints are un-routable, method 2200 continues to block 2210.

In block 2210, the DPE compiler 1602 routes the software portion of the application while following only the hard constraint(s). In block 2210, the DPE compiler 1602 ignores the soft constraint(s) for purposes of the routing operation. If the DPE compiler 1602 successfully routes the software portion of the application for implementation in the DPE array 202 while following only the hard constraint(s), method 2200 continues to block 2218. If the DPE compiler 1602 is not able to generate a route for the software portion of the application in the DPE array 202 while following only the hard constraint(s), method 2200 continues to block 2212.

Blocks 2208 and 2210 illustrate an approach for the validation operation that seeks to use the SoC interface block constraint(s) provided from the hardware compiler 1606 to create an updated SoC interface block solution in less time than were a full map (e.g., place) and route of the DPE nodes to be performed. As such, blocks 2208 and 2210 involve only routing without attempting to map (e.g., remap) or "place" the DPE nodes to DPEs 204 of the DPE array 202.

Method 2200 continues to block 2212 in the case where routing alone is unable to arrive at an updated SoC interface block solution using the SoC interface block constraint(s) from the hardware compiler. In block 2212, the DPE compiler 1602 is capable of mapping the software portion of the application to DPEs in the DPE array 202 using both of the hard constraint(s) and the soft constraint(s). The DPE compiler 1602 is also programmed with the architecture (e.g., connectivity) of the SoC 200. The DPE compiler 1602 performs the actual assignment of logical resources to physical channels of the SoC interface block 206 (e.g., to stream channels) and is also capable of modeling the architectural connectivity of the SoC 200.

As an example, consider DPE node A communicating with a PL node B. Each block of the block diagram can correspond to a particular core (e.g., circuit block) that is to be implemented in the PL 214. PL node B communicates with DPE node A through a physical channel X in the SoC interface block 206. Physical channel X carries the data stream(s) between DPE node A and PL node B. The DPE compiler 1602 is capable of mapping DPE node A to a particular DPE Y so that the distance between DPE Y and the physical channel X is minimized.

In some implementations of the SoC interface block 206, one or more of the tiles included therein are not connected to the PL 214. The unconnected tiles may be a result of the placement of particular hardwired circuit blocks 210 in and/or around the PL 214. This architecture, e.g., with unconnected tiles in the SoC interface block 206, complicates routing between the SoC interface block 206 and the PL 214. The connectivity information regarding unconnected tiles is modeled in the DPE compiler 1602. The DPE compiler 1602, as part of performing mapping, is capable of selecting DPE nodes that have connections with the PL 214. The DPE compiler 1602, as part of performing mapping, is capable of minimizing the number of selected DPE nodes that are mapped to DPEs 204 in columns of the DPE array 202 immediately above the unconnected tiles of the SoC interface block 206. The DPE compiler 1602 maps DPE nodes that do not have connections (e.g., direct connections) to the PL 214 (e.g., nodes that instead connect to other DPEs 204) to the columns of the DPE array 202 positioned above the unconnected tiles of the SoC interface block 206.

In block 2214, the DPE compiler 1602 routes the remapped software portion of the application while following only the hard constraint(s). If the DPE compiler 1602 successfully routes the remapped software portion of the application for implementation in the DPE array 202 while following only the hard constraint(s), method 2200 continues to block 2218. If the DPE compiler 1602 is not able to generate a route for the software portion of the application in the DPE array 202 while following only the hard constraint(s), method 2200 continues to block 2216. In block 2216, the DPE compiler 1602 indicates that the validation operation failed. The DPE compiler 1602 may output a notification and may provide the notification to the hardware compiler 1606.

In block 2218, the DPE compiler 1602 generates an updated SoC interface block solution and a score for the updated SoC interface block solution. The DPE compiler 1602 generates the updated SoC interface block solution based on the updated routing or the updated mapping and routing determined in block 2208, block 2210, or blocks 2212 and 2214.

The score generated by the DPE compiler 1602 indicates the quality of the SoC interface block solution based on the mapping and/or routing operations performed. In one example implementation, the DPE compiler 1602 determines the score based on how many soft constraints were not met and the distance between the stream channel requested in the soft constraint and the actual channel assigned in the updated SoC interface block solution. The number of soft constraints not met and the distance, for example, both may be inversely proportional to the score.

In another example implementation, the DPE compiler 1602 determines the score based on the quality of the updated SoC interface block solution using one or more design cost metrics. These design cost metrics may include the number of data movements supported by the SoC interface block solution, a memory conflict cost, and the latency of the routes. In one aspect, the number of data movements in the DPE array 202 may be quantified by the number of DMA transfers used in the DPE array 202 in addition to those needed to transfer data across the SoC interface block 206. The memory conflict cost may be determined based on the number of concurrent accessing circuits (e.g., DPE or DMA) for each memory bank. The latency of the routes may be quantified by the minimum number of cycles required to transfer the data between the SoC interface block 206 ports and the individual source or destination DPE 204. The DPE compiler 1602 determines a higher score when the design cost metrics are lower (e.g., a sum of the design cost metrics are lower).

In another example implementation, the total score of an updated SoC interface block solution is computed as a fraction (e.g., $^{80}/_{100}$) where the numerator is reduced from 100 by the sum of the number of additional DMA transfers, the number of concurrent accessing circuits for each memory bank in excess of two, and the number of hops needed for the routes between the SoC interface block 206 ports and the DPE 204 cores.

In block 2220, the DPE compiler 1602 provides the updated SoC interface block solution and the score to the hardware compiler 1606. The hardware compiler 1606 is capable of evaluating the various SoC interface block solutions received from the DPE compiler 1602 based on the score of each respective SoC interface block solution. In one aspect, the hardware compiler 1606, for example, is capable of retaining prior SoC interface block solutions. The hardware compiler 1606 is capable of comparing the score of the updated SoC interface block solution with the score of a previous (e.g., an immediately prior SoC interface block solution) and using the updated SoC interface block solution if the score of the updated SoC interface block solution exceeds the score of the prior SoC interface block solution.

In another example implementation, the hardware compiler 1606 receives an SoC interface block solution from the DPE compiler 1602 with a score of $^{80}/_{100}$. The hardware compiler 1606 is unable to arrive at an implementation of the hardware portion of the application within the PL 214 and provides one or more SoC interface block constraints to the DPE compiler 1602. The updated SoC interface block solution received by the hardware compiler 1606 from the DPE compiler 1602 has a score of $^{20}/_{100}$. In that case, in response to determining that the score of the newly received SoC interface block solution does not exceed (e.g., is lower) than the score of the prior SoC interface block solution, the hardware compiler 1606 relaxes one or more of the SoC interface block constraints (e.g., soft constraints) and provides the SoC interface block constraints, including the relaxed constraint(s), to the DPE compiler 1602. The DPE compiler 1602 attempts to generate another SoC interface block solution that, in view of the relaxed design constraint(s), has a score higher than $^{20}/_{100}$ and/or $^{80}/_{100}$.

In another example, the hardware compiler 1606 may choose to use a prior SoC interface block solution with a higher or highest score. The hardware compiler 1606 may revert to an earlier SoC interface block solution at any point such as, for example, in response to receiving an SoC interface block solution having a lower score than an immediately prior SoC interface block solution or in response to receiving an SoC interface block solution with a lower score than a prior SoC interface block solution after one or more of the SoC interface block constraints have been relaxed.

Figure 23:
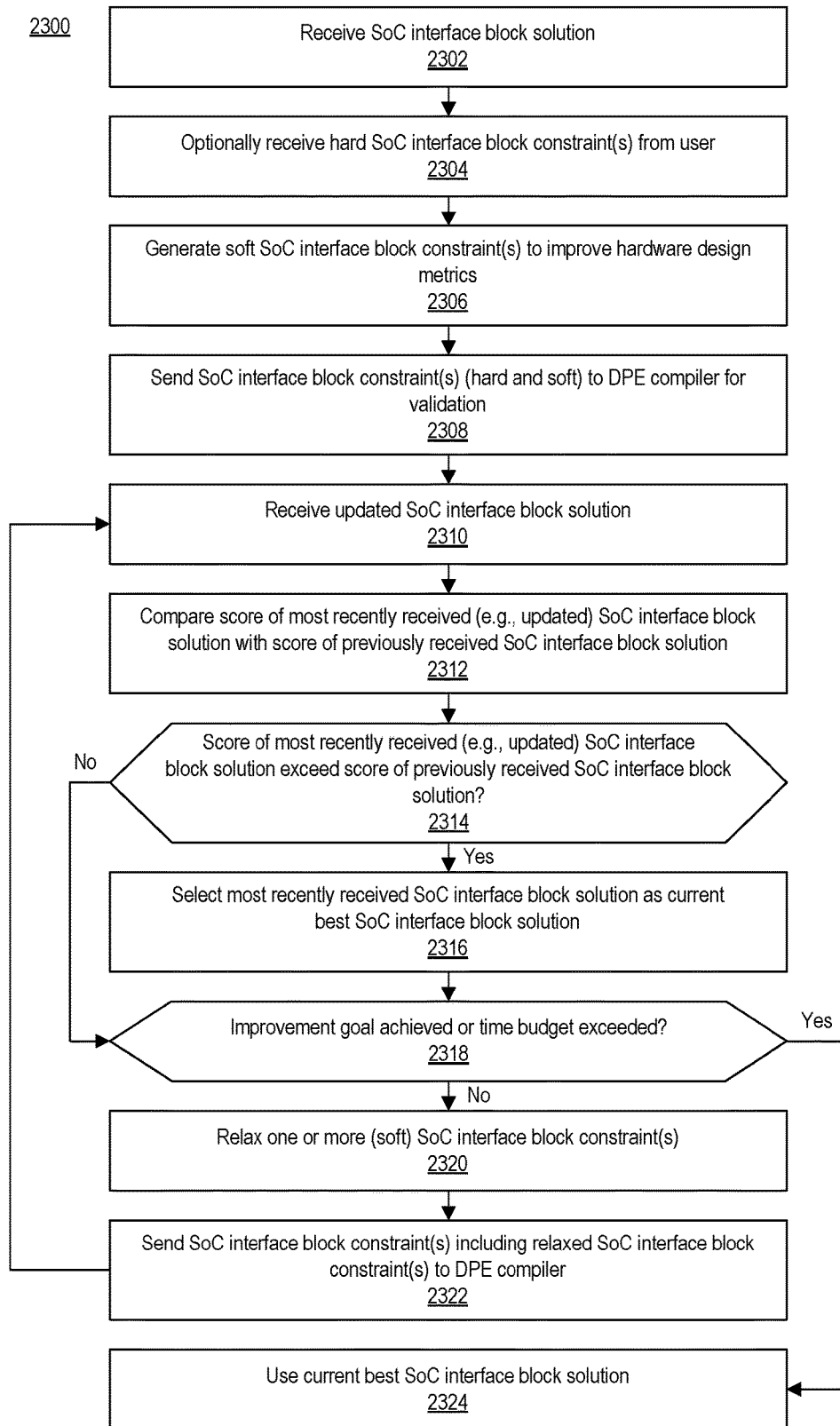
FIG. 23 illustrates an example method of handling SoC interface block solutions.

FIG. 23 illustrates an example method 2300 of handling SoC interface block solutions. Method 2300 may be performed by the hardware compiler 1606 to evaluate received SoC interface block solution(s) and select an SoC interface block solution, referred to as the current best SoC interface block solution, for use in performing the implementation flow on the hardware portion of the application.

In block 2302, the hardware compiler 1606 receives an SoC interface block solution from the DPE compiler 1602. The SoC interface block solution received in block 2302 may be the initial or first SoC interface block solution provided from the DPE compiler 1602. In providing SoC interface block solutions to the hardware compiler 1606, the DPE compiler 1602 further provides the score for the SoC interface block solution. At least initially, the hardware compiler 1606 selects the first SoC interface block solution to the be current best SoC interface block solution.

In block 2304, the hardware compiler 1606 optionally receives one or more hard SoC interface block constraints from the user. In block 2306, the hardware compiler is capable of generating one or more soft SoC interface block constraints for implementing the hardware portion of the application. The hardware compiler generates the soft SoC interface block constraints in an effort to meet hardware design metrics.

In block 2308, the hardware compiler 1606 sends the SoC interface block constraints (e.g., both hard and soft) to the DPE compiler 1602 for validation. In response to receiving the SoC interface block constraints, the DPE compiler is capable of generating an updated SoC interface block solution based on the SoC interface block constraints received from the hardware compiler 1606. The DPE compiler 1602 provides the updated SoC interface block solution to the hardware compiler 1606. Accordingly, in block 2310, the hardware compiler receives the updated SoC interface block solution.

In block 2312, the hardware compiler 1606 compares the score of the updated SoC interface block solution (e.g., the most recently received SoC interface block solution) with the score of the first (e.g., prior received) SoC interface block solution.

In block 2314, the hardware compiler 1606 determines whether the score of the updated (e.g., most recently received) SoC interface block solution exceeds the score of the previously received (e.g., first) SoC interface block solution. In block 2316, the hardware compiler 1606 selects the most recently received (e.g., updated) SoC interface block solution as the current best SoC interface block solution.

In block 2318, the hardware compiler 1606 determines whether an improvement goal has been achieved or a time budget has been exceeded. For example, the hardware compiler 1606 is capable of determining whether a current implementation state of the hardware portion of the application is meeting a larger number of design metrics and/or has come closer to meeting one or more design metrics. The hardware compiler 1606 is also capable of determining whether a time budget has been exceeded based on the amount of processing time spent on place and/or route and whether that time exceeds a maximum placement time, a maximum route time, or a maximum amount of time for both place and route. In response to determining that an improvement goal was reached or a time budget exceeded, method 2300 continues to block 2324. If not, method 2300 continues to block 2320.

In block 2324, the hardware compiler 1606 uses the current best SoC interface block solution for implementing the hardware portion of the application.

Continuing with block 2320, the hardware compiler 1606 relaxes one or more of the SoC interface block constraints. The hardware compiler 1606 may relax, for example, or change, one or more of the soft constraints. An example of relaxing or changing a soft SoC interface block constraint includes removing (e.g., deleting) the soft SoC interface block constraint. Another example of relaxing or changing a soft SoC interface block constraint includes replacing a soft SoC interface block constraint with a different SoC interface block constraint. The replacement soft SoC interface block constraint may be less strict than the original being replaced.

In block 2322, the hardware compiler 1606 is capable of sending the SoC interface block constraint(s), including the relaxed SoC interface block constraint(s), to the DPE compiler 1602. After block 2322, method 2300 loops back to block 2310 to continue processing as described. For example, the DPE compiler generates a further updated SoC interface block solution based on the SoC interface block constraints received from the hardware compiler in block 2322. In block 2310, the hardware compiler receives the further updated SoC interface block solution.

Method 2300 illustrates an example process of choosing an SoC interface block solution from the DPE compiler 1602 to use for performing the implementation flow and the circumstances in which the SoC interface block constraint(s) may be relaxed. It should be appreciated that the hardware compiler 1606 may provide SoC interface block constraints to the DPE compiler 1602 at any of a variety of different points during the implementation flow to obtain an updated SoC interface block solution as part of a reconciliation and/or validation process. For example, at any point in which the hardware compiler 1606 determines (e.g., based on a timing, power, or other check or analysis) that the implementation of the hardware portion of the application, in its current state, does not meet or will not meet a design metric of the application, the hardware compiler 1606 may request an updated SoC interface block solution by providing updated SoC interface block constraint(s) to the DPE compiler 1602.

FIG. 24 illustrates another example of an application 2400 for implementation in the SoC 200. Application 2400 is specified as a directed flow graph. Nodes are shaded and shaped differently to distinguish between PL nodes, DPE nodes, and I/O nodes. In the example shown, the I/O nodes may be mapped onto the SoC interface block 206. The PL nodes are implemented in the PL. The DPE nodes are mapped to particular DPEs. Though not shown in its entirety, the application 2400 includes 36 kernels (e.g., nodes) to be mapped to DPEs 204, 72 PL to DPE array data streams, and 36 DPE array to PL data streams.

FIG. 25 is an example illustration of an SoC interface block solution generated by the DPE compiler 1602. The SoC interface block solution of FIG. 25 may be generated by the DPE compiler 1602 and provided to the hardware compiler 1606. The example of FIG. 25 illustrates a scenario in which the DPE compiler 1602 generates an initial mapping of DPE nodes to DPEs 204 of the DPE array 202. Further, the DPE compiler 1602 successfully routes the initial mapping of DPE nodes. In the example of FIG. 25, only columns 6-17 of the DPE array 202 are shown. Further, each column includes 4 DPEs 204.

FIG. 25 illustrates a mapping of DPE nodes to DPEs 204 of the DPE array 202 and a routing of data streams to SoC interface block 206 hardware. The mapping of DPE nodes 0-35 of the application 2400 to DPEs 204, as determined by the DPE compiler 1602, is shown with reference to the DPE array 202. The routing of data streams between the DPEs and particular tiles of the SoC interface block 206 is shown as a collection of arrows. For purposes of illustration in describing FIGS. 25-30, the key displayed in FIG. 25 is used to differentiate between data streams controlled by soft constraints, hard constraints, and data streams having no applicable constraints.

With reference to FIGS. 25-30, soft constraints correspond to routings determined by the DPE compiler 1602 and/or the hardware compiler 1606, while hard constraints may include user-specified SoC interface block constraints. All of the constraints shown in FIG. 25 are soft constraints. The example of FIG. 25 illustrates the case where the DPE compiler 1602 successfully determines an initial SoC interface block solution. In one aspect, the DPE compiler 1602 may be configured to attempt, at least initially, to use vertical routes for the SoC interface block solution as shown before attempting to use other routes that traverse along (e.g., left to right) a row DPEs 204 from one column to another.

Figure 26:
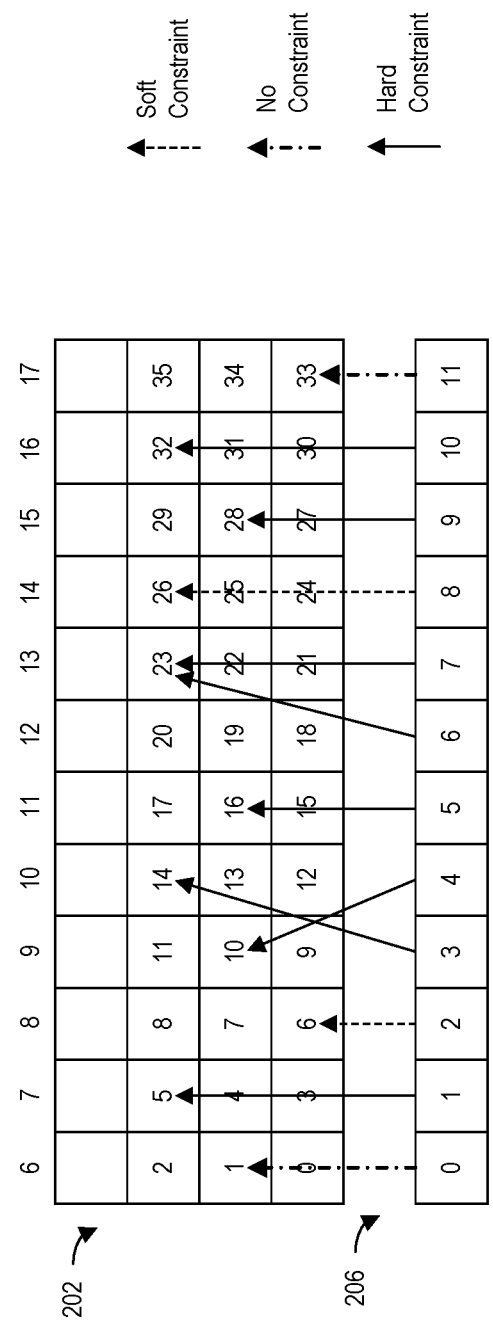
FIG. 26 illustrates an example of routable SoC interface block constraints received by the DPE compiler.

FIG. 26 illustrates an example of routable SoC interface block constraints received by the DPE compiler 1602. The DPE compiler 1602 is capable of generating an updated SoC interface block solution specifying an updated routing in the form of updated SoC interface block constraints. In the example of FIG. 26, a larger number of the SoC interface block constraints are hard constraints. In this example, the DPE compiler 1602 successfully routes the data streams of the DPE array 202 while observing each type of constraint shown.

Figure 27:
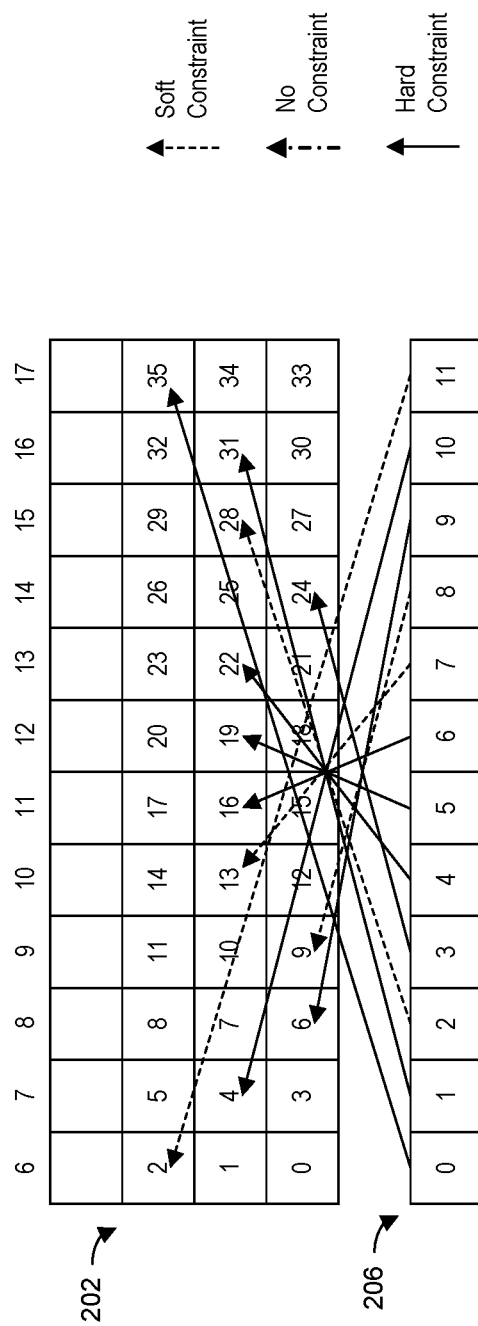
FIG. 27 illustrates an example of un-routable SoC interface block constraints.

FIG. 27 illustrates an example of un-routable SoC interface block constraints that are to be observed by the DPE compiler 1602. The DPE compiler 1602 is unable to produce an SoC interface block solution that observes the constraints illustrated in FIG. 27.

Figure 28:
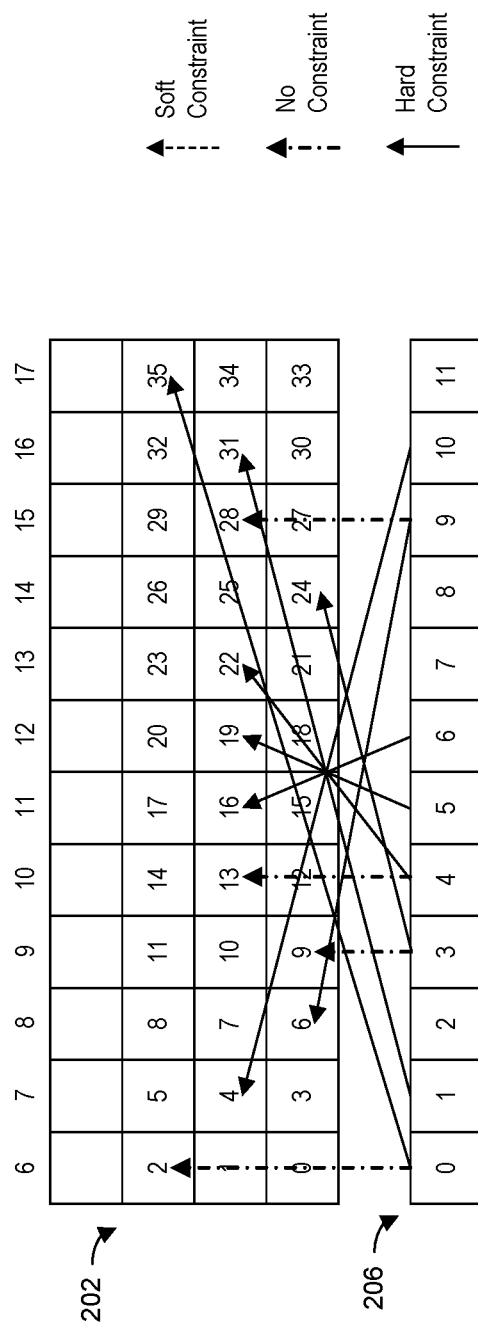
FIG. 28 illustrates an example where the DPE compiler ignores the soft type SoC interface block constraints from FIG. 27.

FIG. 28 illustrates an example where the DPE compiler 1602 ignores the soft type SoC interface block constraints from FIG. 27. In the example of FIG. 28, the DPE compiler 1602 successfully routes the software portion of the application for implementation in the DPE array 202 using only the hard constraints. Those data streams not controlled by constraints may be routed in any way that the DPE compiler 1602 sees fit or is able to do so.

Figure 29:
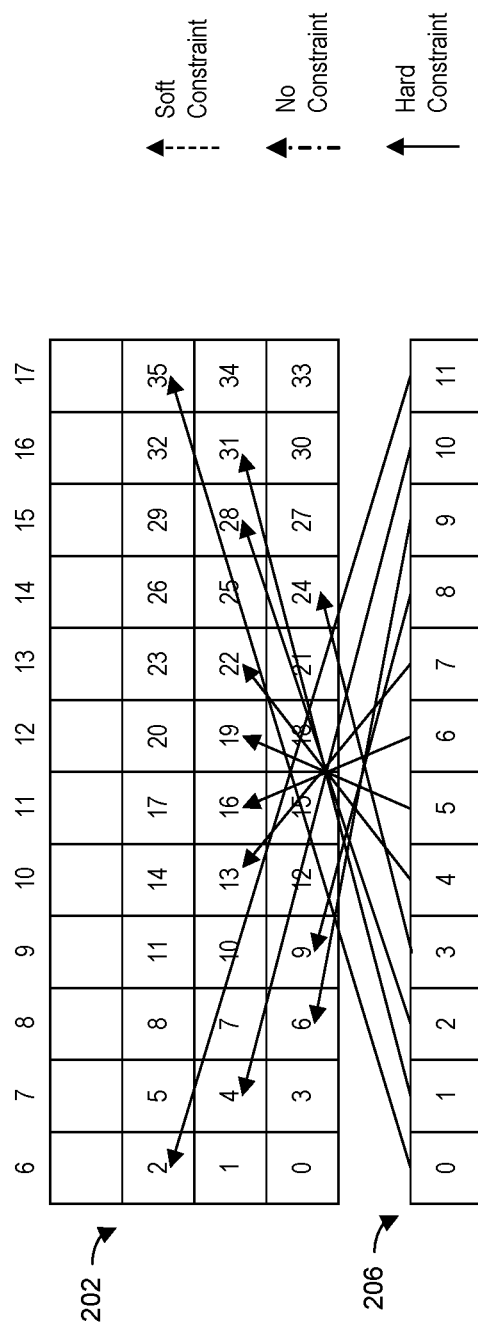
FIG. 29 illustrates another example of un-routable SoC interface block constraints.

FIG. 29 illustrates another example of un-routable SoC interface block constraints. The example of FIG. 29 has only hard constraints. As such, the DPE compiler 1602, being unable to ignore the hard constraints, initiates a mapping (or re-mapping) operation.

Figure 30:
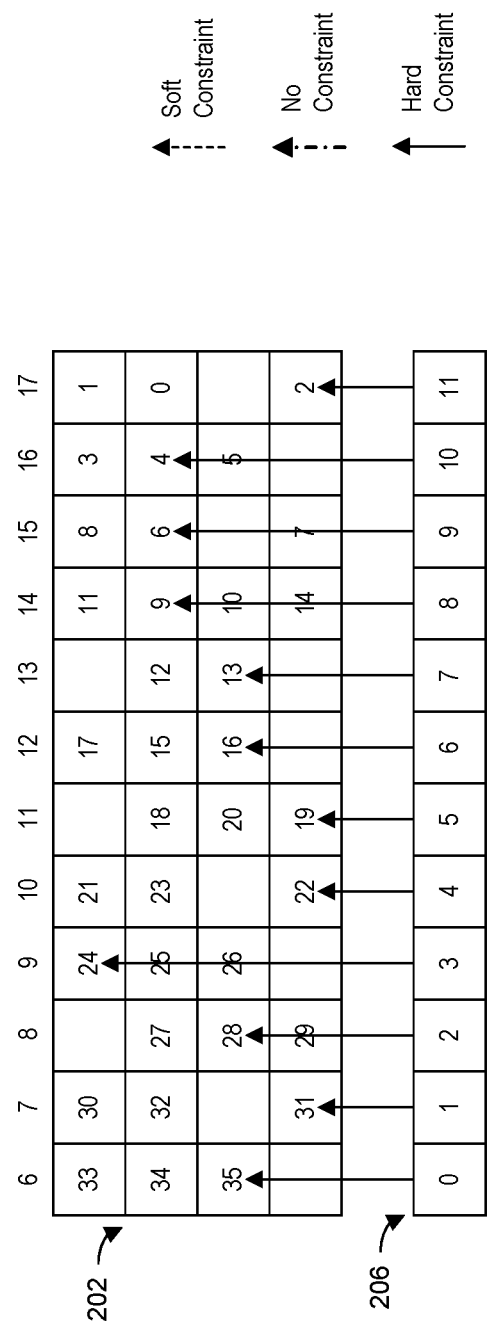
FIG. 30 illustrates an example mapping of the DPE nodes of FIG. 29.

FIG. 30 illustrates an example mapping of the DPE nodes of FIG. 29. In this example, subsequent to remapping, the DPE compiler 1602 is able to successfully route the DPE nodes to generate an updated SoC interface block solution.

Figure 31:
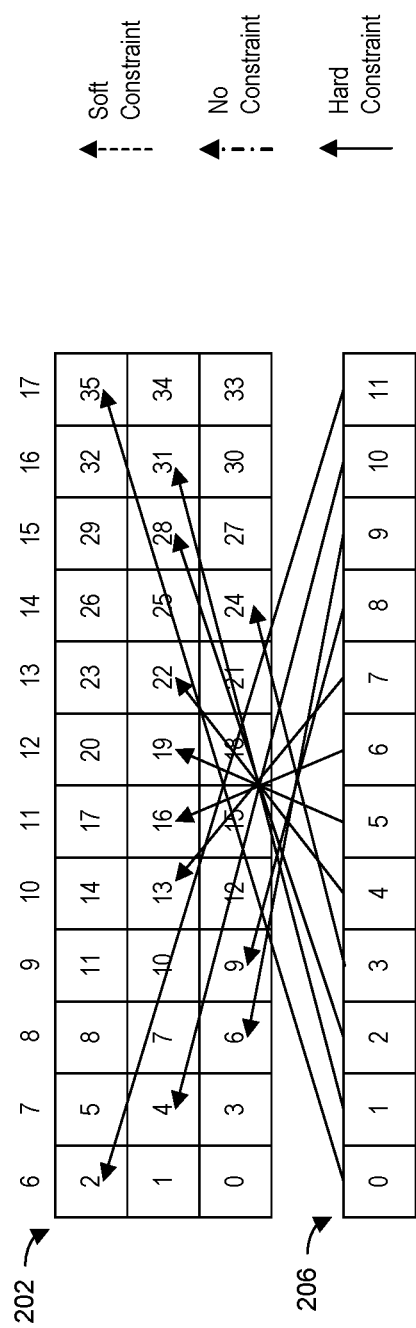
FIG. 31 illustrates another example of un-routable SoC interface block constraints.

FIG. 31 illustrates another example of un-routable SoC interface block constraints. The example of FIG. 31 has only hard constraints. As such, the DPE compiler 1602, being unable to ignore hard constraints, initiates a mapping operation. For purposes of illustration, the DPE array 202 includes only three rows of DPEs (e.g., 3 DPEs in each column).

Figure 32:
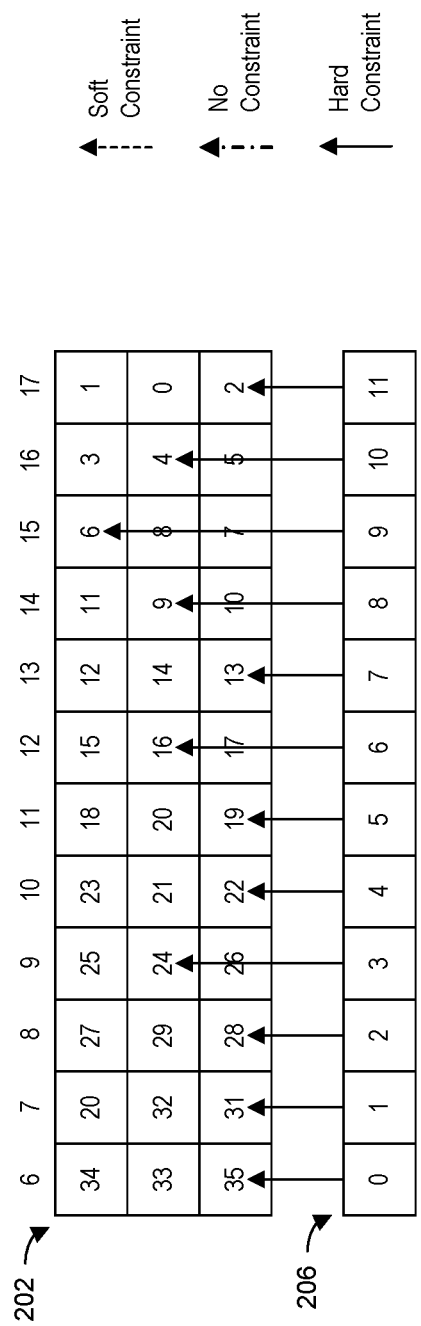
FIG. 32 illustrates an example mapping of the DPE nodes of FIG. 31.

FIG. 32 illustrates an example mapping of the DPE nodes of FIG. 31. FIG. 32 illustrates the result obtained from the re-mapping operation initiated as described in connection with FIG. 31. In this example, subsequent to re-mapping, the DPE compiler 1602 is able to successfully route the software solution of the application to generate an updated SoC interface block solution.

In one aspect, the system is capable of performing the mapping illustrated in FIGS. 25-32 by generating an Integer Linear Programming (ILP) formulation of the mapping problem. The ILP formulation may include a plurality of different variables and constraints that define the mapping problem. The system is capable of solving the ILP formulation while also minimizing the cost(s). Costs may be determined, at least in part, based on a number of DMA engines used. In this manner, the system is capable of mapping the DFG onto the DPE array.

In another aspect, the system is capable of ordering nodes of the DFG in decreasing order of priority. The system may decide priority based on one or more factors. Examples of the factors can include, but are not limited to, the height of the node in the DFG graph, the total degree of the node (e.g., the sum of all edges entering and leaving the node), and/or the type of edges connected to the node such as memory, stream, and cascade. The system is capable of placing the node on the best DPE available based on affinity and validity. The system is capable of determining validity based on whether all resource requirements of this node can be met on a given DPE (e.g., compute resources, memory buffers, stream resources). The system is capable of determining affinity based on one or more other factors. Examples of affinity factors may include placing the node on the same DPE or an adjacent DPE where the neighbors of this node have already been placed to minimize DMA communication, architectural constraints such as whether this node is part of a cascade chain, and/or finding a DPE that has maximally free resources. If the node is placed with all constraints being met, the system is capable of increasing priority of neighboring nodes of the placed node so that such nodes are handled next. If no available placement is valid for the current node, the system may try to unplace some other nodes from their best candidate DPE(s) to make room for this node. The system may put the unplaced nodes back on the priority queue to be placed again. The system is capable of limiting the total effort expended in finding a good solution by keeping track of the total number of placements and unplacements performed. It should be appreciated, however, that other mapping techniques may be used and that the examples provided herein are not intended to be limiting.

Figure 33:
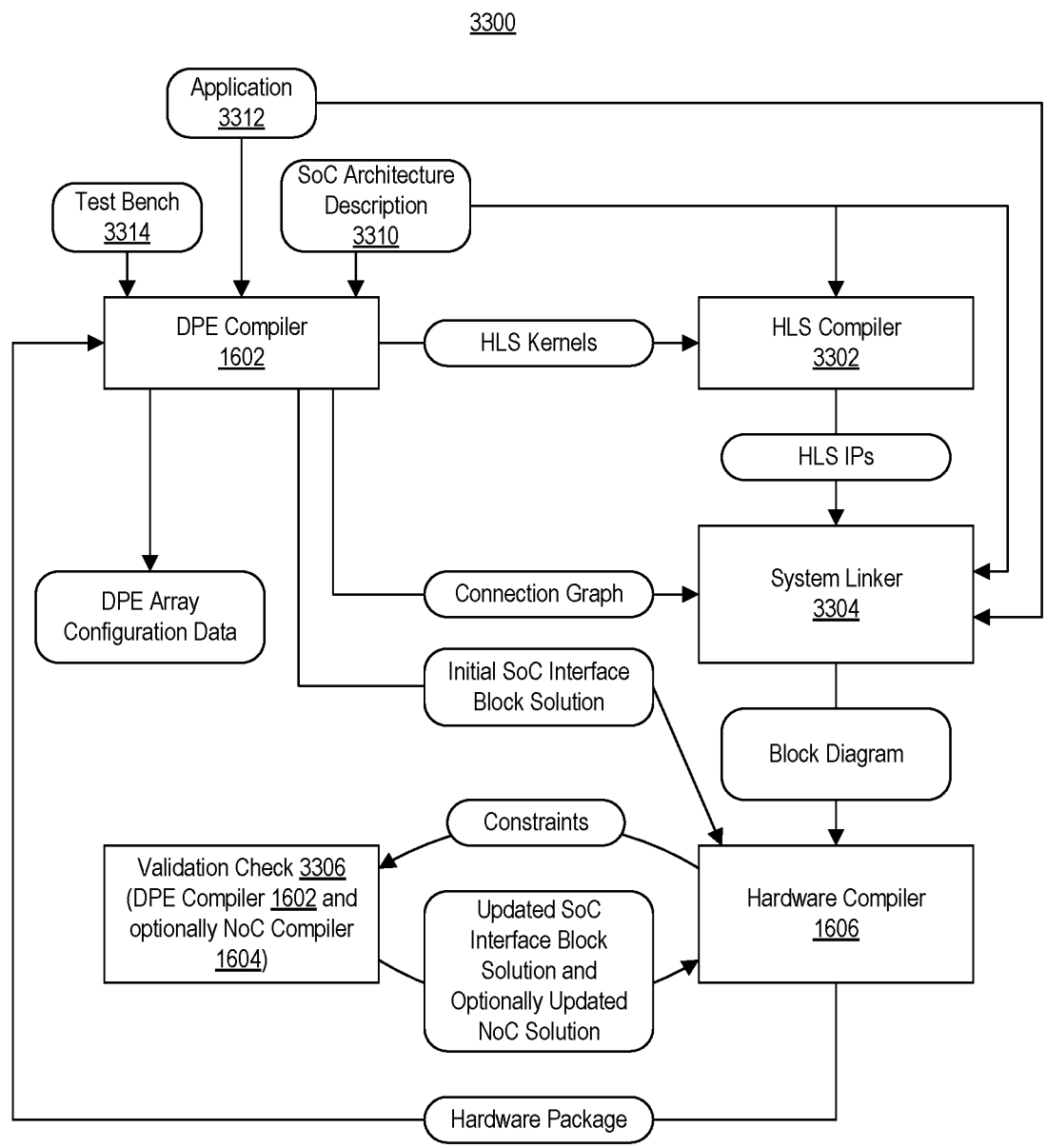
FIG. 33 illustrates another example software architecture executable by the system of FIG. 1.

FIG. 33 illustrates another example software architecture 3300 that is executable by the system described in connection with FIG. 1. For example, the architecture 3300 of FIG. 33 may be implemented as one or more of the program modules 120 of FIG. 1. The example software architecture 3300 of FIG. 33 may be used in cases where the application, e.g., the data flow graph, specifies one or more High-Level Synthesis (HLS) kernels for implementation in the PL 214. For example, the PL nodes of the application reference HLS kernels that require HLS processing. In one aspect, the HLS kernels are specified in a high-level language (HLL) such as C and/or C++.

In the example of FIG. 33, the software architecture 3300 includes the DPE compiler 1602, the hardware compiler 1606, an HLS compiler 3302, and a system linker 3304. The NoC compiler 1604 may be included and used in conjunction with the DPE compiler 1602 to perform the validation check 3306 as previously described within this disclosure.

As illustrated, the DPE compiler 1602 receives an application 3312, an SoC architecture description 3310, and optionally a test bench 3314. The application 3312, as discussed, may be specified as a data flow graph that includes parallel execution semantics. The application 3312 may include interconnected PL nodes and DPE nodes and specify runtime parameters. In this example, the PL nodes reference HLS kernels. The SoC architecture description 3310 may be a data structure or a file that specifies information such as the size and dimensions of the DPE array 202, the size of the PL 214 and the various programmable circuit blocks available therein, the type of PS 212 such as the type of processors and other devices included in the PS 212, and other physical characteristics of the circuitry in the SoC 200 in which the application 3312 is to be implemented. The SoC architecture description 3310 may also specify connectivity (e.g., interfaces) among the subsystems included therein.

The DPE compiler 1602 is capable of outputting the HLS kernels to the HLS compiler 3302. The HLS compiler 3302 transforms the HLS kernels, which are specified in an HLL, into HLS IPs that may be synthesized by the hardware compiler. For example, the HLS IPs may be specified as register transfer level (RTL) blocks. The HLS compiler 3302, for example, generates an RTL block for each HLS kernel. As pictured, the HLS compiler 3302 outputs the HLS IPs to the system linker 3304.

The DPE compiler 1602 generates additional outputs such as the initial SoC interface block solution and a connection graph. The DPE compiler 1602 outputs the connection graph to the system linker 3304 and the SoC interface block solution to the hardware compiler 1606. The connection graph specifies connectivity between nodes corresponding to HLS kernels to be implemented in PL 214 (now converted to HLS IPs) and nodes to be implemented in the DPE array 202.

As pictured, the system linker 3304 receives the SoC architecture description 3310. System linker 3304 may also receive one or more HLS and/or RTL blocks directly from application 3312 that are not processed through DPE compiler 1602. The system linker 3304 is capable of automatically generating a block diagram corresponding to the hardware portion of the application using the received HLS and/or RTL blocks, HLS IPs, and the connection graph specifying connectivity between the IP kernels and the connectivity between the IP kernels and the DPE nodes. In one aspect, the system linker 3304 is capable of integrating the block diagram with a base platform (not shown) for the SoC 200. For example, the system linker 3304 is capable of connecting the block diagram to the base platform resulting in an integrated block diagram. The block diagram and the connected base platform may be referred to as a synthesizable block diagram.

In another aspect, HLS IPs and RTL IPs referenced as kernels within the SDF graph (e.g., application 3312) can be compiled into IPs outside of DPE compiler 1602. The compiled IPs can be provided directly to system linker 3304. System linker 3304 is capable of automatically generating a block diagram corresponding to the hardware portion of the application using the provided IPs.

In one aspect, system linker 3304 is capable of including within the block diagram additional hardware-specific details derived from the original SDF (e.g., application 3312) and generated connection graph. For example, since application 3312 includes software models that are actual HLS models that can be translated into IPs or correlated (e.g., matched) to IPs in a database of such IPs using some mechanism (e.g., by name or other matching/correlation technique), system linker 3304 is capable of automatically generating the block diagram (e.g., without user intervention). In this example, custom IPs may not be used. In automatically generating the block diagram, system linker 3304 is capable of automatically inserting one or more additional circuit blocks such as data-width conversion blocks, hardware buffers, and/or clock domain crossing logic that, in other cases described herein, were manually inserted and connected by the user. System linker 3304, for example, is capable of analyzing the data types and the software model to determine that one or more additional circuit blocks, as described, are needed to create the connections specified by the connection graph.

The system linker 3304 outputs the block diagram to the hardware compiler 1606. The hardware compiler 1606 receives the block diagram and the initial SoC interface block solution generated by the DPE compiler 1602. The hardware compiler 1606 is capable of initiating the validation check 3306 with the DPE compiler 1602 and optionally the NoC compiler 1604 as previously described in connection with block 2010 of FIG. 20, blocks 2106, 2108, 2112, 2114, 2116, and 2118 of FIG. 21, FIG. 22, and FIG. 23. The validation may be an iterative process where the hardware compiler provides design data such as the various types of constraints (which may include relaxed/modified constraints in an iterative approach) to the DPE compiler 1602 and optionally to the NoC compiler 1604 and, in return, receives an updated SoC interface block solution from the DPE compiler 1602 and optionally an updated NoC solution from the NoC compiler 1604.

Hardware compiler 1606 is capable of generating a hardware package that includes the configuration bitstream that implements the hardware portion of the application 3312 in the PL 214. The hardware compiler 1606 is capable of outputting the hardware package to the DPE compiler 1602. The DPE compiler 1602 is capable of generating the DPE array configuration data (e.g., one or more binaries) that program the software portion of the application 3312 intended for implementation in the DPE array 202 therein.

Figure 34:
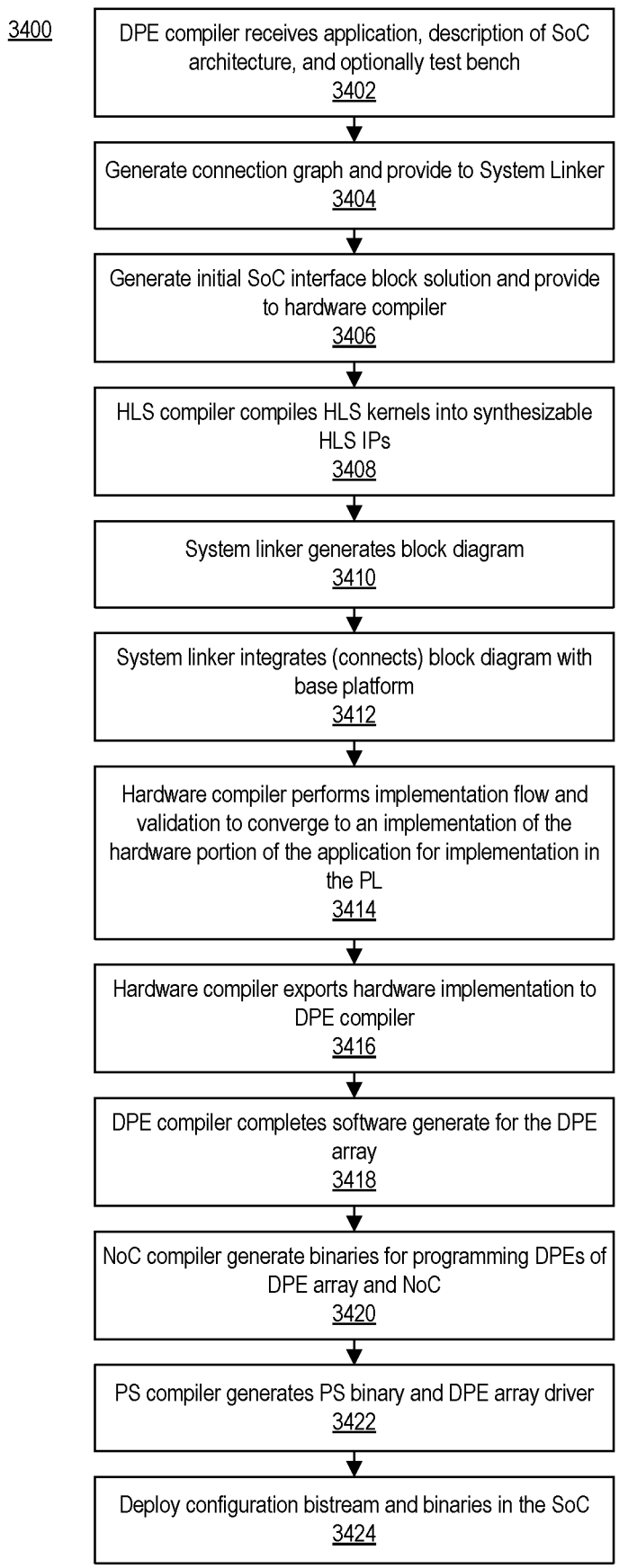
FIG. 34 illustrates another example method of performing a design flow to implement an application in an SoC.

FIG. 34 illustrates another example method 3400 of performing a design flow to implement an application in the SoC 200. Method 3400 may be performed by a system as described in connection with FIG. 1. The system may execute a software architecture as described in connection with FIG. 33. In the example of FIG. 34, the application being processed includes nodes that specify HLS kernels for implementation in the PL 214.

In block 3402, the DPE compiler 1602 receives the application, an SoC architecture description of the SoC 200, and optionally a test bench. In block 3404, the DPE compiler 1602 is capable of generating a connection graph and providing the connection graph to the system linker. In block 3406, the DPE compiler 1602 generates an initial SoC interface block solution and provides the initial SoC interface block solution to the hardware compiler 1606. The initial SoC interface block solution can specify an initial mapping of DPE nodes of the application to DPEs 204 of the DPE array 202 and a mapping of the connections in and out of the DPE array 202 to physical data paths of the SoC interface block 206.

In block 3408, the HLS compiler 3302 is capable of performing HLS on the HLS kernels to generate synthesizable IP cores. For example, the DPE compiler 1602 provides the HLS kernels specified by the nodes of the application to the HLS compiler 3302. The HLS compiler 3302 generates an HLS IP for each of the HLS kernels received. The HLS compiler 3302 outputs the HLS IPs to the system linker.

In block 3410, the system linker is capable of automatically generating a block diagram corresponding to the hardware portion of the application using the connection graph, the SoC architecture description, and the HLS IPs. In block 3412, the system linker is capable of integrating the block diagram and a base platform for the SoC 200. For example, the hardware compiler 1606 is capable of connecting the block diagram to the base platform resulting in an integrated block diagram. In one aspect, the block diagram and the connected base platform are referred to as a synthesizable block diagram.

In block 3414, the hardware compiler 1606 is capable of performing an implementation flow on the integrated block diagram. During the implementation flow, the hardware compiler 1606 is capable performing validation as described herein in cooperation with the DPE compiler 1602 and optionally the NoC compiler 1604 to converge to an implementation of the hardware portion of the application for implementation in the PL. For example, as discussed, the hardware compiler 1606 is capable of invoking the DPE compiler 1602 and optionally the NoC compiler 1604 in response to determining that a current implementation state of the hardware portion of the application does not meet one or more design metrics. The hardware compiler 1606 may invoke the DPE compiler 1602 and optionally the NoC compiler 1604 prior to placement, during placement, prior to routing, and/or during routing.

In block 3416, the hardware compiler 1606 exports the hardware implementation to the DPE compiler 1602. In one aspect, the hardware implementation may be output as a device support archive (DSA) file. The DSA file may include platform metadata, emulation data, one or more configuration bitstreams as generated by the hardware compiler 1606 from the implementation flow, and the like. The hardware implementation may also include the final SoC interface block solution and optionally the final NoC solution used by the hardware compiler 1606 to create the implementation of the hardware portion of the application.

In block 3418, the DPE compiler 1602 completes the software generation for the DPE array. For example, the DPE compiler 1602 generates the binaries used to program the DPEs used in the application. In generating the binaries, the DPE compiler 1602 is capable of using the final SoC interface block solution and optionally the final NoC solution used by the hardware compiler 1606 to perform the implementation flow. In one aspect, the DPE compiler is capable of determining the SoC interface block solution used by the hardware compiler through inspection of the configuration bitstream and/or the metadata included in the DSA.

In block 3420, the NoC compiler 1604 generates a binary or binaries for programming the NoC 208. In block 3422, the PS compiler 1918 generates the PS binary. In block 3424, the system is capable of deploying the configuration bitstream and the binaries in the SoC 200.

FIG. 35 illustrates another example method 3500 of performing a design flow to implement an application in the SoC 200. Method 3500 may be performed by a system as described in connection with FIG. 1. The application may be specified as a data flow graph as described herein and include a software portion for implementation within the DPE array 202 and a hardware portion for implementation within the PL 214.

In block 3502, the system is capable of generating a first interface solution mapping logical resources used by the software portion to hardware resources of an interface block coupling the DPE array 202 and the PL 214. The DPE compiler 1602, for example, may generate the initial, or first, SoC interface block solution.

In block 3504, the system is capable of generating a connection graph specifying connectivity among the HLS kernels and nodes of the software portion to be implemented in the DPE array. In one aspect, the DPE compiler 1602 is capable of generating the connection graph.

In block 3506, the system is capable of generating a block diagram based on the connection graph and the HLS kernels. The block diagram is synthesizable. A system linker, for example, is capable of generating the synthesizable block diagram.

In block 3508, the system is capable of performing an implementation flow on the block diagram using the first interface solution. As discussed, the hardware compiler 1606 is capable of exchanging design data with the DPE compiler 1602 and optionally the NoC compiler 1604 during the implementation flow. The hardware compiler 1606 and the DPE compiler 1602 may iteratively exchange data where the DPE compiler 1602 provides updated SoC interface block solutions to the hardware compiler 1606 in response to being invoked by the hardware compiler 1606. The hardware compiler 1606 may invoke the DPE compiler by providing one or more constraints for the SoC interface block thereto. The hardware compiler 1606 and the NoC compiler 1604 may iteratively exchange data where the NoC compiler 1604 provides updated NoC solutions to the hardware compiler 1606 in response to being invoked by the hardware compiler 1606. The hardware compiler 1606 may invoke the NoC compiler 1604 by providing one or more constraints for the NoC 208 thereto.

In block 3510, the system is capable of compiling, using the DPE compiler 1602, the software portion of the application for implementation in one or more DPEs 204 of the DPE array 202. The DPE compiler 1602 may receive the results of the implementation flow in order to use a consistent interface between the DPE array 202 and the PL 214 (e.g., a same SoC interface block solution used during the implementation flow by the hardware compiler 1606).

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "high-level language" or "HLL" means a programming language, or set of instructions, used to program a data processing system where the instructions have a strong abstraction from the details of the data processing system, e.g., machine language. For example, an HLL is capable of automating or hiding aspects of operation of the data processing system such as memory management. Though referred to as HLLs, these languages are typically classified as "efficiency-level languages". HLLs expose hardware-supported programming models directly. Examples of HLLs include, but are not limited to, C, C++, and other suitable languages.

An HLL may be contrasted with a hardware description language (HDL) such as Verilog, System Verilog, and VHDL, which are used to describe digital circuits. HDLs allow a designer to create a definition of a digital circuit design that may be compiled into a register transfer level (RTL) netlist that is typically technology independent.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "output" means storing in physical memory elements, e.g., devices, writing to display or other peripheral output device, sending or transmitting to another system, exporting, or the like.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method includes, for an application specifying a software portion for implementation within a DPE array of a device and a hardware portion for implementation within PL of the device, generating, using a processor, a logical architecture for the application and a first interface solution specifying a mapping of logical resources to hardware of an interface circuit block between the DPE array and the programmable logic. The method includes building a block diagram of the hardware portion based on the logical architecture and the first interface solution and performing, using the processor, an implementation flow on the block diagram. The method include compiling, using the processor, the software portion of the application for implementation in one or more DPEs of the DPE array.

In another aspect, the building the block diagram includes adding to the block diagram at least one IP core for implementation within the programmable logic.

In another aspect, during the implementation flow, a hardware compiler builds the block diagram and performs the implementation flow by exchanging design data with a DPE compiler configured to compile the software portion.

In another aspect, the hardware compiler exchanges further design data with a NoC compiler. The hardware compiler receives a first NoC solution configured to implement routes through a NoC of the device that couples the DPE array to the PL of the device.

In another aspect, the performing the implementation flow is performed based on the exchanged design data.

In another aspect, the compiling the software portion is performed based on an implementation of the hardware portion of the application for implementation in the PL generated from the implementation flow.

In another aspect, in response to a hardware compiler configured to build the block diagram and perform the implementation flow determining that an implementation of the block diagram does not meet a design metric for the hardware portion, providing a constraint for the interface circuit block to a DPE compiler configured to compile the software portion. The hardware compiler receives, from the DPE compiler, a second interface solution generated by the DPE compiler based on the constraint.

In another aspect, the performing the implementation flow is performed based on the second interface solution.

In another aspect, the hardware compiler, in response to determining that an implementation of the block diagram does not meet a design metric using a first NoC solution for a NoC, provides a constraint for the NoC to a NoC compiler. The hardware compiler receives, from the NoC compiler, a second NoC solution generated by the NoC compiler based on the constraint for the NoC.

A system includes a processor configured to initiate operations. The operations include, for an application specifying a software portion for implementation within a DPE array of a device and a hardware portion for implementation within PL of the device, generating a logical architecture for the application and a first interface solution specifying a mapping of logical resources to hardware of an interface circuit block between the DPE array and the PL. The operations include building a block diagram of the hardware portion based on the logical architecture and the first interface solution, performing an implementation flow on the block diagram, and compiling the software portion of the application for implementation in one or more DPEs of the DPE array.

In another aspect, the building the block diagram includes adding to the block diagram at least one IP core for implementation within the PL.

In another aspect, the operations include, during the implementation flow, executing a hardware compiler that builds the block diagram and performs the implementation flow by exchanging design data with a DPE compiler configured to compile the software portion.

In another aspect, the operations include the hardware compiler exchanging further design data with a NoC compiler and the hardware compiler receiving a first NoC solution configured to implement routes through a NoC of the device that couples the DPE array to the PL of the device.

In another aspect, the performing the implementation flow is performed based on the exchanged design data.

In another aspect, the compiling the software portion is performed based on a hardware design for the hardware portion of the application for implementation in the PL generated from the implementation flow.

In another aspect, the operations include, in response to a hardware compiler configured to build the block diagram and perform the implementation flow determining that an implementation of the block diagram does not meet a design constraint for the hardware portion, providing a constraint for the interface circuit block to a DPE compiler configured to compile the software portion. The hardware compiler receives, from the DPE compiler, a second interface solution generated by the DPE compiler based on the constraint.

In another aspect, the performing the implementation flow is performed based on the second interface solution.

In another aspect, the hardware compiler, in response to determining that an implementation of the block diagram does not meet a design metric using a first NoC solution for a NoC, provides a constraint for the NoC to a NoC compiler. The hardware compiler receives, from the NoC compiler, a second NoC solution generated by the NoC compiler based on the constraint for the NoC.

A method includes, for an application having a software portion for implementation in a DPE array of a device and a hardware portion for implementation in PL of the device, performing, using a processor executing a hardware compiler, an implementation flow on the hardware portion based on an interface block solution that maps logical resources used by the software portion to hardware of an interface block coupling the DPE array to the PL. The method includes, in response to not meeting a design metric during the implementation flow, providing, using the processor executing the hardware compiler, an interface block constraint to a DPE compiler. The method also includes, in response to receiving the interface block constraint, generating, using the processor executing the DPE compiler, an updated interface block solution and providing the updated interface block solution from the DPE compiler to the hardware compiler.

In another aspect, the interface block constraint maps the logical resources used by the software portion to physical resources of the interface block.

In another aspect, the hardware compiler continues the implementation flow using the updated interface block solution.

In another aspect, the hardware compiler iteratively provides interface block constraints to the DPE compiler responsive to not meeting design constraints for the hardware portion.

In another aspect, the interface block constraint includes a hard constraint and a soft constraint. In that case, the method includes the DPE compiler routing the software portion of the application using both the hard constraint and the soft constraint to generate the updated interface block solution.

In another aspect, the method includes, in response to failing to generate the updated interface block solution using both the hard constraint and the soft constraint, routing the software portion of the application using only the hard constraint to generate the updated interface block solution.

In another aspect, the method includes, in response to failing to generate the updated mapping using only the hard constraint, mapping the software portion using both the hard constraint and the soft constraint and routing the software portion using only the hard constraint to generate the updated interface block solution.

In another aspect, wherein the interface block solution and the updated interface block solution each has a score, the method includes comparing the scores and, in response to determining that the score for the interface block solution exceeds the score for the updated interface block solution, relaxing the interface block constraint and submitting the relaxed interface block constraint to the DPE compiler to obtain a further updated interface block solution.

In another aspect, the interface block solution and the updated interface block solution each has a score. The method includes comparing the scores and, in response to determining that the score for the updated interface block solution exceeds the score for the interface block solution, using the updated interface block solution for performing the implementation flow.

A system includes a processor configured to initiate operations. The operations include, for an application having a software portion for implementation in a DPE array of a device and a hardware portion for implementation in PL of a device, performing, using a hardware compiler, an implementation flow on the hardware portion based on an interface block solution that maps logical resources used by the software portion to hardware of an interface block coupling the DPE array to the PL. The operations include, in response to not meeting a design metric during the implementation flow, providing, using the hardware compiler, an interface block constraint to a DPE compiler. The operations further include, in response to receiving the interface block constraint, generating, using the DPE compiler, an updated interface block solution and providing the updated interface block solution from the DPE compiler to the hardware compiler.

In another aspect, the interface block constraint maps the logical resources used by the software portion to physical resources of the interface block.

In another aspect, the hardware compiler continues the implementation flow using the updated interface block solution.

In another aspect, the hardware compiler iteratively provides interface block constraints to the DPE compiler responsive to not meeting design constraints for the hardware portion.

In another aspect, the interface block constraint includes a hard constraint and a soft constraint. In that case, processor is configured to initiate operations including the DPE compiler routing the software portion of the application using both the hard constraint and the soft constraint to generate the updated interface block solution.

In another aspect, the operations include, in response to failing to generate the updated mapping using both the hard constraint and the soft constraint, routing the software portion of the application using only the hard constraint to generate the updated interface block solution.

In another aspect, the operations include, in response to failing to generate the updated mapping using only the hard constraint, mapping the software portion using both the hard constraint and the soft constraint and routing the software portion using only the hard constraint to generate the updated interface block solution.

In another aspect, the interface block solution and the updated interface block solution each has a score. The processor is configured to initiate operations including comparing the scores and, in response to determining that the score for the interface block solution exceeds the score for the updated interface block solution, relaxing the interface block constraint and submitting the relaxed interface block constraint to the DPE compiler to obtain a further updated interface block solution.

In another aspect, the interface block solution and the updated interface block solution each has a score. The processor is configured to initiate operations including, comparing the scores and, in response to determining that the score for the updated interface block solution exceeds the score for the interface block solution, using the updated interface block solution for performing the implementation flow.

A method includes, for an application specifying a software portion for implementation within a DPE array of a device and a hardware portion having HLS kernels for implementation within PL of the device, generating, using a processor, a first interface solution mapping logical resources used by the software portion to hardware resources of an interface block coupling the DPE array and the PL. The method includes generating, using the processor, a connection graph specifying connectivity among the HLS kernels and nodes of the software portion to be implemented in the DPE array and generating, using the processor, a block diagram based on the connection graph and the HLS kernels, wherein the block diagram is synthesizable. The method further includes performing, using the processor, an implementation flow on the block diagram based on the first interface solution and compiling, using the processor, the software portion of the application for implementation in one or more DPEs of the DPE array.

In another aspect, the generating the block diagram includes performing HLS on the HLS kernels to generate synthesizable versions of the HLS kernels and constructing the block diagram using the synthesizable versions of the HLS kernels.

In another aspect, the synthesizable versions of the HLS kernels are specified as RTL blocks.

In another aspect, the generating the block diagram is performed based on a description of an architecture of an SoC in which the application is to be implemented.

In another aspect, the generating the block diagram includes connecting the block diagram with a base platform.

In another aspect, the performing the implementation flow includes synthesizing the block diagram for implementation in the PL, and placing and routing the synthesized block diagram based on the first interface solution.

In another aspect, the method includes, during the implementation flow, executing a hardware compiler that builds the block diagram and performs the implementation flow by exchanging design data with a DPE compiler configured to compile the software portion.

In another aspect, the method includes the hardware compiler exchanging further design data with a NoC compiler and the hardware compiler receiving a first NoC solution configured to implement routes through a NoC of the device that couples the DPE array to the PL of the device.

In another aspect, the method includes, in response to a hardware compiler configured to build the block diagram and perform the implementation flow determining that an implementation of the block diagram does not meet a design metric for the hardware portion, providing a constraint for the interface circuit block to a DPE compiler configured to compile the software portion. The method also includes the hardware compiler receiving, from the DPE compiler, a second interface solution generated by the DPE compiler based on the constraint.

In another aspect, the performing the implementation flow is performed based on the second interface solution.

A system includes a processor configured to initiate operations. The operations include, for an application specifying a software portion for implementation within a DPE array of a device and a hardware portion having HLS kernels for implementation within PL of the device, generating a first interface solution mapping logical resources used by the software portion to hardware resources of an interface block coupling the DPE array and the PL. The operations include generating a connection graph specifying connectivity among the HLS kernels and nodes of the software portion to be implemented in the DPE array and generating a block diagram based on the connection graph and the HLS kernels, wherein the block diagram is synthesizable. The operations further include performing an implementation flow on the block diagram based on the first interface solution and compiling the software portion of the application for implementation in one or more DPEs of the DPE array.

In another aspect, the generating the block diagram includes performing HLS on the HLS kernels to generate synthesizable versions of the HLS kernels and constructing the block diagram using the synthesizable versions of the HLS kernels.

In another aspect, the synthesizable versions of the HLS kernels are specified as RTL blocks.

In another aspect, the generating the block diagram is performed based on a description of an architecture of an SoC in which the application is to be implemented.

In another aspect, the generating the block diagram includes connecting the block diagram with a base platform.

In another aspect, the performing the implementation flow includes synthesizing the block diagram for implementation in the PL, and placing and routing the synthesized block diagram based on the first interface solution.

In another aspect, the operations include, during the implementation flow, executing a hardware compiler that builds the block diagram and performs the implementation flow by exchanging design data with a DPE compiler configured to compile the software portion.

In another aspect, the operations include the hardware compiler exchanging further design data with a NoC compiler and the hardware compiler receiving a first NoC solution configured to implement routes through a NoC of the device that couples the DPE array to the PL of the device.

In another aspect, the operations include, in response to a hardware compiler configured to build the block diagram and perform the implementation flow determining that an implementation of the block diagram does not meet a design metric for the hardware portion, providing a constraint for the interface circuit block to a DPE compiler configured to compile the software portion. The method also includes the hardware compiler receiving, from the DPE compiler, a second interface solution generated by the DPE compiler based on the constraint.

In another aspect, the performing the implementation flow is performed based on the second interface solution.

One or more computer program products are disclosed herein that include a computer readable storage medium having program code stored thereon. The program code is executable by computer hardware to initiate the various operations described within this disclosure.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

Example 1 illustrates an example schema for a logical architecture derived from an application.

Example 1

```
{
    "$schema": "http://json-schema.org/draft-04/schema#",
    "description": "DPE/IPI Logical Architecture Specification",
    "id": "LogicalArchSchema-0.1",
    "compatible": [ "LogicalArchSchema-0.1" ],
    "definitions": {
        "ArrayString": {
            "type": "array",
            "items": { "type": "string" }
        },
        "LogicalConnection": {
            "type": "object",
            "properties": {
                "type" : { "type" : "string", "enum": [ "stream", "mem", "event" ] },
                "direction" : { "type" : "string", "enum": [ "me_to_pl", "pl_to_me",
    "me_to_noc", "noc_to_me", "noc_to_pl", "pl_to_noc", "noc_to_noc", "pl_to_pl"]
            },
            "srcPort" : {
                "type" : "object",
```

```
        "properties": {
          "instName" : { "type" : "string" },
          "portName" : { "type" : "string" }
        },
        "additionalProperties": false,
        "required": [ "instName", "portName" ]
      },
      "dstPorts" : {
        "type" : "array",
        "items" : {
          "type": "object",
          "properties ": {
            "instName" : { "type" : "string" },
            "portName" : { "type" : "string" }
          },
          "additionalProperties": false,
          "required": [ "instName", "portName" ]
        }
      },
      "memMode" : { "type" : "string", "enum": [ "read-only", "write-only", "read-write" ] },
      "addrType" : { "type" : "string", "enum": [ "virtual", "physical" ] }
    },
    "additionalProperties": false,
    "required": [ "type", "direction", "srcPort", "dstPorts" ]
  },
  "LogicalPort": {
    "type": "object",
    "properties": {
      "type" : { "type" : "string", "enum": [ "stream", "mem", "event" ] },
      "direction" : { "type" : "string", "enum": [ "master", "slave" ] },
      "dataWidth" : { "type" : "integer", "minimum" : 1 },
      "clkFreq" : { "type" : "double" },
      "traceFile" : { "type" : "string" },
      "annotation": { "$ref": "#/definitions/ArrayString" },
      "hw_annotation": { "type" : "string" },
      "sdfioName": { "$ref": "#/definitions/ArrayString" },
      "vInvName" : { "type" : "string" },
      "mechannel" : { "type" : "string" }
    },
    "additionalProperties": false,
    "required": [ "type", "direction", "dataWidth", "clkFreq"
  },
  "DPEIP": {
    "type": "object",
    "properties": {
      "vInvName" : { "type" : "string" },
      "annotation": { "type" : "string" },
      "hw_annotation": { "type" : "string" },
      "meshimPorts" : {
        "type" : "object",
        "properties" : { "$ref": "#/definitions/LogicalPort"}
      }
    },
    "additionalProperties": false,
    "required": [ "meshimPorts", "annotation" ]
  },
  "NoCIP": {
    "type": "object",
    "properties": {
      "type" : { "type" : "string", "enum": [ "stream", "mem"] },
      "vInvName" : { "type": "string" },
      "annotation": { "type" : "string" },
      "hw_annotation": { "type" : "string" },
      "nocPorts" : {
        "type" : "object",
        "properties" : { "$ref": "#/definitions/LogicalPort" }
      }
    },
    "additionalProperties": false,
    "required": [ "nocPorts", "annotation" ]
  },
  "PLIP": {
    "type": "object",
    "properties": {
      "ckernelName" : { "type" : "string" },
      "sdfinstName" : { "type" : "string" },
      "vInvName" : { "type" : "string" },
      "annotation": { "type" : "string" },
```

```
        "hw_annotation": { "type" : "string" },
        "pIPorts" : {
          "type" : "object",
          "properties" : { "$ref": "#/definitions/LogicalPort" }
        }
      },
      "additionalProperties": false,
      "required": [ "pIPorts", "annotation" ]
    }
  },
  "type": "object",
  "properties": {
    "appId" : { "type": "string" },
    "schema" : { "type": "string" },
    "device" : { "type": "string" },
    "platform" : { "type": "string" },
    "connections" : {
      "type": "object",
      "properties": { "$ref": "#/definitions/LogicalConnection" },
      "minProperties": 0
    },
    "DPE": {
      "type": "object",
      "properties": { "$ref": "#/definitions/DPEIP" },
      "minProperties": 0
    },
    "PL": {
      "type": "object",
      "properties": { "$ref": "#/definitions/PLIP" },
      "minProperties": 0
    },
    "NoC": {
      "type": "object",
      "properties": { "$ref": "#/definitions/NoCIP" },
      "minProperties": 0
    }
  },
  "required": [
    "appId"
  ]
}
```

Example 2 illustrates an example schema for a SoC interface block solution for an application to be implemented in the DPE array 202.

Example 2

```
{
  "$schema": "http://json-schema.org/draft-03/schema#",
  "description": "DPE Solution schema",
  "id": "DPESolutionSpecification",
  "definitions": { },
  "type" : "object",
  "properties" : {
    "version" : { "type" : "string" },
    "Placement": { "type" : "array",
      "items" : {
        "properties" : {
          "LogicalInstance" : {
            "type" : "object",
            "properties" : {
              "InstanceName" : { "type" : "string" },
              "PortName" : { "type" : "string" }
            }
          },
          "PhysicalInstance" : {
            "type" : "array",
            "items" : { "type" : "string" }
          },
          "IsSoft" : { "type" : "boolean" }
        }
      }
    }
  }
}
```

Example 3 illustrates an example schema for a NoC solution for an application to be implemented in the NoC 208.

Example 3

```
{
  "$schema": "http://json-schema.org/draft-03/schema#",
  "description": "NOC Solution schema",
  "id": "SolutionsSchema",
  "definitions": { },
  "type" : "object",
  "properties" : {
    "SolutionType" : { "type" : "string" },
```

-continued

```
    "Paths" : {
      "type" : "array",
      "items" : {
        "properties" : {
          "Phase" : { "type" : "integer" },
          "From" : { "type" : "string" },
          "FromLocked" : { "type" : "boolean" },
          "To" : { "type" : "string" },
          "ToLocked" : { "type" : "boolean" },
       "Port" : {"type" : "string"},
          "ReadTC" : { "type" : "string", "enum" : ["LL", "BE", "ISOC"] },
          "WriteTC" : { "type" : "string", "enum" : ["LL", "BE", "ISOC"] },
          "ReadBW" : { "type" : "integer", "minimum" : 0, "maximum" : 19200},
          "WriteBW" : { "type" : "integer", "minimum" : 0, "maximum" : 19200},
          "ReadAchievedBW" : {"type" : "integer"},
          "WriteAchievedBW" : {"type" : "integer"},
          "ReadLatency" : { "type" : "integer", "minimum" : 4},
          "WriteLatency" : {"type" : "integer", "minimum" : 4},
          "ReadBestPossibleLatency" : {"type" : "integer", "minimum" : 4},
          "WriteBestPossibleLatency" : {"type" : "integer", "minimum" : 4},
          "PathLocked" : { "type" : "boolean" },
          "Nets" : {
            "type" : "array",
            "items" : {
              "properties" : {
                "PhyInstanceStart": {"type" : "string"},
                "PhyInstanceEnd" : {"type" : "string"},
                "VC" : {"type" : "integer", "minimum": 0, "maximum" : 7},
                "Connections" : {"type" : "array", "items" : { "type" : "string" } },
                "RequiredBW" : {"type" : "integer"},
                "AchievedBW" : {"type" : "integer"},
                "AchievedLatency" : {"type" : "integer"},
                "CommType" : { "type" : "string", "enum" : ["READ", "WRITE",
"READ_REQ", "WRITE_RESP"] }
              }
            }
          }
        }
      }
    },
    "Components": {
      "type" : "array",
      "items" : {
        "properties" : {
          "Name" : { "type" : "string" },
          "TrafficLInst" : { "type" : "string" },
          "PortIndex" : { "type" : "integer" },
          "DestId" : { "type" : "integer" },
          "required" : ["Name", "DestId" ],
          "additionalProperties" : false
        }
      }
    }
  }
}
```

Example 4 illustrates an example schema for specifying SoC interface block constraints and/or NoC constraints.

Example 4

```
{
  "$schema": "http://json-schema.org/draft-03/schema #",
  "description": "NOC Constraints schema",
  "id": "ConstraintsSpecification",
  "definitions": { },
  "type" : "object",
  "properties" : {
    "version" : { "type" : "string" },
    "Placement" : { "type" : "array",
      "items" : {
        "properties" : {
          "LogicalInstance" : {"type" : "string"},
          "PhysicalInstance" : {"type" : "array", "items" : {"type" : "string" }},
          "IsSoft" : {"type" : "boolean" }
```

```
            }
          }
        }
      }
    }
  }
}
```

Example 5 illustrates an example schema for specifying the NoC traffic.

Example 5

```
{
  "$schema": "http://json-schema.org/draft-07/schema #",
  "description": "NOC Traffic Specification Schema",
  "id": "TrafficSpecification",
  "type": "object",
  "definitions": { },
  "additionalProperties": false,
  "properties" : {
    "LogicalInstances" : {
      "type" : "array",
      "items" : {
        "type": "object",
        "additionalProperties": false,
        "properties" : {
          "Name" : { "type" : "string"},
          "IsMaster" : { "type" : "boolean"},
          "CompType" : { "type" : "string" },
          "Ports" : { "type" : "array", "items" : {"type" : "string"}},
          "Protocol" : { "type" : "string", "enum" : ["AXI_MM", "AXI_STRM"] },
          "SysAddress" : {"type" : "integer" },
          "SysAddressSize" : { "type" : "integer" },
          "SysAddresses" : {
            "type" : "array",
            "items" : {
              "type":"object",
              "additionalProperties": false,
              "properties" : {
                "Base" : { "type" : "integer" },
                "Size" : { "type" : "integer" }
              },
              "required" : ["Base", "Size" ]
            }
          },
          "AxiDataWidth" : { "type" : "integer" },
          "NumReadOutstanding" : { "type" : "integer", "minimum" : 0, "maximum" : 64 },
          "NumWriteOutstanding" : { "type" : "integer", "minimum" : 0, "maximum" : 64 },
          "ReadRateLimiter" : { "type" : "integer" },
          "WriteRateLimiter" : { "type" : "integer" },
          "InterleaveSize" : { "type" : "integer" },
          "ExternalConn" : { "type" : "string" },
          "IsVirtual" : { "type" : "boolean", "default" : false }
        },
        "required" : ["Name", "CompType", "Protocol"]
      }
    },
    "Paths" : {
      "type" : "array",
      "items" : {
        "type" : "object",
        "additionalProperties": false,
        "properties" : {
          "Phase" : { "type" : "integer" },
          "From" : { "type" : "string" },
          "To" : { "type" : "string" },
          "Port" : {"type" : "string"},
          "CommType" : { "type" : "string", "enum" : ["MM_ReadWrite", "STRM", "MM_ReadOnly", "MM_WriteOnly"] },
          "ReadTC" : { "type" : "string", "enum" : ["LL", "BE", "ISOC"] },
          "WriteTC" : { "type" : "string", "enum" : ["LL", "BE", "ISOC"] },
          "WriteBurstSize" : { "type": "integer", "minimum" : 1, "maximum" : 256 },
```

-continued

```
        "ReadBurstSize" : { "type": "integer", "minimum" : 1, "maximum" : 256 },
        "ReadBW" : { "type" : "integer", "minimum" : 0, "maximum" : 19200},
        "WriteBW" : { "type" : "integer", "minimum" : 0, "maximum" : 19200},
        "ReadLatency" : {"type ": "integer ", "minimum ": 0 },
        "WriteLatency" : {"type ": "integer ", "minimum ": 0 },
        "ReadAvgBurst" : {"type ": "integer ", "minimum ": 0 },
        "WriteAvgBurst" : {"type ": "integer ", "minimum ": 0 },
        "ExclusiveGroup" : {"type" : "string"}
      }
    }
  }
 }
}
```

What is claimed is:

1. A method, comprising:

for an application specifying a software portion for implementation within a data processing engine (DPE) array of a device and a hardware portion for implementation within programmable logic of the device, generating, using a processor, a logical architecture for the application and a first interface solution specifying a mapping of logical resources to hardware implementations of a plurality of stream channels of an interface circuit block between the DPE array and the programmable logic;

building a block diagram of the hardware portion based on the logical architecture and the first interface solution;

performing, using the processor, an implementation flow on the block diagram; and compiling, using the processor, the software portion of the application for implementation in one or more DPEs of the DPE array.

2. The method of claim 1, wherein the building the block diagram comprises:

adding to the block diagram at least one Intellectual Property core for implementation within the programmable logic.

3. The method of claim 1, further comprising:

during the implementation flow, a hardware compiler building the block diagram and performing the implementation flow by exchanging design data with a DPE compiler configured to compile the software portion.

4. The method of claim 3, further comprising:

the hardware compiler exchanging further design data with a Network-on-Chip (NoC) compiler; and the hardware compiler receiving a first NoC solution configured to implement routes through a NoC of the device that couples the DPE array to the programmable logic of the device.

5. The method of claim 3, wherein the performing the implementation flow is performed based on the exchanged design data.

6. The method of claim 5, wherein the compiling the software portion is performed based on an implementation of the hardware portion of the application for implementation in the programmable logic generated from the implementation flow.

7. The method of claim 1, further comprising:

in response to a hardware compiler configured to build the block diagram and perform the implementation flow determining that an implementation of the block diagram does not meet a design metric for the hardware portion, providing a constraint for the interface circuit block to a DPE compiler configured to compile the software portion; and the hardware compiler receiving, from the DPE compiler, a second interface solution generated by the DPE compiler based on the constraint.

8. The method of claim 7, wherein the performing the implementation flow is performed based on the second interface solution.

9. The method of claim 7, wherein the hardware compiler, in response to determining that an implementation of the block diagram does not meet a design metric using a first Network-on-Chip (NoC) solution for a NoC, provides a constraint for the NoC to a NoC compiler; and the hardware compiler receiving, from the NoC compiler, a second NoC solution generated by the NoC compiler based on the constraint for the NoC.

10. A system, comprising:

a processor configured to initiate operations including:

for an application specifying a software portion for implementation within a data processing engine (DPE) array of a device and a hardware portion for implementation within programmable logic of the device, generating a logical architecture for the application and a first interface solution specifying a mapping of logical resources to hardware implementations of a plurality of stream channels of an interface circuit block between the DPE array and the programmable logic;

building a block diagram of the hardware portion based on the logical architecture and the first interface solution;

performing an implementation flow on the block diagram; and compiling the software portion of the application for implementation in one or more DPEs of the DPE array.

11. The system of claim 10, wherein the building the block diagram comprises:

adding to the block diagram at least one Intellectual Property core for implementation within the programmable logic.

12. The system of claim 10, wherein the processor is configured to initiate operations further comprising:

during the implementation flow, executing a hardware compiler that builds the block diagram and performs the implementation flow by exchanging design data with a DPE compiler configured to compile the software portion.

13. The system of claim 12, wherein the processor is configured to initiate operations further comprising:

the hardware compiler exchanging further design data with a Network-on-Chip (NoC) compiler; and the hardware compiler receiving a first NoC solution configured to implement routes through a NoC of the device that couples the DPE array to the programmable logic of the device.

14. The system of claim 12, wherein the performing the implementation flow is performed based on the exchanged design data.

15. The system of claim 14, wherein the compiling the software portion is performed based on a hardware design for the hardware portion of the application for implementation in the programmable logic generated from the implementation flow.

16. The system of claim 10, wherein the processor is configured to initiate operations further comprising:
  in response to a hardware compiler configured to build the block diagram and perform the implementation flow determining that an implementation of the block diagram does not meet a design constraint for the hardware portion, providing a constraint for the interface circuit block to a DPE compiler configured to compile the software portion; and
  the hardware compiler receiving, from the DPE compiler, a second interface solution generated by the DPE compiler based on the constraint.

17. The system of claim 16, wherein the performing the implementation flow is performed based on the second interface solution.

18. The system of claim 16, wherein:
  the hardware compiler, in response to determining that an implementation of the block diagram does not meet a design metric using a first Network-on-Chip (NoC) solution for a NoC, provides a constraint for the NoC to a NoC compiler; and
  the hardware compiler receives, from the NoC compiler, a second NoC solution generated by the NoC compiler based on the constraint for the NoC.

19. A computer program product, comprising:
  a computer readable storage medium having program code stored thereon, wherein the program code is executable by computer hardware to initiate operations including:
  for an application specifying a software portion for implementation within a data processing engine (DPE) array of a device and a hardware portion for implementation within programmable logic of the device, generating a logical architecture for the application and a first interface solution specifying a mapping of logical resources to hardware implementations of a plurality of stream channels of an interface circuit block between the DPE array and the programmable logic;
  building a block diagram of the hardware portion based on the logical architecture and the first interface solution;
  performing an implementation flow on the block diagram; and
  compiling the software portion of the application for implementation in one or more DPEs of the DPE array.

20. The computer program product of claim 19, wherein the program code is executable by the computer hardware to initiate operations further comprising:
  during the implementation flow, a hardware compiler building the block diagram and perform the implementation flow by exchanging design data with a DPE compiler configured to compile the software portion.

* * * * *

UNITED STATES PATENT AND TRADEMARK OFFICE
CERTIFICATE OF CORRECTION

PATENT NO. : 10,891,414 B2  
APPLICATION NO. : 16/421443  
DATED : January 12, 2021  
INVENTOR(S) : Shail Aditya Gupta et al.

Page 1 of 1

It is certified that error appears in the above-identified patent and that said Letters Patent is hereby corrected as shown below:

On the Title Page

Item (72), delete "Siddarth Rele" and insert --Siddharth Rele--, therefor.

Signed and Sealed this  
Eleventh Day of January, 2022

Drew Hirshfeld  
*Performing the Functions and Duties of the*  
*Under Secretary of Commerce for Intellectual Property and*  
*Director of the United States Patent and Trademark Office*